(12) United States Patent
Lee et al.

(10) Patent No.: US 9,929,160 B1
(45) Date of Patent: Mar. 27, 2018

(54) SEMICONDUCTOR DEVICES AND METHODS OF MANUFACTURING THE SAME

(71) Applicant: Samsung Electronics Co., Ltd., Suwon-si (KR)

(72) Inventors: Juri Lee, Yongin-si (KR); Yong-Suk Tak, Seoul (KR); Sung-Dae Suk, Seoul (KR); Seungmin Song, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/613,334

(22) Filed: Jun. 5, 2017

(30) Foreign Application Priority Data

Sep. 19, 2016 (KR) .......................... 10-2016-0119391

(51) Int. Cl.
| | |
|---|---|
| *H01L 27/092* | (2006.01) |
| *H01L 21/8238* | (2006.01) |
| *H01L 29/06* | (2006.01) |
| *H01L 29/10* | (2006.01) |
| *H01L 29/423* | (2006.01) |

(52) U.S. Cl.
CPC .. *H01L 27/0924* (2013.01); *H01L 21/823807* (2013.01); *H01L 21/823821* (2013.01); *H01L 21/823828* (2013.01); *H01L 21/823878* (2013.01); *H01L 29/0653* (2013.01); *H01L 29/1037* (2013.01); *H01L 29/42356* (2013.01)

(58) Field of Classification Search
CPC ......... H01L 27/0924; H01L 21/823828; H01L 21/823878; H01L 21/823807; H01L 29/1037; H01L 29/0653; H01L 21/823821; H01L 29/42356

See application file for complete search history.

(56) References Cited

U.S. PATENT DOCUMENTS

| | | | |
|---|---|---|---|
| 7,297,583 B2 | 11/2007 | Chen et al. | |
| 7,402,483 B2 | 7/2008 | Yun et al. | |
| 7,663,192 B2 | 2/2010 | Sell et al. | |
| 8,536,029 B1 | 9/2013 | Chang et al. | |
| 8,936,987 B2 | 1/2015 | Liu | |
| 9,263,252 B2 | 2/2016 | Chang et al. | |
| 9,287,259 B2 | 3/2016 | Shinohara et al. | |
| 9,293,463 B2 | 3/2016 | Basker et al. | |
| 2014/0151639 A1* | 6/2014 | Chang ............... | H01L 29/42392 257/27 |

(Continued)

*Primary Examiner* — Kyoung Lee
(74) *Attorney, Agent, or Firm* — Muir Patent Law, PLLC

(57) ABSTRACT

Disclosed are semiconductor devices including a field effect transistor and methods of manufacturing the same. The semiconductor device comprises a device isolation layer in an upper portion of a substrate, first active patterns on a first region of the substrate and second active patterns on a second region of the substrate, gate structures extending in one direction and running across the first and second active patterns, and a blocking layer on a recessed region of the device isolation layer of the first region. Each of the first and second active patterns comprises a plurality of semiconductor patterns that are vertically stacked and spaced apart from each other. The semiconductor patterns of the first active patterns have conductivity different from that of the semiconductor patterns of the second active patterns. The blocking layer is limited on the first region.

20 Claims, 54 Drawing Sheets

(56) References Cited

U.S. PATENT DOCUMENTS

| | | |
|---|---|---|
| 2015/0093861 A1 | 4/2015 | Loubet et al. |
| 2016/0056293 A1 | 2/2016 | Yeh et al. |
| 2016/0133525 A1 | 5/2016 | Lee et al. |

* cited by examiner

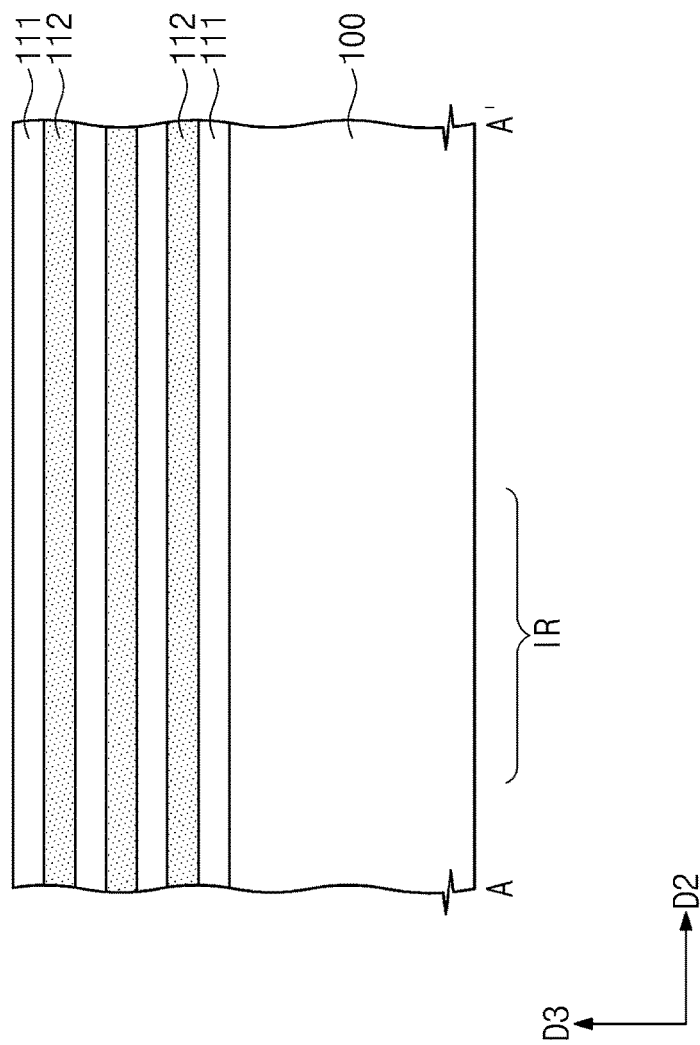

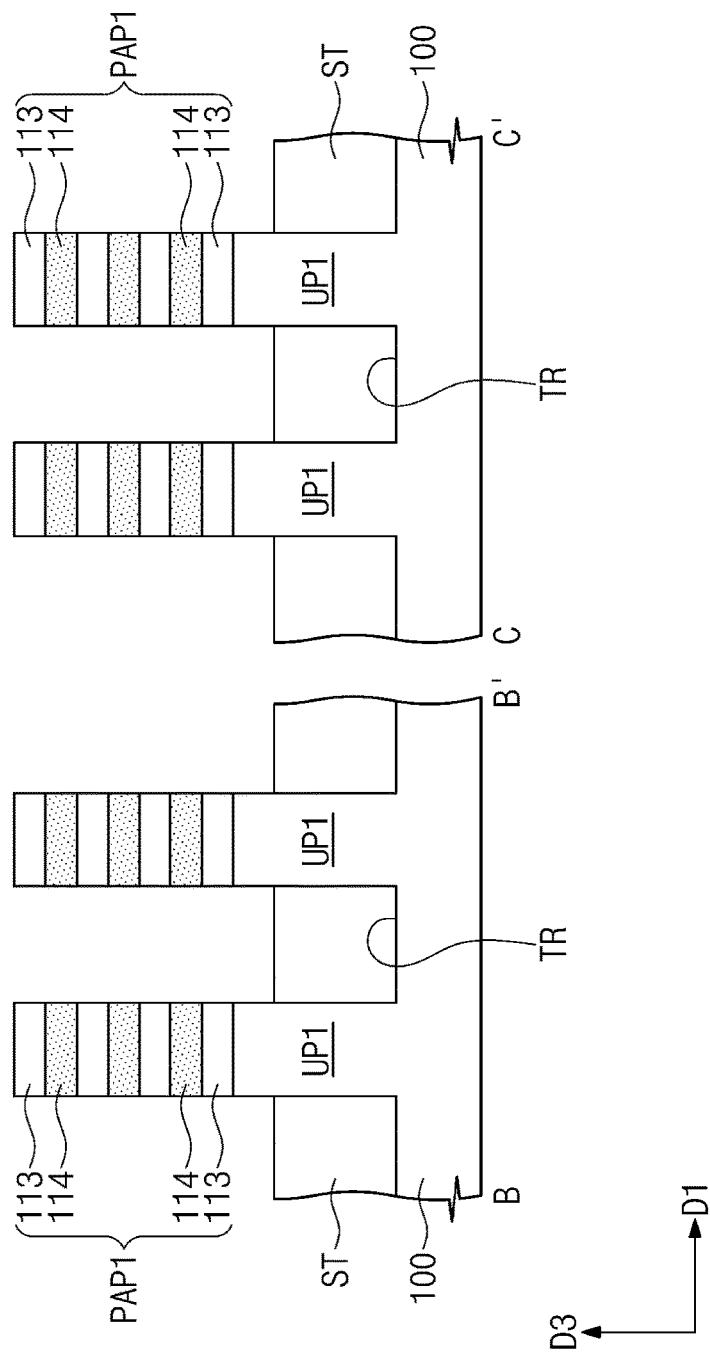

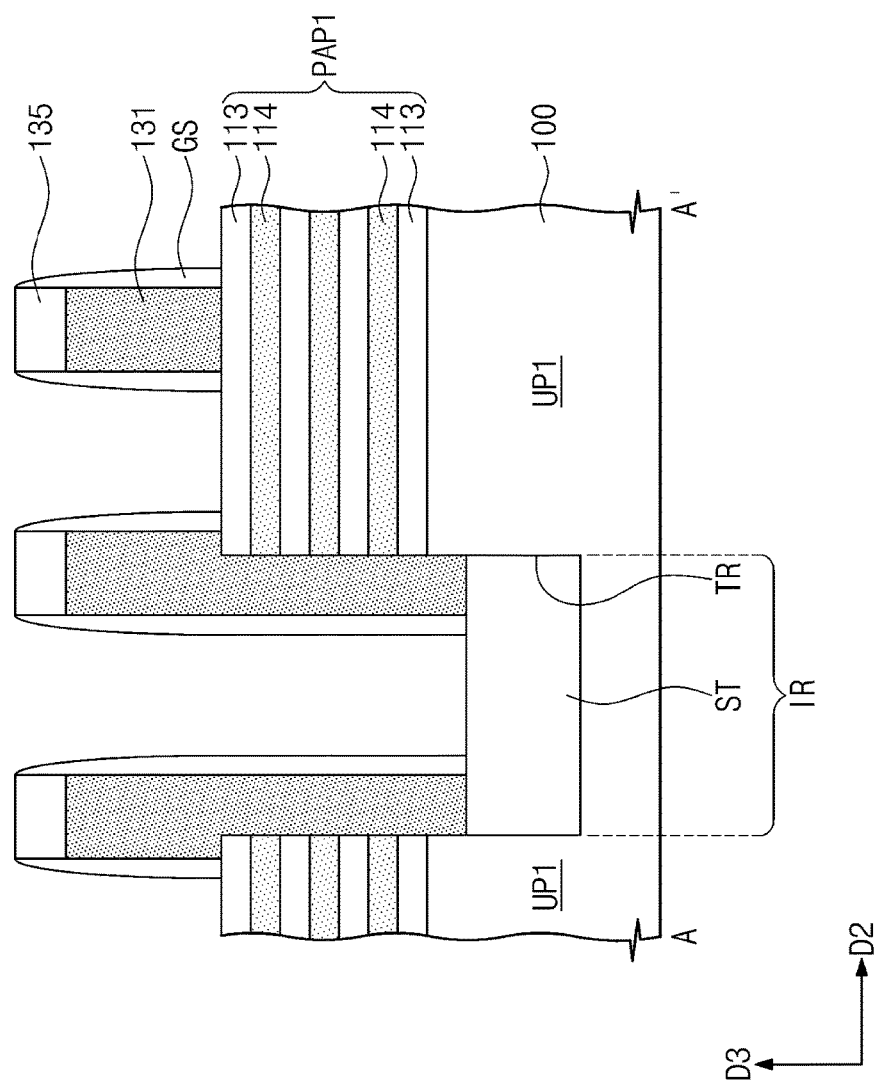

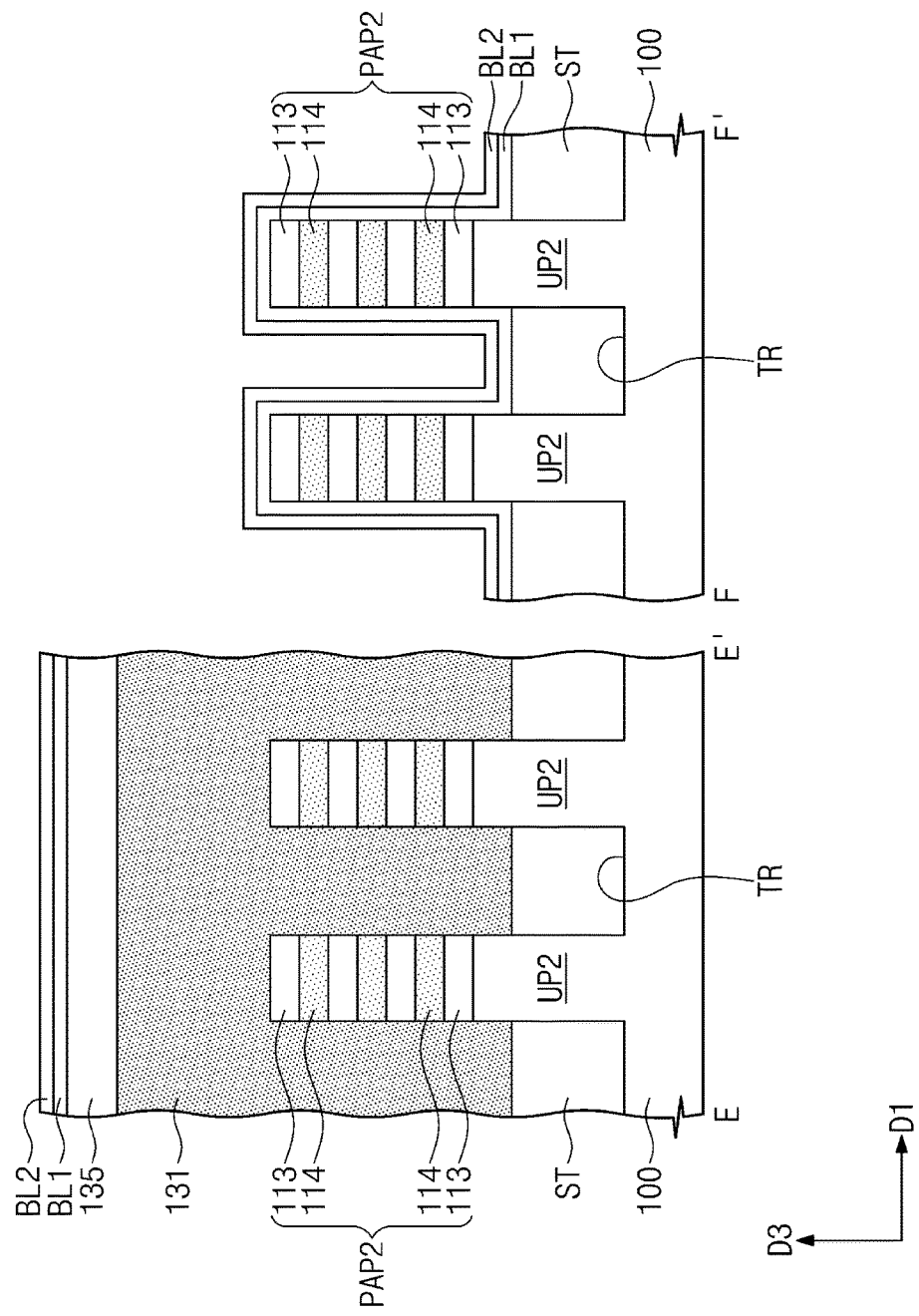

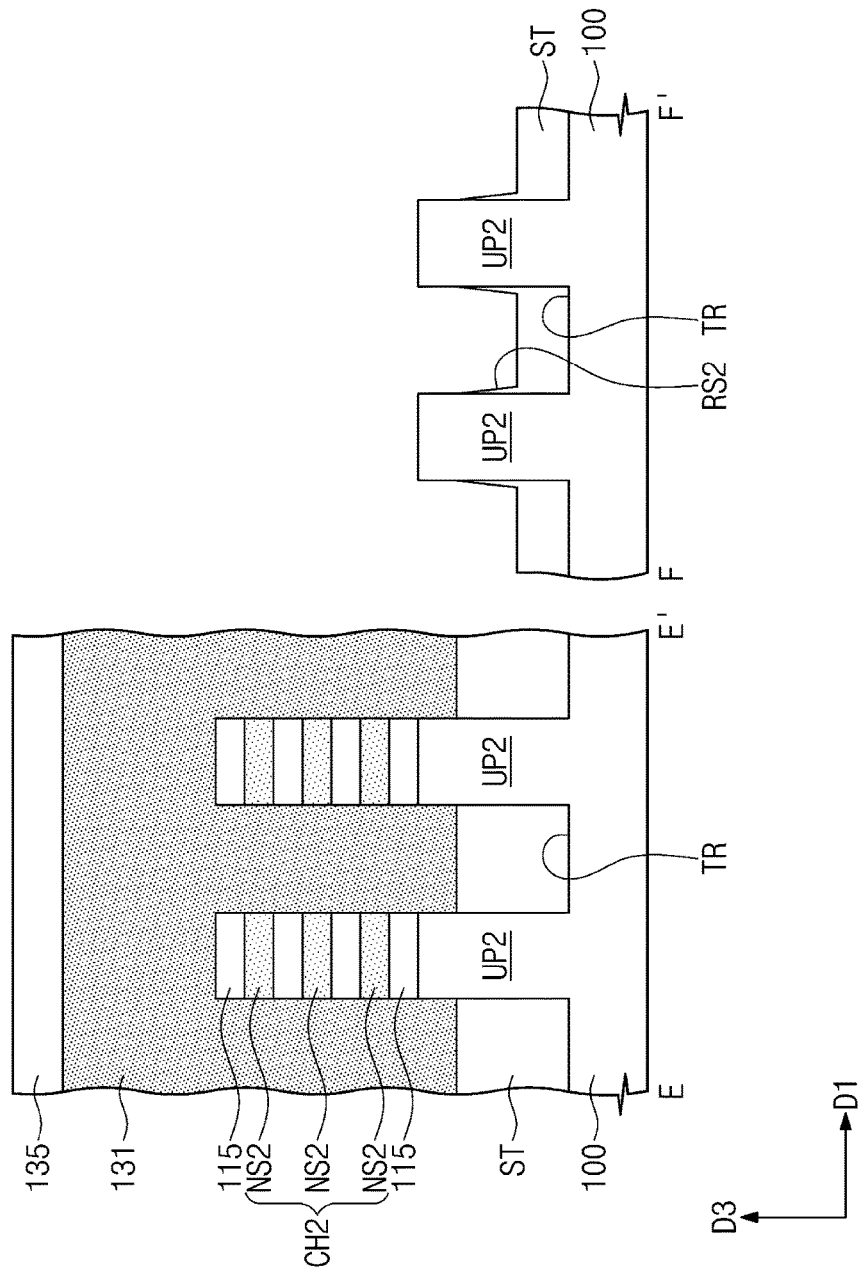

SEMICONDUCTOR DEVICES AND METHODS OF MANUFACTURING THE SAME

CROSS-REFERENCE TO RELATED APPLICATIONS

This U.S. nonprovisional patent application claims the benefit of priority under 35 U.S.C. § 119 of Korean Patent Application 10-2016-0119391, filed on Sep. 19, 2016, in the Korean Intellectual Property Office, the entire contents of which are hereby incorporated by reference.

BACKGROUND

The present disclosure relates to a semiconductor device and a method of manufacturing the same, and more particularly, to a semiconductor device and a method of manufacturing the same including a field effect transistor.

A semiconductor device is considered to be an important factor in the electronic industry because of its small size, multi-function, and/or low fabrication cost. The semiconductor device may be categorized as any one of a semiconductor memory device storing logic data, a semiconductor logic device processing operations of logic data, and a hybrid semiconductor device having both memory and logic elements. Semiconductor devices have been used for increasingly high integration with the advanced development of the electronics industry. For example, semiconductor devices have been requested to have higher reliability, higher speed, and/or greater multifunctionality. Semiconductor devices are gradually becoming more complicated and highly integrated to meet these requested characteristics.

SUMMARY

Embodiments of the present disclosure provide a semiconductor device including a field effect transistor that has enhanced electrical characteristics such as carrier mobility.

In some embodiments, the disclosure is directed to a semiconductor device, comprising: a device isolation layer in an upper portion of a substrate; first active patterns on a first region of the substrate and second active patterns on a second region of the substrate; gate structures extending in a first direction and crossing the first and second active patterns; and a blocking layer on a recessed region of the device isolation layer of the first region, wherein each of the first and second active patterns comprises a plurality of semiconductor patterns that are vertically stacked and spaced apart from each other, the semiconductor patterns of the first active patterns having conductivity different from that of the semiconductor patterns of the second active patterns, and wherein the blocking layer is limited to the first region.

In some embodiments, the disclosure is directed to a method of manufacturing a semiconductor device, the method comprising: forming first active patterns on a first region of a substrate and second active patterns on a second region of the substrate, each of the first and second active patterns including sacrificial patterns and semiconductor patterns that are alternately and repeatedly stacked; forming, on an entire surface of the substrate, a first blocking layer covering the first and second active patterns; forming a first photoresist pattern covering the second region and exposing the first region; partially removing the sacrificial patterns of the first region to form first depressed regions, the sacrificial patterns of the first region being exposed through the first photoresist pattern; and forming first barrier dielectric patterns each filling a corresponding one of the first depressed regions, wherein the first blocking layer has etch selectivity with respect to the first barrier dielectric patterns, and wherein, during the forming of the first barrier dielectric patterns, the first blocking layer remains on the second region.

In some embodiments, the disclosure is directed to a semiconductor device, comprising: a substrate having a first region and a second region; a device isolation layer in an upper portion of the first region of the substrate and the second region of the substrate; first active patterns on the first region of the substrate and second active patterns on the second region of the substrate; gate structures overlapping the first and second active patterns; and a blocking layer formed on a recessed region of the device isolation layer of the first region and not formed on the second region of the substrate, wherein each of the first and second active patterns comprises a plurality of semiconductor patterns that are vertically stacked and spaced apart from each other in a direction perpendicular to the substrate, and wherein the recessed region has a bottom surface lower than a top surface of the device isolation layer located below the gate structures.

BRIEF DESCRIPTION OF THE DRAWINGS

FIGS. 4A, 6A, 8A, 10A, 12A, 14A, 16A, 18A, 20A, 22A and 24A are cross-sectional views taken along line A-A' of FIGS. 3, 5, 7, 9, 11, 13, 15, 17, 19, 21 and 23, respectively.

FIGS. 4B, 6B, 8B, 10B, 12B, 14B, 16B, 18B, 20B, 22B and 24B are cross-sectional views taken along lines B-B' and C-C' of FIGS. 3, 5, 7, 9, 11, 13, 15, 17, 19, 21 and 23, respectively.

FIGS. 10D, 12D, 14D, 16D, 18D, 20D, 22D and 24D are cross-sectional views taken along lines E-E' and F-F' of FIGS. 9, 11, 13, 15, 17, 19, 21 and 23, respectively.

DETAILED DESCRIPTION OF EMBODIMENTS

Figure 1:
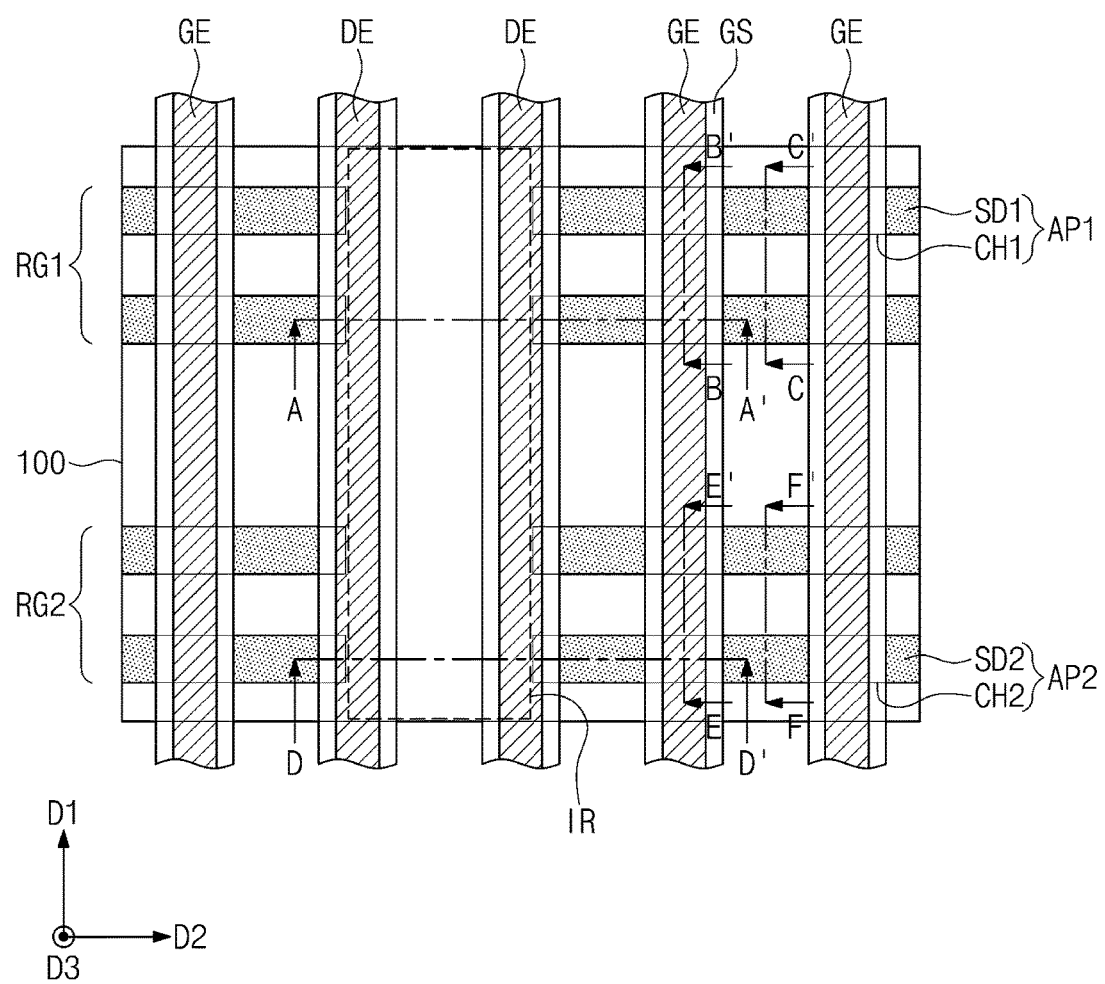
FIG. 1 is a plan view for explaining a semiconductor device according to exemplary embodiments.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

It will be understood that when an element is referred to as being "connected" or "coupled" to, or "on" another element, it can be directly connected or coupled to, or on the other element or intervening elements may be present. In contrast, when an element is referred to as being "directly connected," "directly coupled," in or "directly on" to another element, there are no intervening elements present. Other words used to describe the relationship between elements should be interpreted in a like fashion (e.g., "between" versus "directly between," "adjacent" versus "directly adjacent," etc.). However, the term "contact," as used herein refers to a connection contact (i.e., touching) unless the context indicates otherwise.

As used herein, a dummy gate refers to a conductive line formed at the same level and adjacent to normal gate lines or electrodes (e.g., normal word lines). For example, dummy gate may be patterned from the same conductive layer(s) forming such normal word lines or electrodes. For example, a dummy gate may be simultaneously formed with normal gate lines with the same processes that deposit and pattern the conductive layer(s) forming normal word lines. Dummy gate lines in memory devices are not effective to cause transmission of data to external devices. For instance, a dummy gate line may not be electrically connected to gates of memory cells, or if a dummy gate line is electrically connected to gates of dummy memory cells, such dummy gate lines may not be activated or if activated, may not result in communication of any data in such dummy memory cells to a source external to the memory device.

In some instances, a dummy gate may be formed with a dummy memory cell in the same relationship as a normal gate line and a normal memory cell, in other instances, dummy memory cells may not be formed with a dummy gate line. In some instances, a dummy gate may be connected to a dummy memory cell and may also have voltages applied during access operations to the memory cell array. In some instances, a dummy memory cell associated with a dummy gate line may not be operative, but in other instances, a dummy memory cell may be activated by a dummy gate line, but may not have any "data" stored or read from a device external to the semiconductor memory chip. For instance, data stored in a dummy memory cell electrically connected to a dummy gate line may not be transmitted outside of the memory cell array through selection signals provided by the column decoder, as is the case for normal memory cells. For example, a dummy memory cell electrically connected to a dummy gate may not have any connection to a bit line to transmit data there between as with normal memory cells.

Figure 2A:
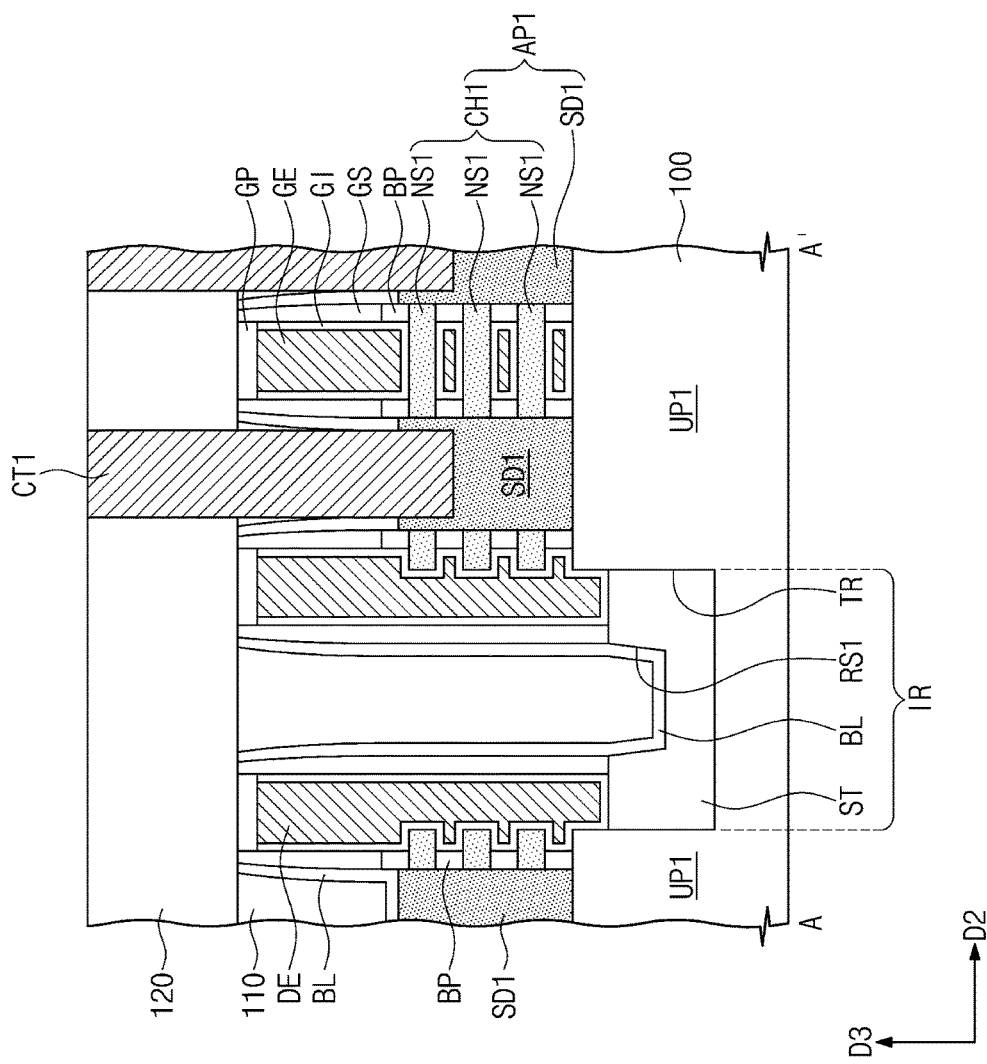
FIG. 2A is a cross-sectional view taken along line A-A' of FIG. 1.
Figure 2B:
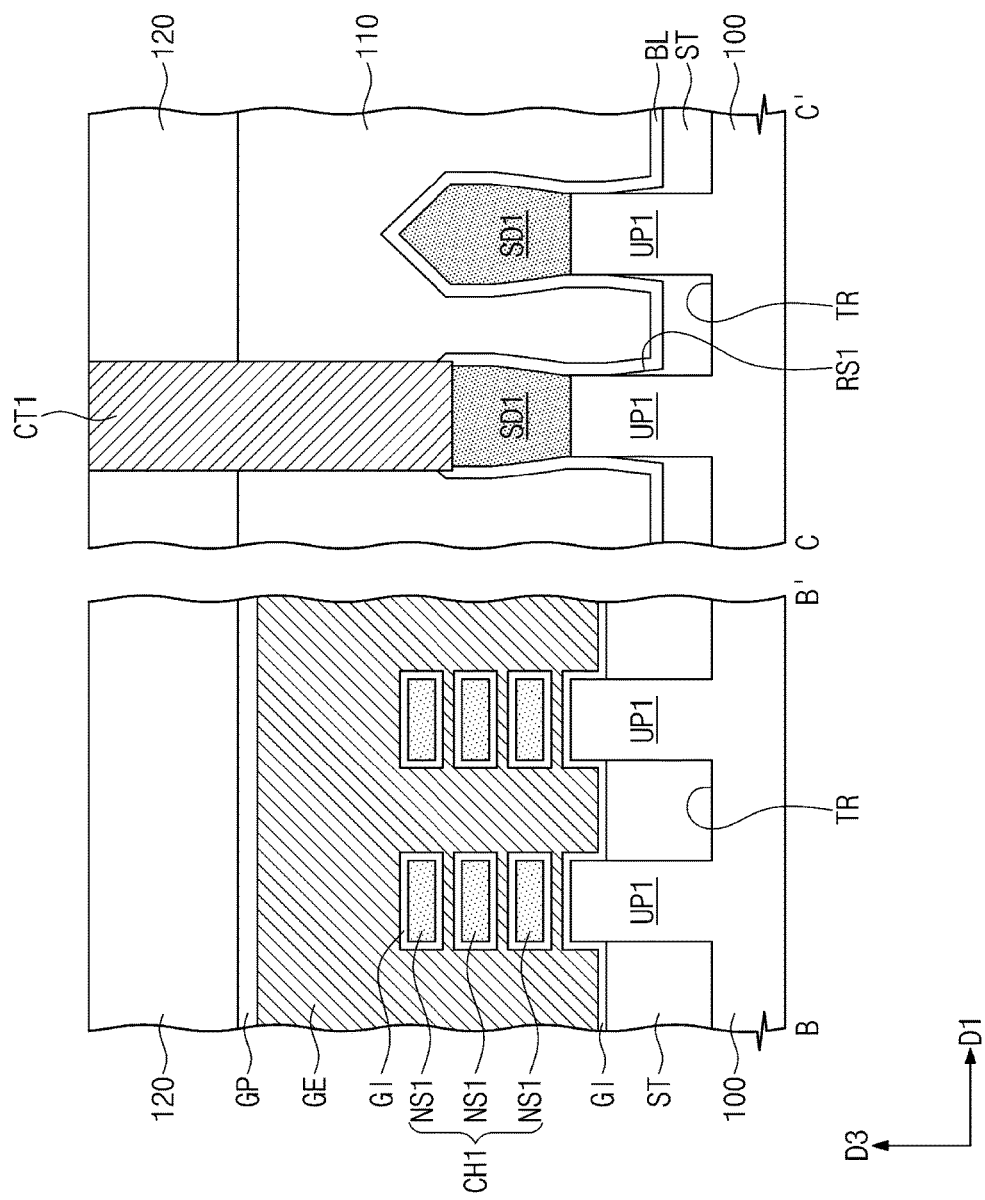
FIG. 2B is a cross-sectional view taken along lines B-B' and C-C' of FIG. 1.
Figure 2C:
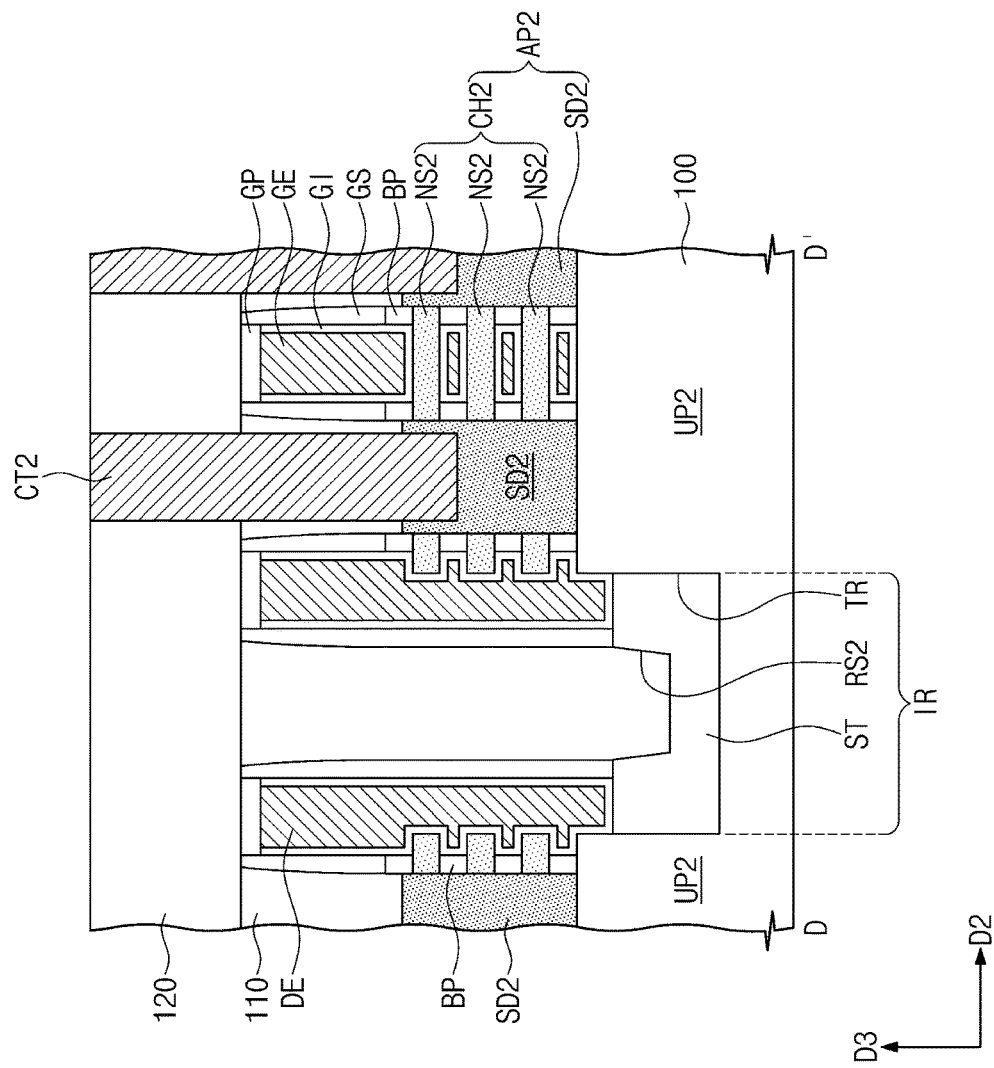
FIG. 2C is a cross-sectional view taken along line D-D' of FIG. 1.
Figure 2D:
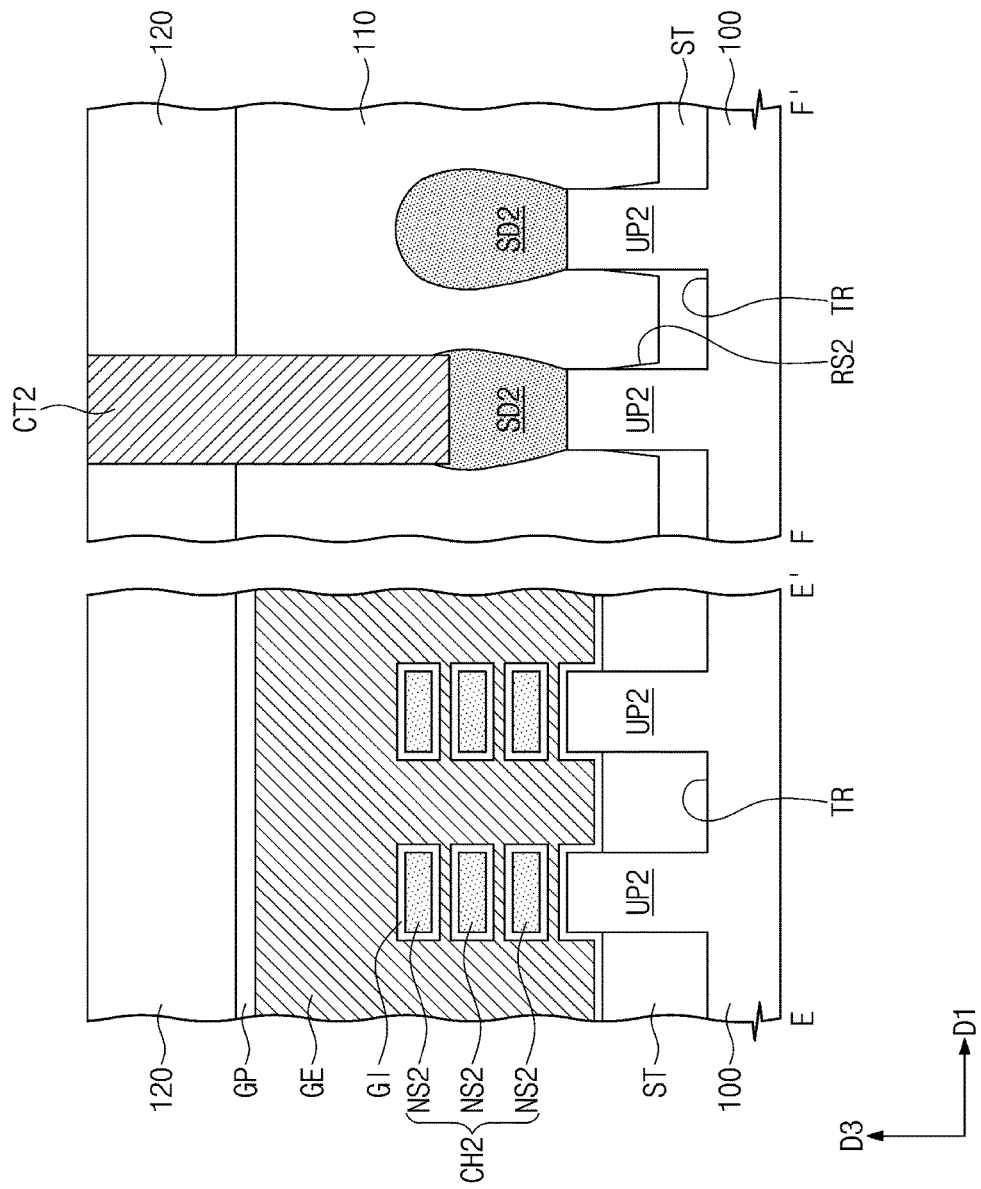
FIG. 2D is a cross-sectional view taken along lines E-E' and F-F' of FIG. 1.

FIG. 1 is a plan view for explaining a semiconductor device according to exemplary embodiments. FIG. 2A is a cross-sectional view taken along line A-A' of FIG. 1. FIG. 2B is a cross-sectional view taken along lines B-B' and C-C' of FIG. 1. FIG. 2C is a cross-sectional view taken along line D-D' of FIG. 1. FIG. 2D is a cross-sectional view taken along lines E-E' and F-F' of FIG. 1.

Referring to FIGS. 1 and 2A to 2D, a substrate 100 may be provided to include a first region RG1 and a second region RG2. The substrate 100 may be a semiconductor substrate. For example, the substrate 100 may be a silicon substrate, a germanium substrate, or an SOI (Silicon-On-Insulator) substrate. First transistors may be provided on the first region RG1 of the substrate 100, and second transistors may be provided on the second region RG2 of the substrate 100.

In some embodiments, the first and second regions RG1 and RG2 of the substrate 100 may be a memory cell region where a plurality of memory cells are formed to store data. For example, the memory cell region of the substrate 100 may be provided thereon with memory cell transistors constituting a plurality of static random access memory (SRAM) cells. Some of the first and second transistors may be the memory cell transistors.

In other embodiments, the first and second regions RG1 and RG2 of the substrate 100 may be a logic cell region where logic transistors are disposed to constitute a logic circuit of a semiconductor device. For example, the logic cell region of the substrate 100 may be provided thereon with logic transistors constituting a core or an input/output (I/O) terminal. Some of the first and second transistors may be the logic transistors. The present inventive concept, however, is not limited thereto.

The first transistors of the first region RG1 may have conductivity different from that of the second transistors of the second region RG2. For example, the first transistors of the first region RG1 may be a p-channel metal-oxide field-effect transistor (PMOSFET), and the second transistors of the second region RG2 may be an n-channel metal-oxide field-effect transistor (NMOSFET).

A device isolation layer ST may be provided to define first and second upper patterns UP1 and UP2 formed at an upper portion of the substrate 100. The first upper patterns UP1 may be disposed on the first region RG1, and the second upper patterns UP2 may be disposed on the second region RG2. The device isolation layer ST may fill a trench TR between the first and second upper patterns UP1 and UP2. The device isolation layer ST may have a top surface lower than top surfaces of the first and second upper patterns UP1 and UP2. For example, the uppermost surfaces of the first and second upper patterns UP1 and UP2 may at a higher vertical level (e.g., in the third direction D3) than the uppermost surface of the device isolation layer ST.

The substrate 100 may further include an isolation region IR extending in a first direction D1. The isolation region IR may vertically overlap at least a portion of the trench TR. For example, the isolation region IR may be formed above portions of the trench TR in the third direction D3. In this configuration, a pair of adjacent upper patterns UP1 and UP2 may be spaced apart from each other in a second direction D2 across the isolation region IR. The first and second directions D1 and D2 may cross each other. For example, the first and second directions D1 and D2 may be perpendicular to one another. In some embodiments, the pair of adjacent upper patterns UP1 and UP2 may be substantially parallel to one another and substantially perpendicular to the isolation region IR.

First active patterns AP1 may be provided on the first upper patterns UP1, and second active patterns AP2 may be provided on the second upper patterns UP2. For example, each of the first active patterns AP1 may vertically overlap each of the first upper patterns UP1, and each of the second active patterns AP2 may overlap each of the second upper patterns UP2. The first and second active patterns AP1 and AP2 may have a linear shape extending in the second direction D2.

A plurality of gate structures may be provided to extend in the first direction D1 while overlapping, or crossing, the first and second active patterns AP1 and AP2. Each of the gate structures may include a gate electrode GE, a gate dielectric pattern GI extending along a sidewall and a bottom surface of the gate electrode GE, a pair of gate spacers GS provided on opposite sidewalls of the gate electrode GE, and a gate capping pattern GP covering a top surface of the gate electrode GE and the top surfaces of the gate dielectric pattern GI. In some embodiments, the gate capping pattern GP may be formed between upper regions of the gate spacers GS. The gate capping pattern GP may have a bottom surface in contact with top surfaces of the gate dielectric pattern GI and the gate electrode GE, and a top surface at the same vertical level as top surfaces of the gate spacers GS.

At least one of the gate structures may extend in the first direction D1 while overlapping or crossing the device isolation layer ST on the isolation region IR. Each of the gate structures on the isolation region IR may include a dummy gate electrode DE. In terms of circuitry, the dummy gate electrode DE on the isolation region IR may not function as a gate of each of the first and second transistors. In contrast, in terms of circuitry, the gate electrode GE overlapping or crossing the first and second active patterns AP1 and AP2 may act as a gate of each of the first and second transistors.

Each of the gate electrode GE and the dummy gate electrode DE may include doped semiconductor, conductive metal nitride, and/or metal. For example, each of the gate electrode GE and the dummy gate electrode DE may include metal nitride, such as TiN, WN, and TaN, and/or metal, such as Ti, W, and Ta. The gate dielectric pattern GI may include at least one of a silicon oxide layer, a silicon oxynitride layer, or a high-k dielectric layer. The high-k dielectric layer may include a material, such as hafnium oxide (HfO), aluminum oxide (AlO), or tantalum oxide (TaO), whose dielectric constant is greater than that of a silicon oxide layer. Each of the gate spacer GS and the gate capping patterns GP may include at least one of a silicon oxide layer, a silicon nitride layer, or a silicon oxynitride layer.

Each of the first active patterns AP1 may include a first channel pattern CH1 and first source/drain patterns SD1 that are spaced apart from each other in the second direction D2 across the first channel pattern CH1. For example, the first source/drain patterns SD1 may be formed on opposite sides of the first channel pattern CH1. Each of the second active patterns AP2 may include a second channel pattern CH2 and second source/drain patterns SD2 that are spaced apart from each other in the second direction D2 across the second channel pattern CH2. For example, the second source/drain patterns SD2 may be formed on opposite sides of the second channel pattern CH2.

First recessed regions RS1 may be formed at an upper portion of the device isolation layer ST on the first region RG1, and second recessed regions RS2 may be formed at an upper portion of the device isolation layer ST on the second region RG2. For example, the first and second recessed regions RS1 and RS2 may be recessed into upper surfaces of the device isolation layer ST in the first and second regions RG1 and RG2, respectively. As viewed in a plan view, the first recessed regions RS1 may be positioned between the gate structures on the first region RG1 and between the first source/drain patterns SD1. As viewed in a plan view, the second recessed regions RS2 may be positioned between the gate structures on the second region RG2 and between the second source/drain patterns SD2. Accordingly, the first and second recessed regions RS1 and RS2 may have a bottom surface that is lower than the top surface of the device isolation layer ST below the gate electrode GE in the first and second regions RG1 and RG2, respectively.

The first channel pattern CH1 may include a plurality of first semiconductor patterns NS1 that are vertically stacked. The first semiconductor patterns NS1 may be spaced apart from each other in a third direction D3 perpendicular to a top surface of the substrate 100. Each of the first source/drain patterns SD1 may be in direct contact with sidewalls of the first semiconductor patterns NS1. For example, the first semiconductor patterns NS1 may connect adjacent first source/drain patterns SD1 to each other. Three first semiconductor patterns NS1 are exemplarily illustrated, but the number of the first semiconductor patterns NS1 is not limited to three.

The second channel pattern CH2 may include a plurality of second semiconductor patterns NS2 that are vertically stacked. The second semiconductor patterns NS2 may be spaced apart from each other in the third direction D3 perpendicular to a top surface of the substrate 100. Each of the second source/drain patterns SD2 may be in direct contact with sidewalls of the second semiconductor patterns NS2. For example, the second semiconductor patterns NS2 may connect adjacent second source/drain patterns SD2 to each other. Three second semiconductor patterns NS2 are exemplarily illustrated, but the number of the second semiconductor patterns NS2 is not limited to three.

Each of the first semiconductor patterns NS1 positioned at the same level as each of the corresponding second semiconductor patterns NS2 may be formed from the same semiconductor layer. Thus, in some embodiments, the first semiconductor pattern NS1 and the second semiconductor pattern NS2 that are positioned at the same level may have substantially the same thicknesses and be comprised of the same material. For example, the first semiconductor patterns NS1 and the second semiconductor patterns NS2 may include at least one of Si, SiGe, or Ge. The stacked first semiconductor patterns NS1 may have the same thickness or different thicknesses from each other. For example, a first of the stacked first semiconductor patterns NS1 may have the same or different thickness as that of a second or subsequent ones of the stacked first semiconductor patterns NS1, the second of the stacked first semiconductor patterns NS1 may have the same or different thickness as that of a third or subsequent ones of the stacked first semiconductor patterns NS1, etc. Likewise, the stacked second semiconductor patterns NS2 may have the same thickness or different thicknesses from each other. For example, a first of the stacked second semiconductor patterns NS2 may have the same or different thickness as that of a second or subsequent ones of the stacked second semiconductor patterns NS2, the second of the stacked second semiconductor patterns NS2 may have the same or different thickness as that of a third or subsequent ones of the stacked second semiconductor patterns NS2, etc.

As discussed above, the gate electrode GE and the gate dielectric pattern GI may extend in the first direction D1 while covering the first and second channel patterns CH1 and CH2. In more detail, the gate electrode GE and the gate dielectric pattern GI may fill spaces between the stacked first semiconductor patterns NS1. The gate dielectric pattern GI may be in direct contact with the first semiconductor patterns NS1, and the gate electrode GE may be spaced apart from the first semiconductor patterns NS1 across the gate dielectric pattern GI. For example, the gate dielectric pattern GI may be formed between the gate electrode GE and the first semiconductor patterns NS1.

The gate electrode GE and the gate dielectric pattern GI may fill spaces between the stacked second semiconductor patterns NS2. The gate dielectric pattern GI may be in direct contact with the second semiconductor patterns NS2, and the gate electrode GE may be spaced apart from the second semiconductor patterns NS2 across the gate dielectric pattern GI. For example, the gate dielectric pattern GI may be formed between the gate electrode GE and the second semiconductor patterns NS2.

In conclusion, the gate electrode GE may surround a circumferential surface of each of the first and second semiconductor patterns NS1 and NS2. As such, each of the first and second transistors may be a gate-all-around type field effect transistor including a channel pattern of which circumferential surface is surrounded by the gate electrode GE.

Barrier dielectric patterns BP may be provided between the first source/drain patterns SD1 and the gate electrode GE and between the second source/drain patterns SD2 and the gate electrode GE.

The barrier dielectric patterns BP on the first region RG1 may be spaced apart from each other in the third direction D3 across the first semiconductor patterns NS1. For example, the barrier dielectric patterns BP may be formed between neighboring first semiconductor patterns NS1. The barrier dielectric patterns BP on the second region RG2 may be spaced apart from each other in the third direction D3 across the second semiconductor patterns NS2. For example, the barrier dielectric patterns BP may be formed between neighboring second semiconductor patterns NS2. The barrier dielectric patterns BP may be in direct contact with the gate dielectric pattern GI. For example, the barrier dielectric patterns BP may include a silicon nitride layer.

The first source/drain patterns SD1 may be epitaxial patterns formed from the first semiconductor patterns NS1 and the first upper patterns UP1 that act as a seed layer, and the second source/drain patterns SD2 may be epitaxial patterns formed from the second semiconductor patterns NS2 and the second upper patterns UP2 that act as a seed layer.

When the first transistors of the first region RG1 are PMOSFETs, the first source/drain patterns SD1 may include a material that exerts compressive strain on the first channel pattern CH1. For example, the first source/drain patterns SD1 may include SiGe whose lattice constant is greater than that of Si. In addition, the first source/drain patterns SD1 may have P-type conductivity.

When the second transistors of the second region RG2 are NMOSFETs, the second source/drain patterns SD2 may include a material that exerts tensile strain on the second channel pattern CH2. For example, the second source/drain patterns SD2 may include SiC whose lattice constant is less than that of Si. Alternatively, the second source/drain patterns SD2 may include Si whose constant is substantially the same as that of the substrate 100. In addition, the second source/drain patterns SD2 may have N-type conductivity. The first and second source/drain patterns SD1 and SD2 may be formed of different materials from each other, and shapes of the first and second source/drain patterns SD1 and SD2 may be different from each other (see FIGS. 2B and 2D).

A blocking layer BL may be provided on the first region RG1 of the substrate 100. The blocking layer BL may cover the device isolation layer ST, the gate structures, and the first source/drain patterns SD1 on the first region RG1. The blocking layer BL may partially fill each of the first recessed regions RS1. The blocking layer BL may extend from the first recessed region RS1 onto either the gate spacer GS or the first source/drain pattern SD1. The blocking layer BL may include a material having an etch selectivity with respect to the barrier dielectric patterns BP. For example, when the barrier dielectric patterns BP include a silicon nitride (SiN) layer, the blocking layer BL may include at least one of SiOCN, SiCN, or SiON.

In contrast, the blocking layer BL may not be provided on the second region RG2 of the substrate 100, and may be limited to the first region RG1. For example, the blocking layer BL may not vertically overlap the second region RG2 and may be spaced apart from the second region RG2.

A first interlayer dielectric layer 110 may be provided on the substrate 100. The first interlayer dielectric layer 110 may have a top surface substantially coplanar with top surfaces of the gate capping patterns GP. The first interlayer dielectric layer 110 may directly cover the blocking layer BL on the first region RG1. As such, the first recessed regions RS1 may be filled with the blocking layer BL and the first interlayer dielectric layer 110. In contrast, the first interlayer dielectric layer 110 may directly cover the device isolation layer ST, the gate structures, and the second source/drain patterns SD2 on the second region RG2. As such, the second recessed regions RS2 may be filled with the first interlayer dielectric layer 110. For example, the first interlayer dielectric layer 110 may include a silicon oxide layer or a silicon oxynitride layer.

A second interlayer dielectric layer 120 may be provided on the first interlayer dielectric layer 110. For example, the second interlayer dielectric layer 120 may include a silicon oxide layer or a silicon oxynitride layer. First and second contact plugs CT1 and CT2 may be provided to penetrate the first and second interlayer dielectric layers 110 and 120, so that the first and second source/drain patterns SD1 and SD2 may be respectively connected to the first and second contact plugs CT1 and CT2. The first contact plug CT1 may further penetrate the blocking layer BL to connect with the first source/drain pattern SD1. The first and second contact plugs CT1 and CT2 may include conductive metal nitride and/or metal. For example, the first and second contact plugs CT1 and CT2 may include metal nitride such as TiN, WN, and TaN, and/or metal such as Ti, W, and Ta. In addition, the second interlayer dielectric layer 120 may cover the gate capping pattern GP.

FIGS. 3, 5, 7, 9, 11, 13, 15, 17, 19, 21 and 23 are plan views for explaining a method of manufacturing a semiconductor device according to exemplary embodiments. FIGS. 4A, 6A, 8A, 10A, 12A, 14A, 16A, 18A, 20A, 22A and 24A are cross-sectional views taken along line A-A' of FIGS. 3, 5, 7, 9, 11, 13, 15, 17, 19, 21 and 23, respectively. FIGS. 4B, 6B, 8B, 10B, 12B, 14B, 16B, 18B, 20B, 22B and 24B are cross-sectional views taken along lines B-B' and C-C' of FIGS. 3, 5, 7, 9, 11, 13, 15, 17, 19, 21 and 23, respectively. FIGS. 10C, 12C, 14C, 16C, 18C, 20C, 22C and 24C are cross-sectional views taken along line D-D' of FIGS. 9, 11, 13, 15, 17, 19, 21 and 23, respectively. FIGS. 10D, 12D, 14D, 16D, 18D, 20D, 22D and 24D are cross-sectional views taken along lines E-E' and F-F' of FIGS. 9, 11, 13, 15, 17, 19, 21 and 23, respectively.

Figure 3:
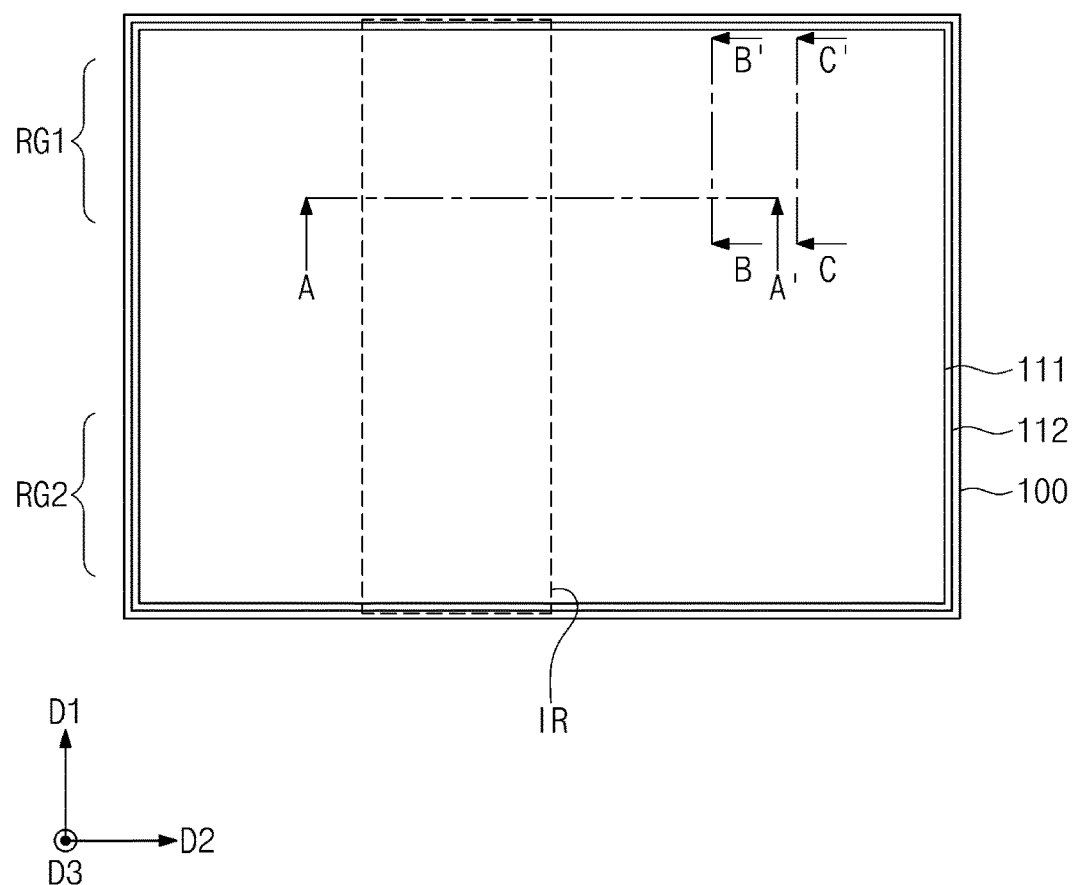
FIGS. 3, 5, 7, 9, 11, 13, 15, 17, 19, 21 and 23 are plan views for explaining a method of manufacturing a semiconductor device according to exemplary embodiments.
Figure 4B:
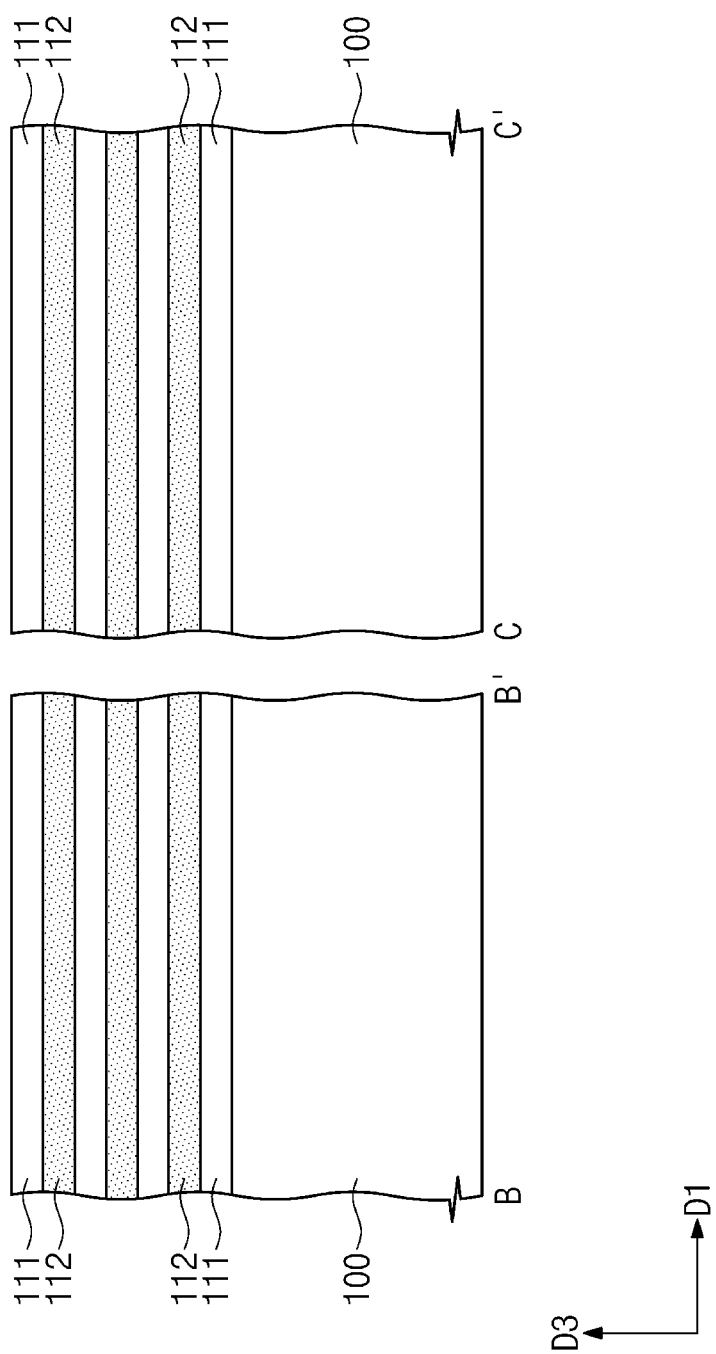

Referring to FIGS. 3, 4A and 4B, sacrificial layers 111 and semiconductor layers 112 may be alternately and repeatedly stacked on first and second regions RG1 and RG2 of a substrate 100. The sacrificial layers 111 and the semiconductor layers 112 are each illustrated repeatedly stacked three times, but not limited thereto. The sacrificial layers 111 may include a material having an etch selectivity with respect to the semiconductor layers 112. For example, the sacrificial layers 111 may be formed of a material that can be etched while minimizing etching of the semiconductor layers 112 when the sacrificial layers 111 are etched by an etching process using an etch recipe. This etch selectivity may be quantitatively expressed through a ratio of the etch rate of the sacrificial layers 111 to the etch rate of the semiconductor layers 112. In an exemplary embodiment, the sacrificial layers 111 may include one of materials that exhibit an etch selectivity of about 1:10 to about 1:200 with respect to the semiconductor layers 112. For example, the sacrificial layers 111 may be one of SiGe, Si and Ge, and the semiconductor layers 112 may be another of SiGe, Si and Ge.

The sacrificial layers 111 and the semiconductor layers 112 may be formed by an epitaxial growth process in which the substrate 100 is used as a seed layer. For example, the epitaxial growth process may be a chemical vapor deposition (CVD) process or a molecular beam epitaxy (MBE) process. The sacrificial layers 111 and the semiconductor layers 112 may be successively formed in the same chamber. The sacrificial layers 111 and the semiconductor layers 112 may not be selectively epitaxially grown on a specific zone of the substrate 100, but may be conformally formed on an entire surface of the substrate 100. The sacrificial layers 111 and the sacrificial layers 112 may be formed to have substantially the same thickness or different thicknesses from each other.

Figure 5:
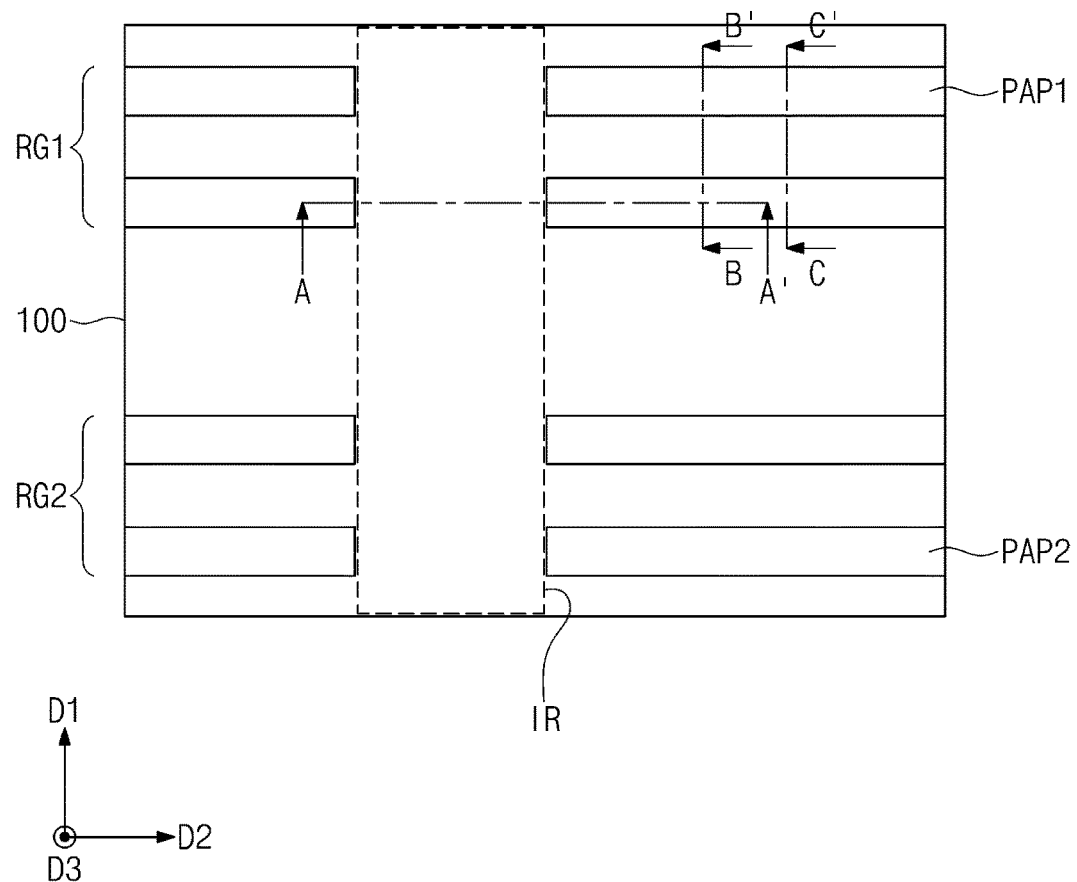
Figure 6A:
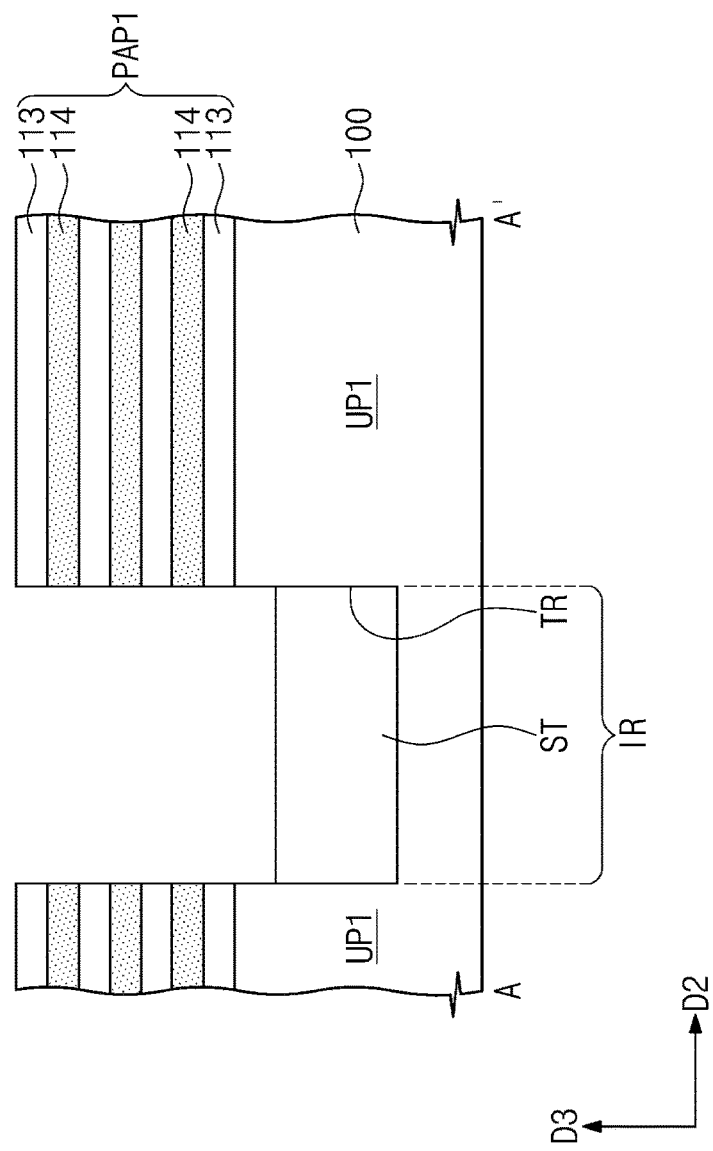

Referring to FIGS. 5, 6A and 6B, the sacrificial layers 111, the semiconductor layers 112, and the substrate 100 may be patterned to form a trench TR at an upper portion of the substrate 100. At the same time, first preliminary active patterns PAP1 and second preliminary active patterns PAP2 may be formed from the patterned sacrificial layers 111 and the semiconductor layers 112. The first and second preliminary active patterns PAP1 and PAP2 may be respectively provided on first and second upper patterns UP1 and UP2 of the substrate 100 that are defined by the trench TR. The first and second preliminary active patterns PAP1 and PAP2 may have a linear or bar shape extending in a second direction D2. The sacrificial layers 111 and the semiconductor layers 112 may be completely removed from an isolation region IR of the substrate 100.

For example, the sacrificial layers 111 may be patterned to form preliminary sacrificial patterns 113. The semiconductor layers 112 may be patterned to form preliminary semiconductor patterns 114. Accordingly, each of the first and second preliminary active patterns PAP1 and PAP2 may include the preliminary sacrificial patterns 113 and the preliminary semiconductor patterns 114 that are alternately and repeatedly stacked.

Thereafter, a device isolation layer ST may be formed to fill at least a portion of the trench TR. The formation of the device isolation layer ST may include forming an insulating layer on the entire surface of the substrate 100 and recessing the insulating layer to completely expose the first and second preliminary active patterns PAP1 and PAP2. The device isolation layer ST may thus have a top surface lower than top surfaces of the first and second upper patterns UP1 and UP2. For example, the insulating layer may be removed to entirely expose the first and second preliminary active patterns PAP1 and PAP2 and expose upper portions of the first and second upper patterns UP1 and UP2.

Figure 7:
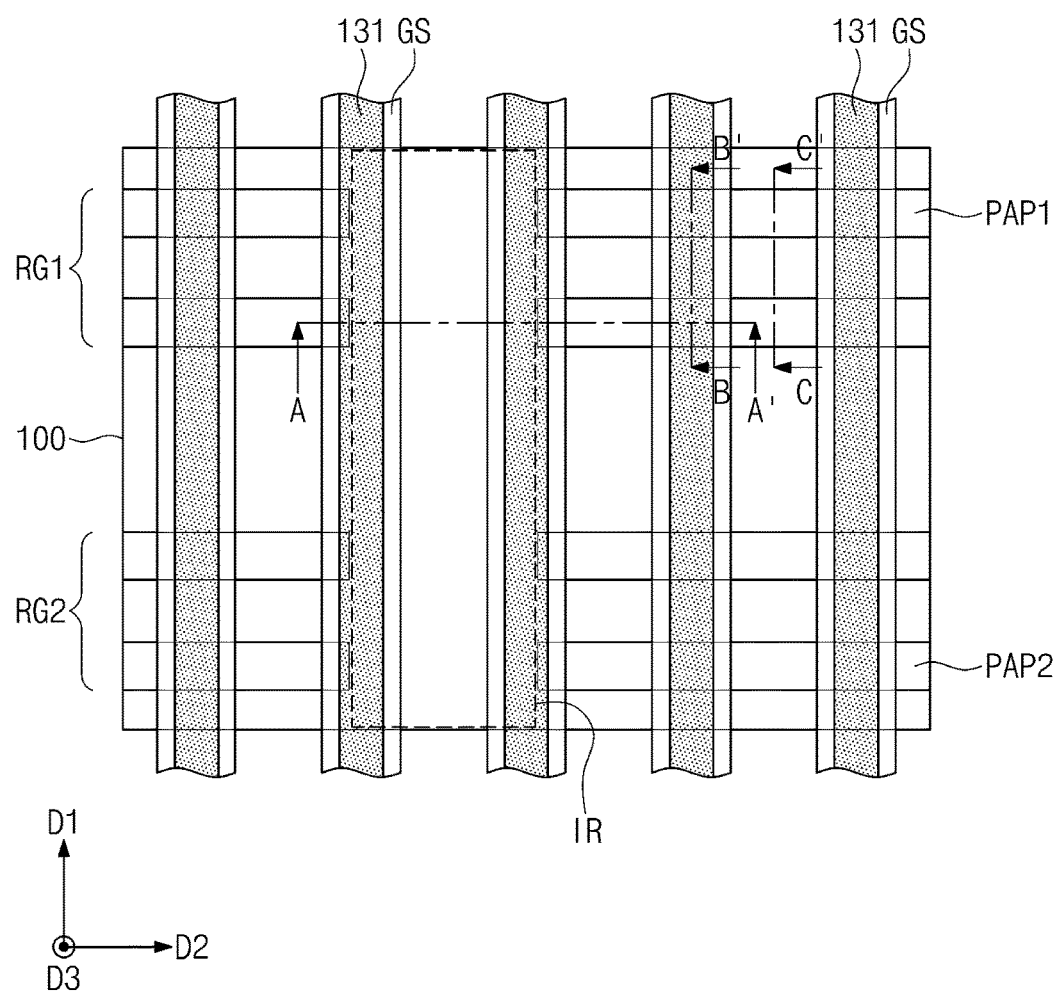
Figure 8B:
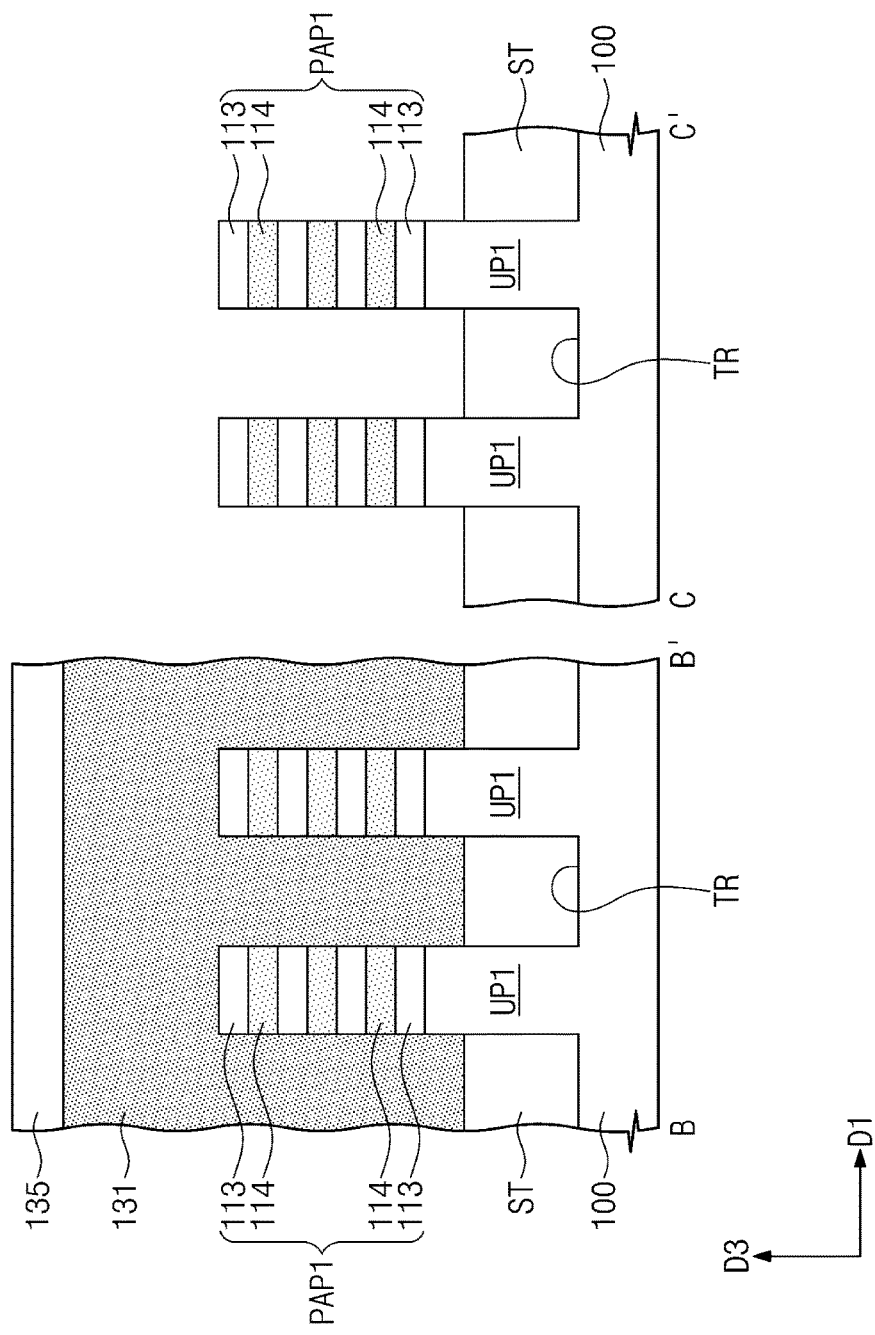
Figure 9:
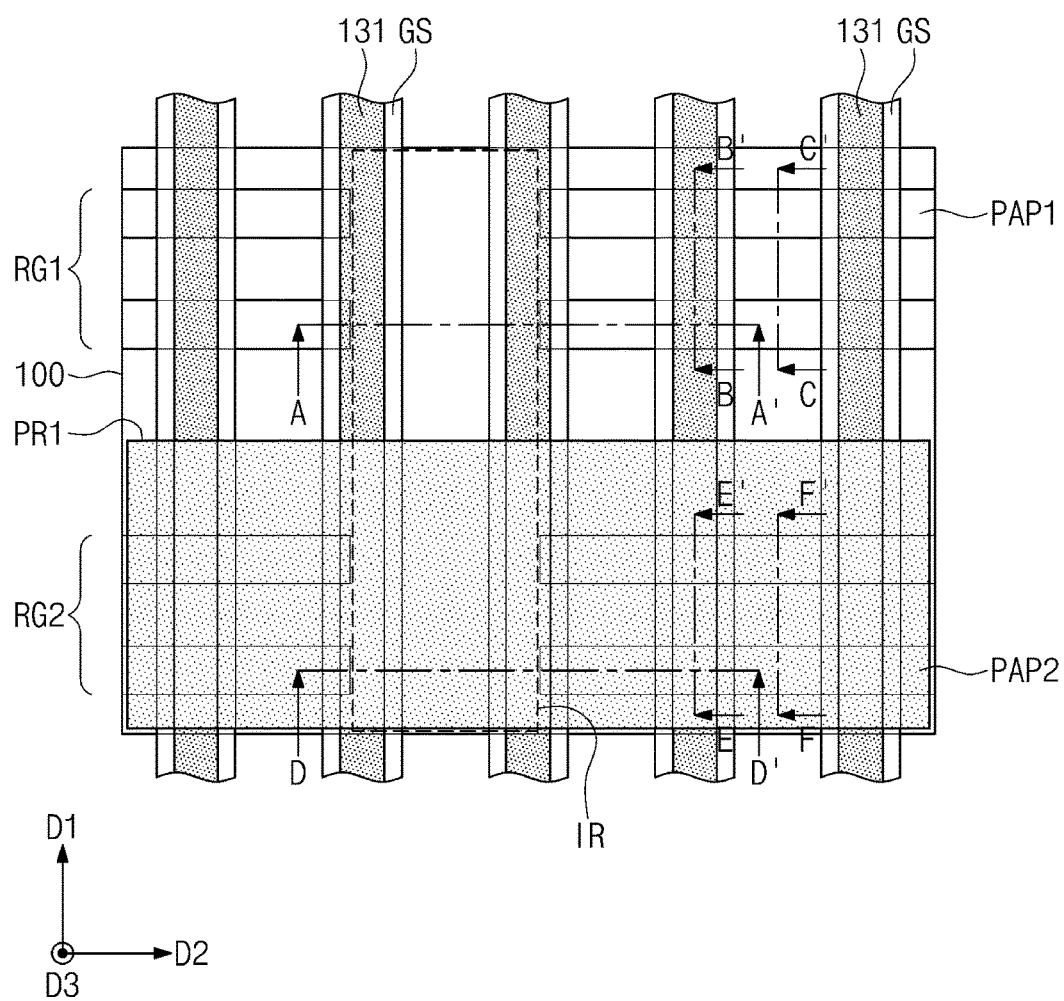
Figure 10A:
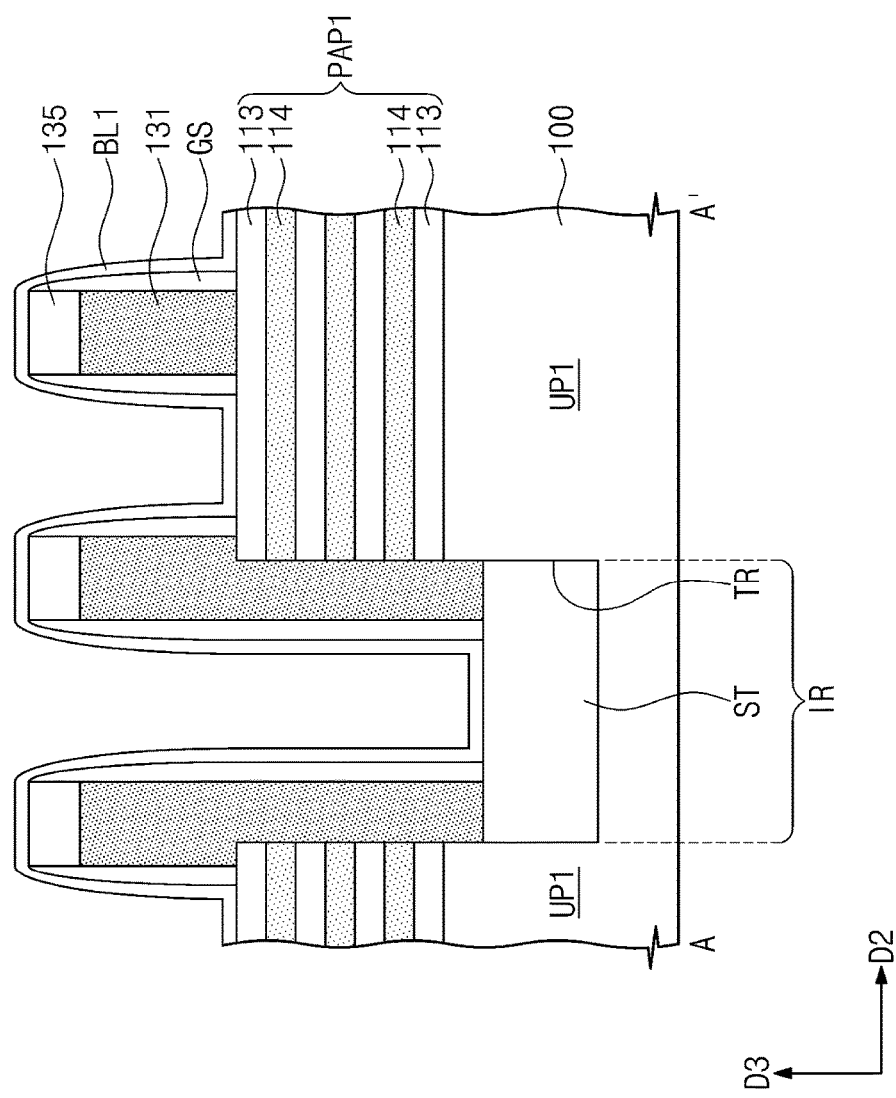
Figure 10B:
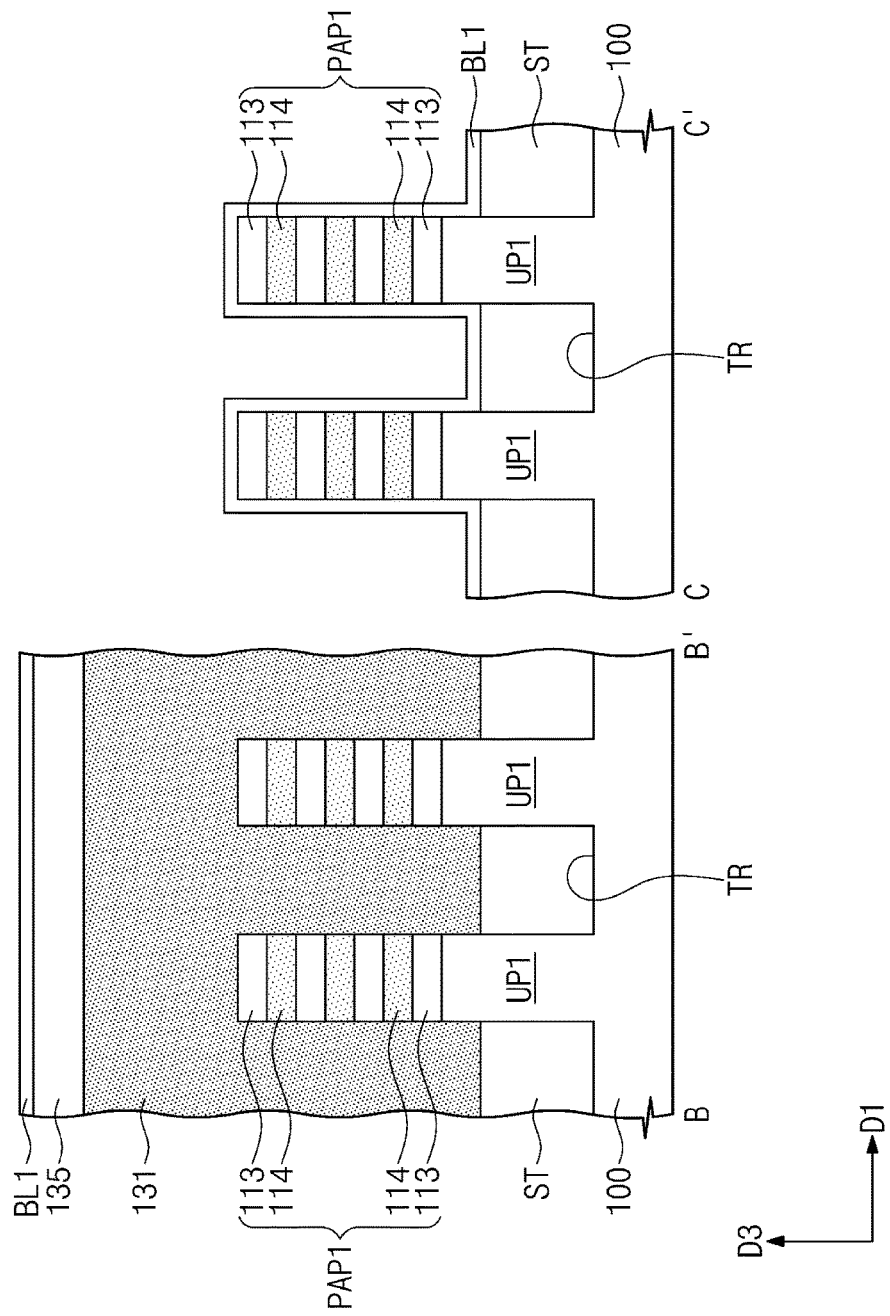
Figure 10C:
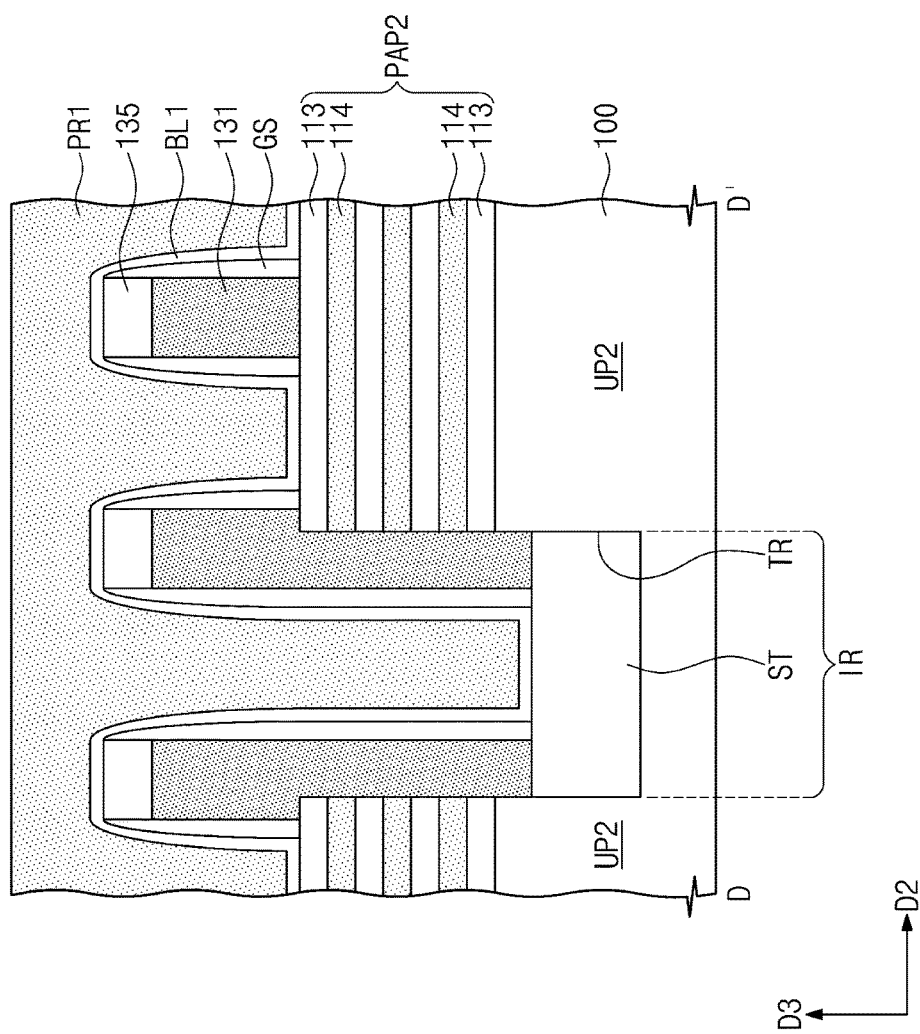
FIGS. 10C, 12C, 14C, 16C, 18C, 20C, 22C and 24C are cross-sectional views taken along line D-D' of FIGS. 9, 11, 13, 15, 17, 19, 21 and 23, respectively.
Figure 10D:
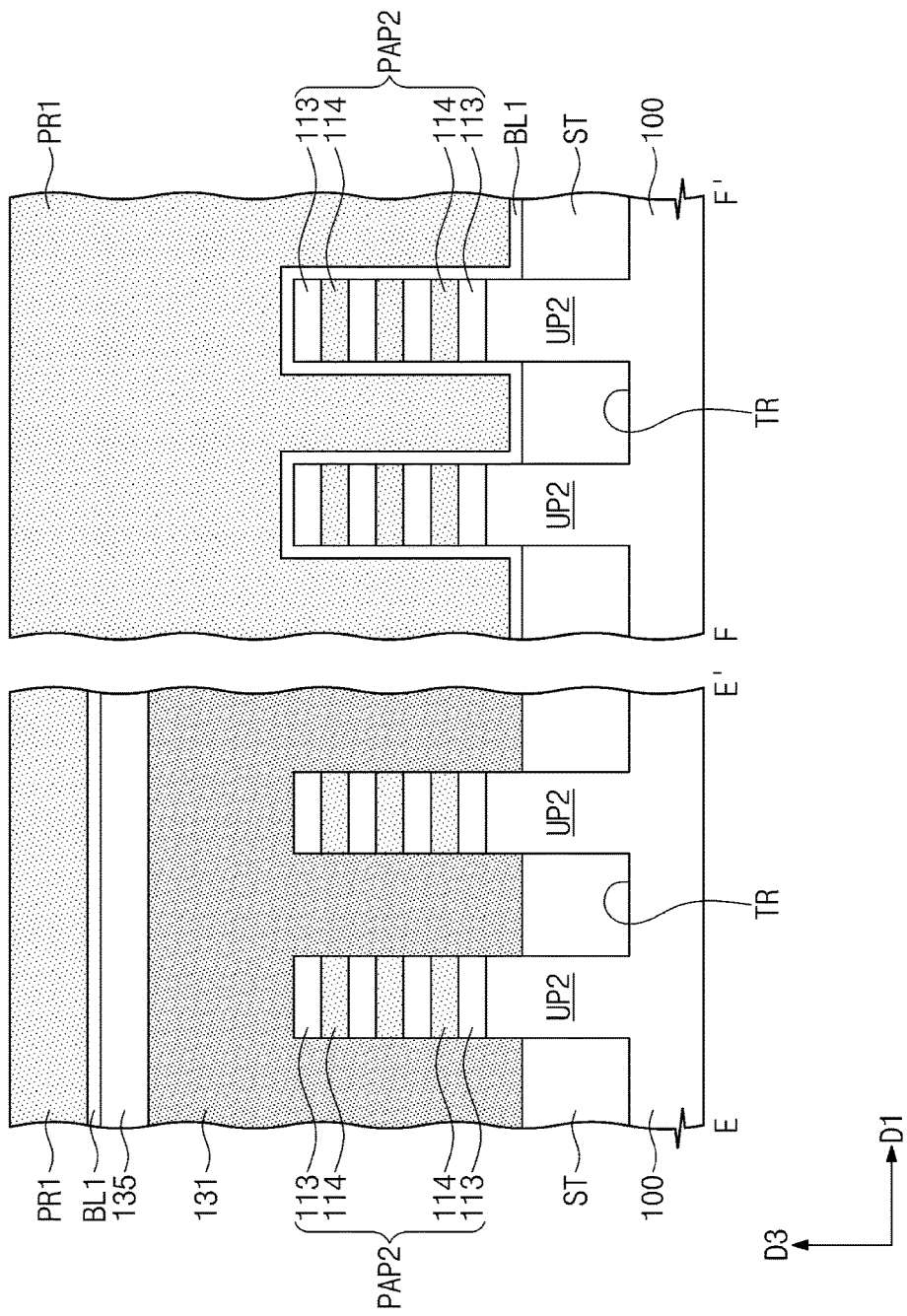
Figure 11:
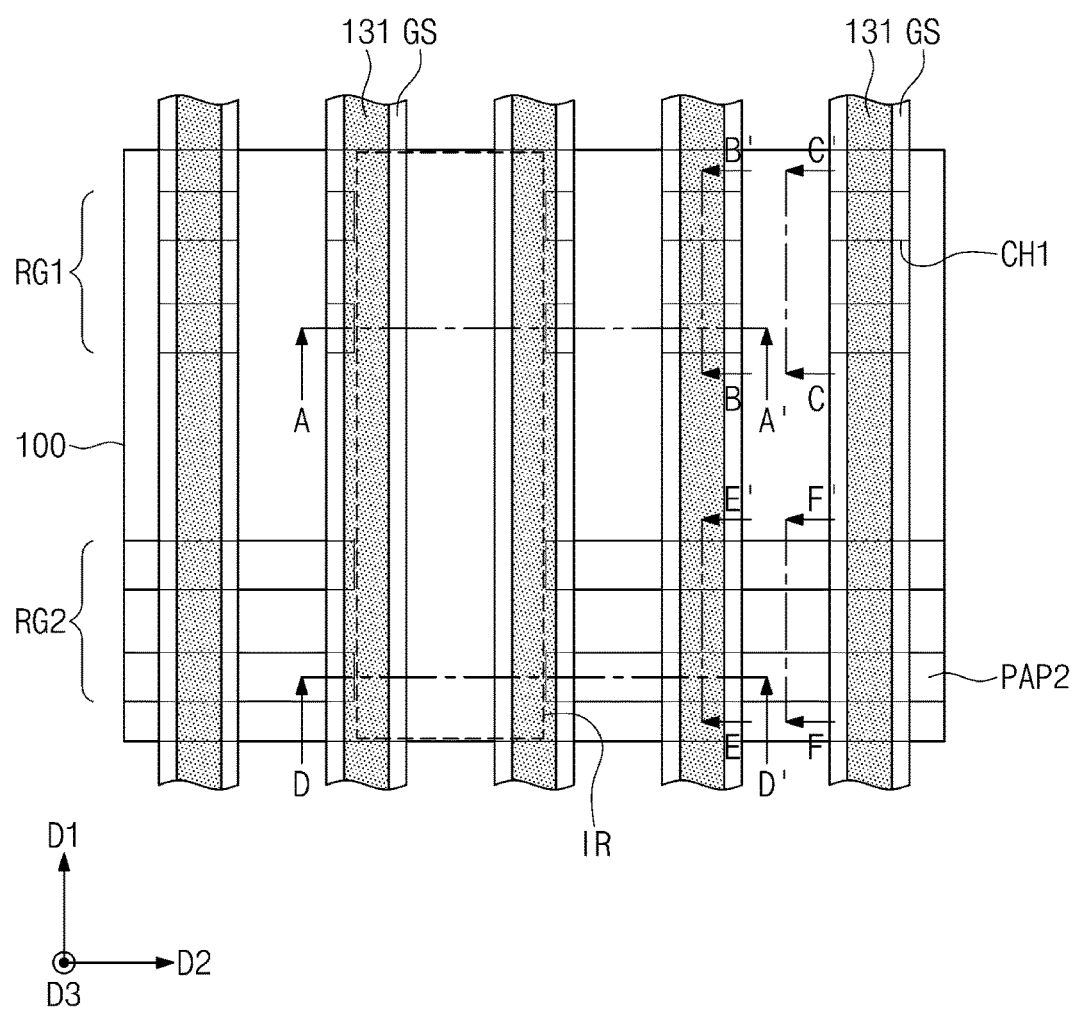
Figure 12A:
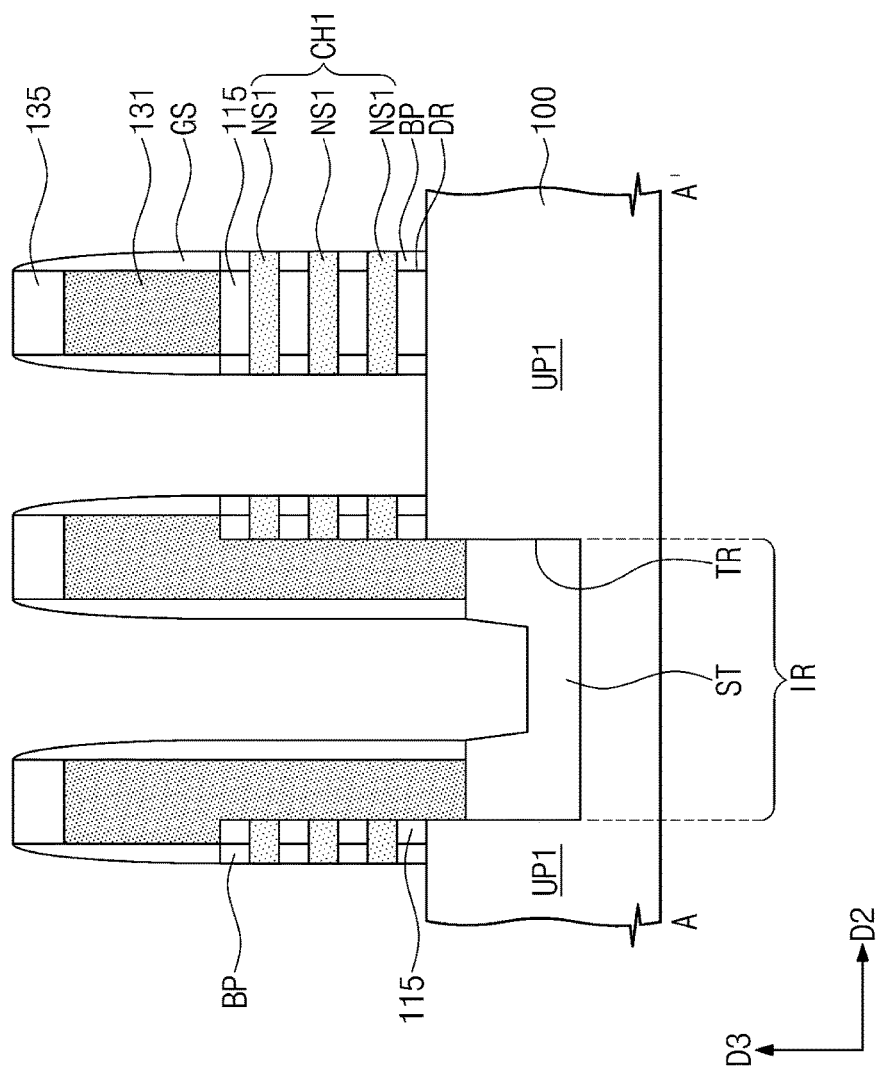
Figure 12B:
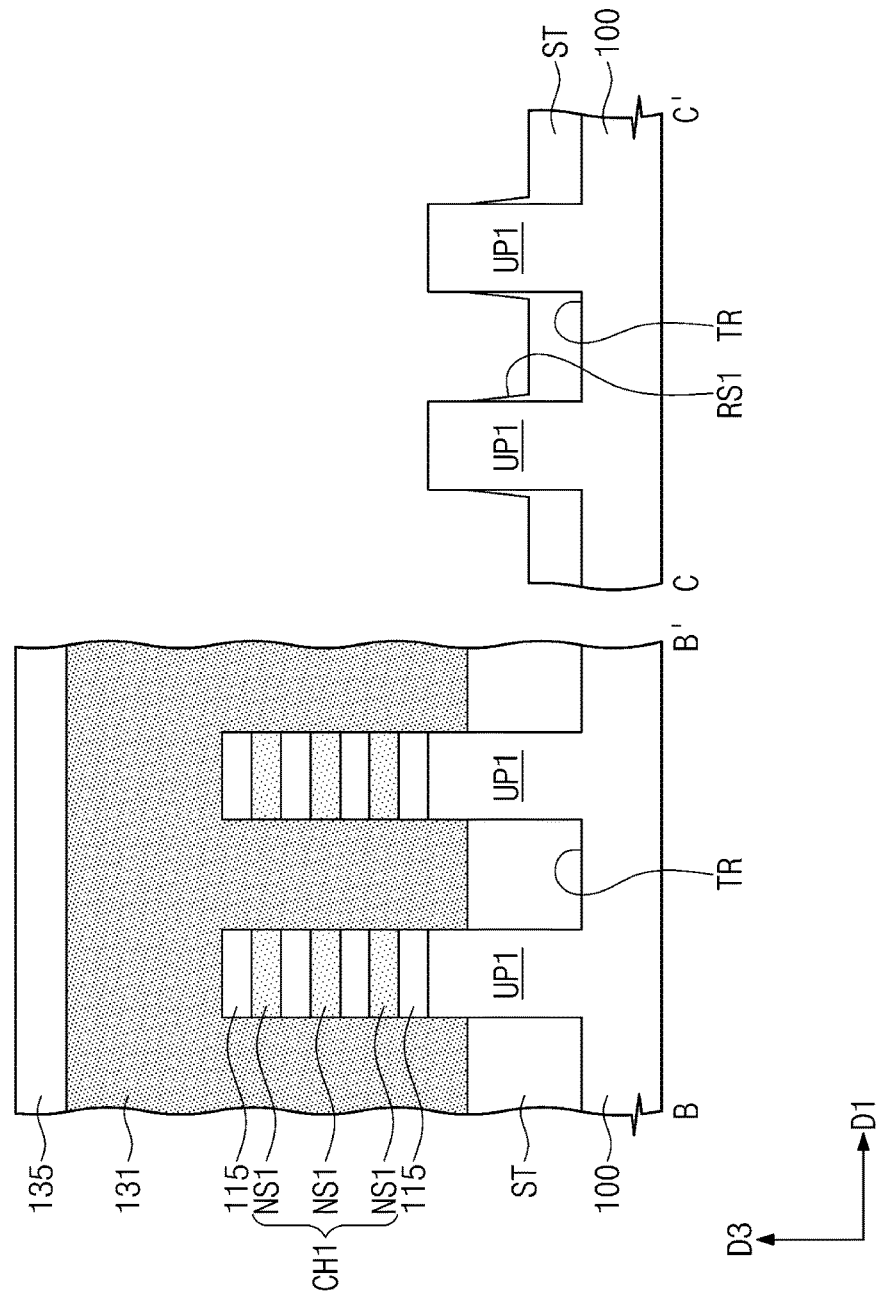
Figure 12C:
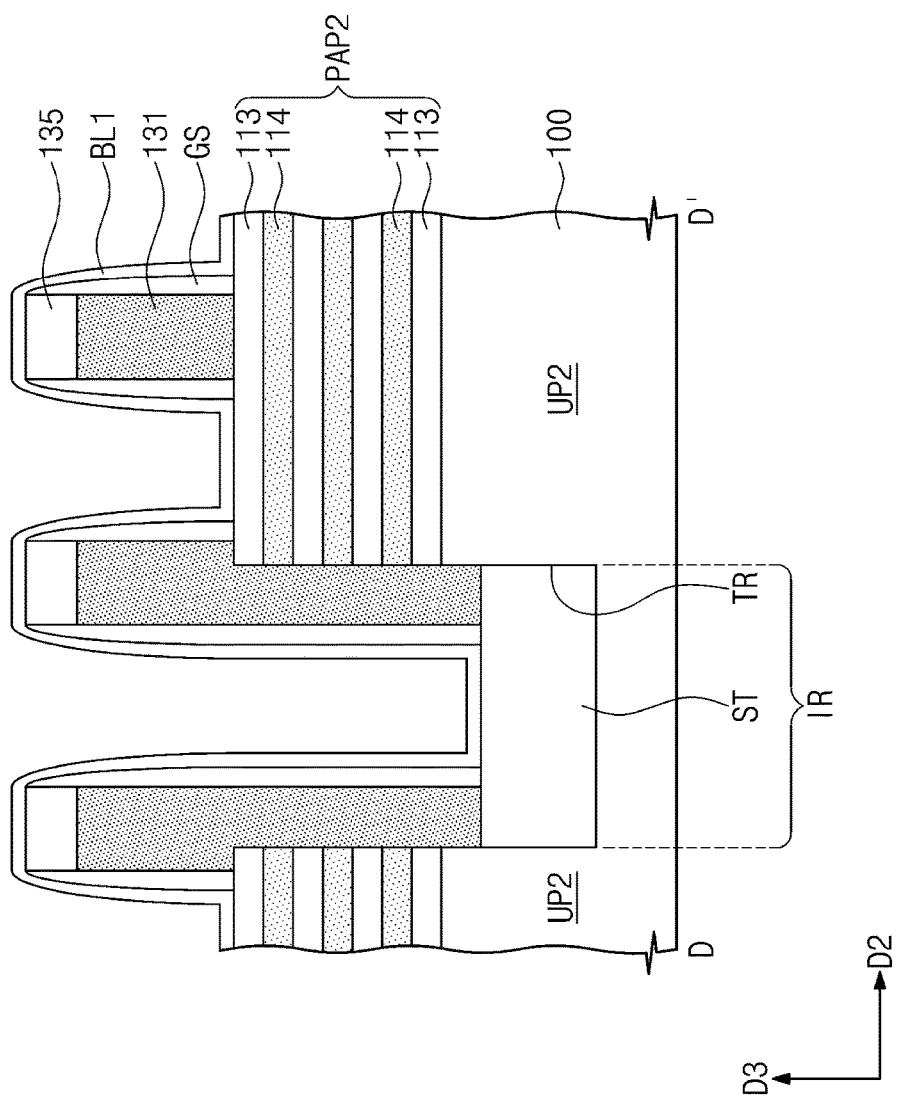
Figure 12D:
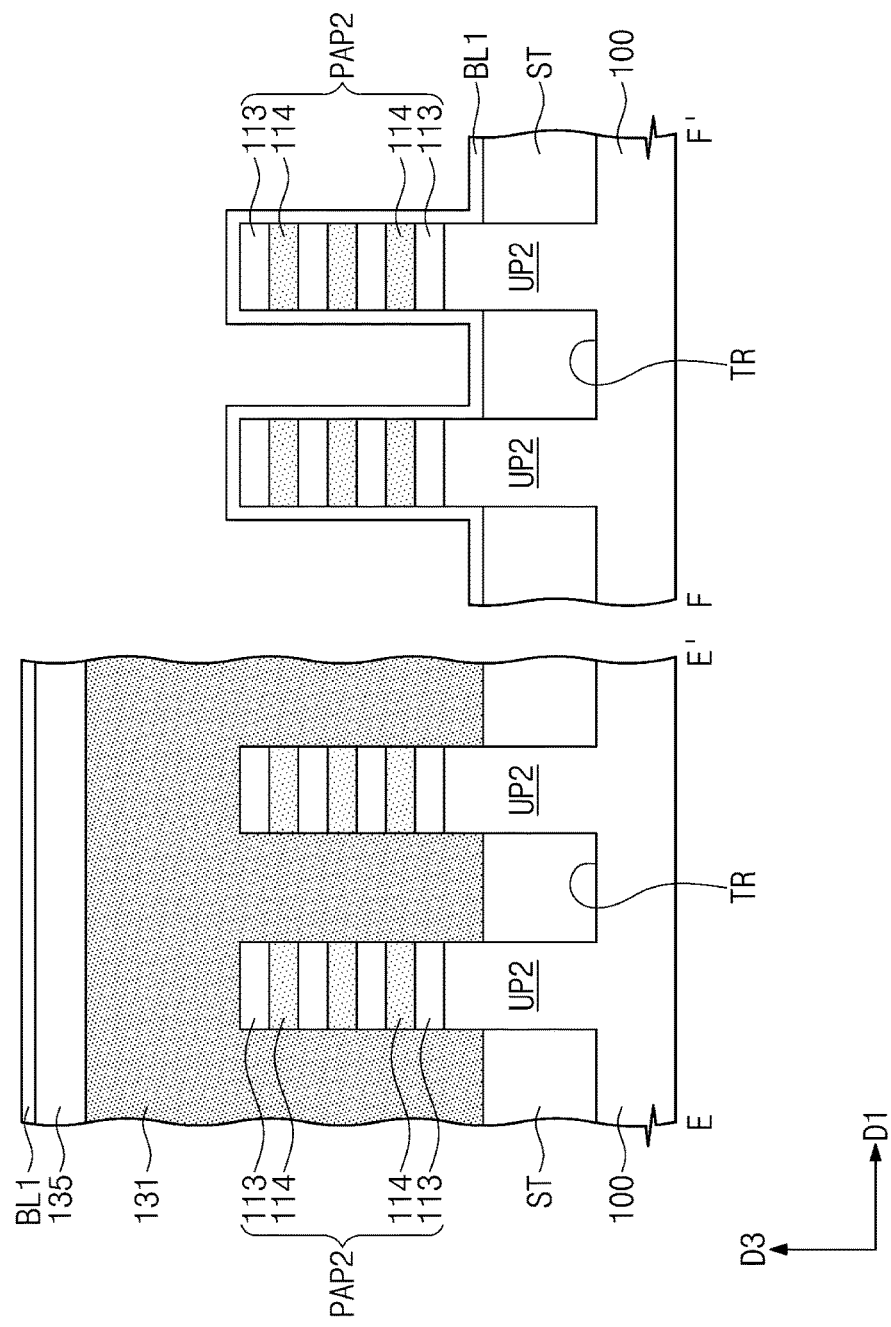
Figure 13:
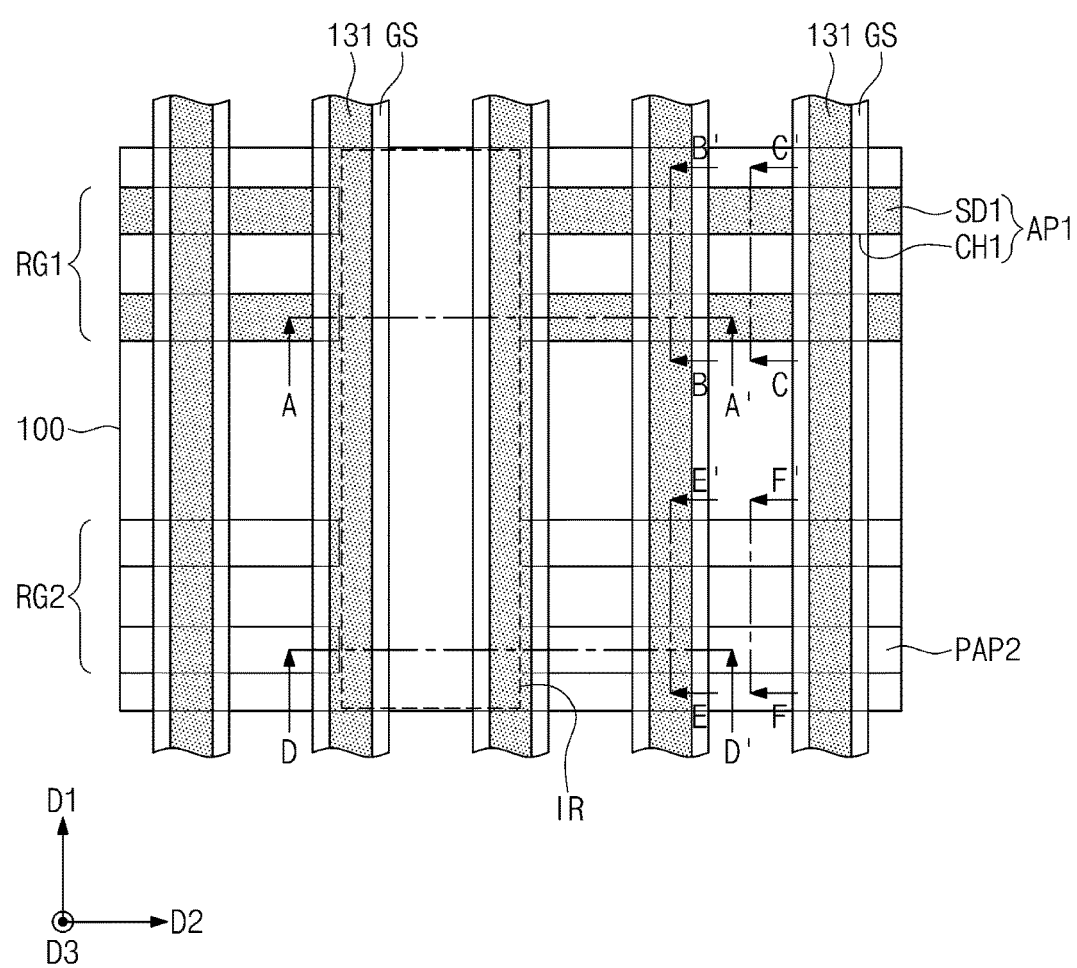
Figure 14A:
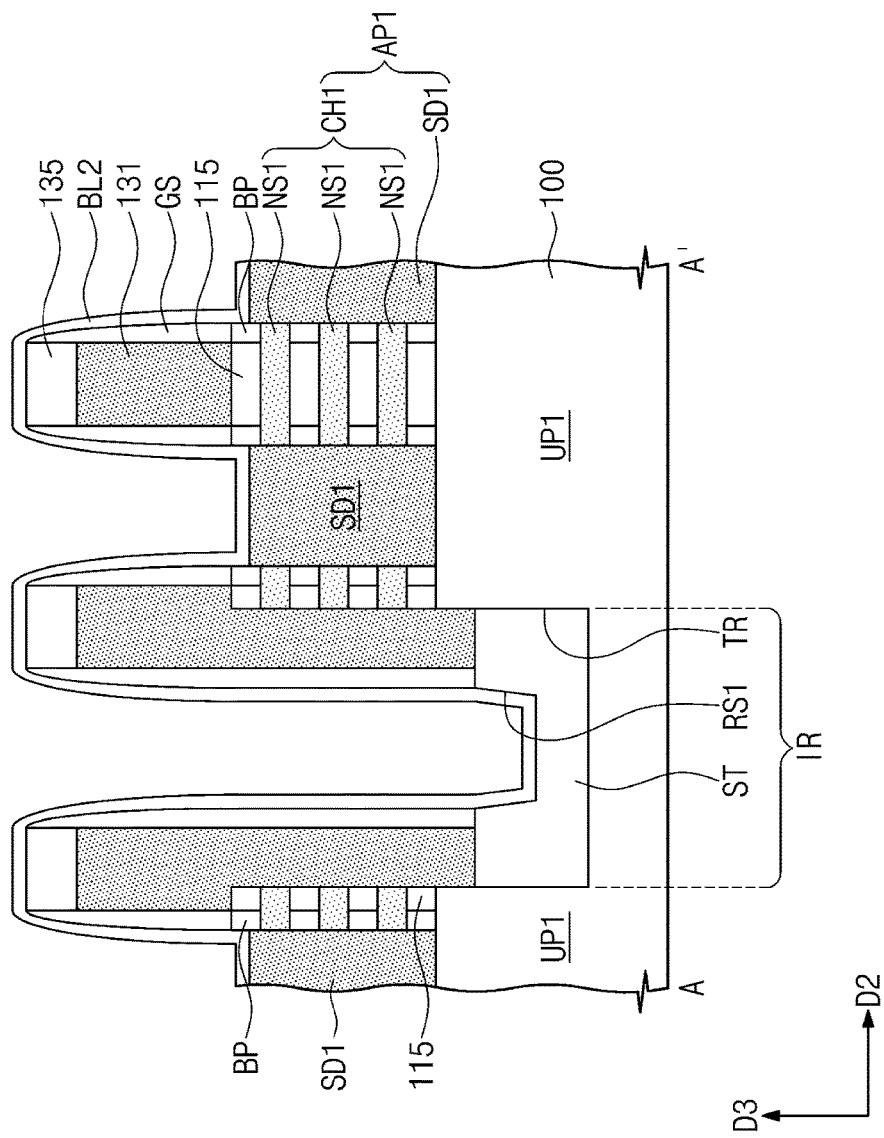
Figure 14B:
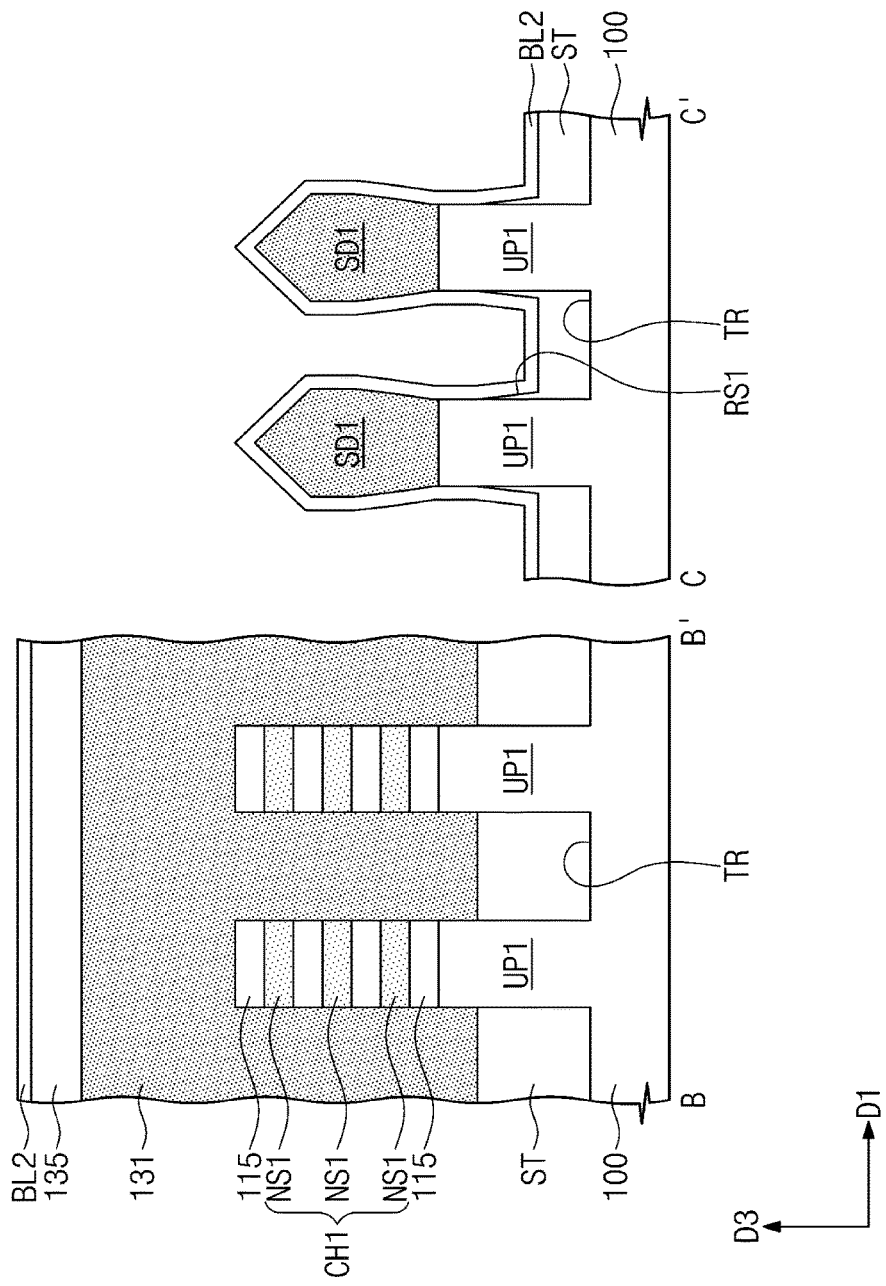
Figure 14C:
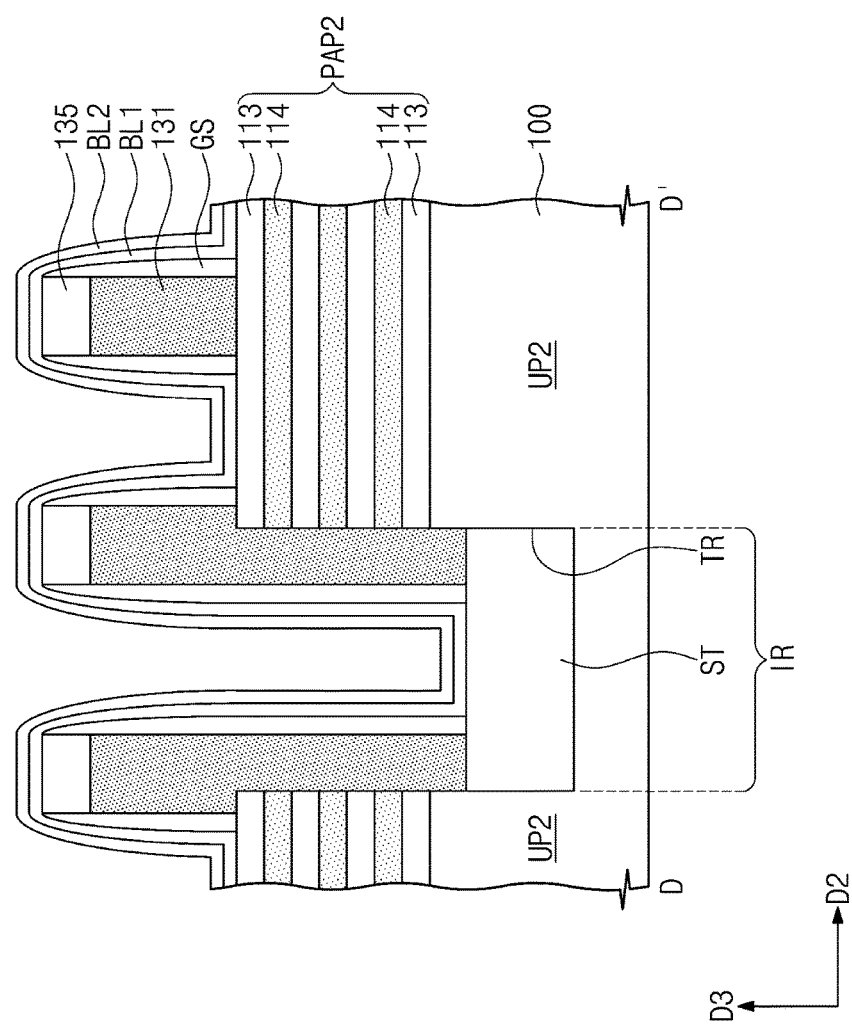
Figure 14D:
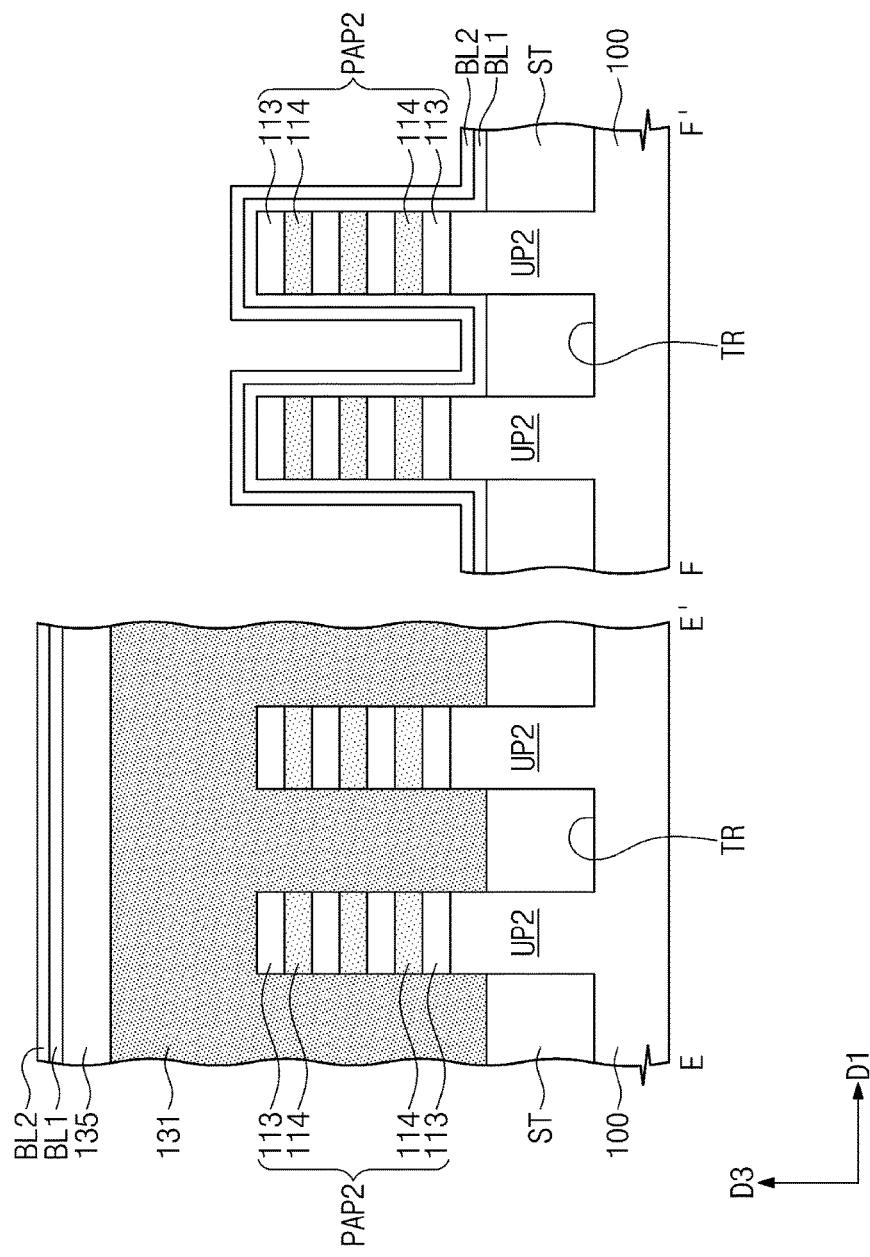
Figure 15:
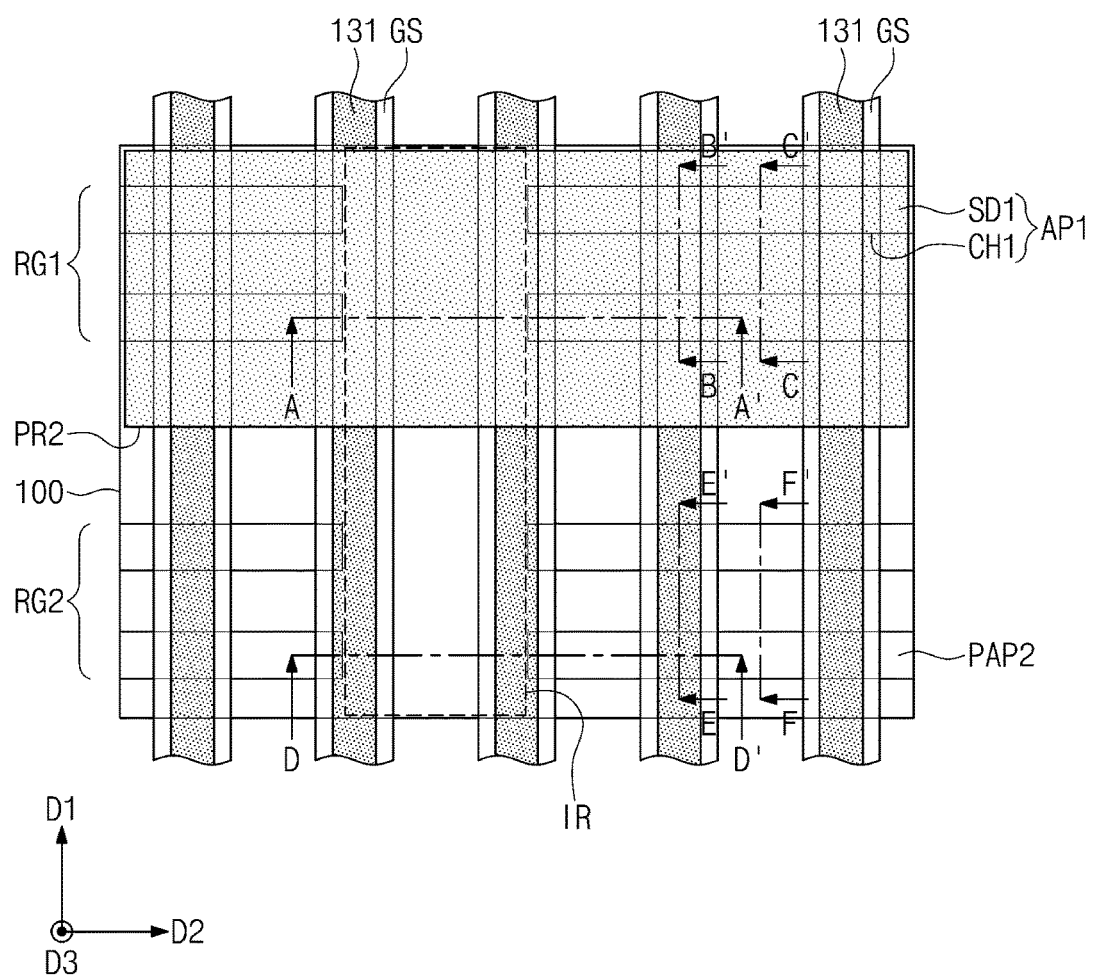
Figure 16A:
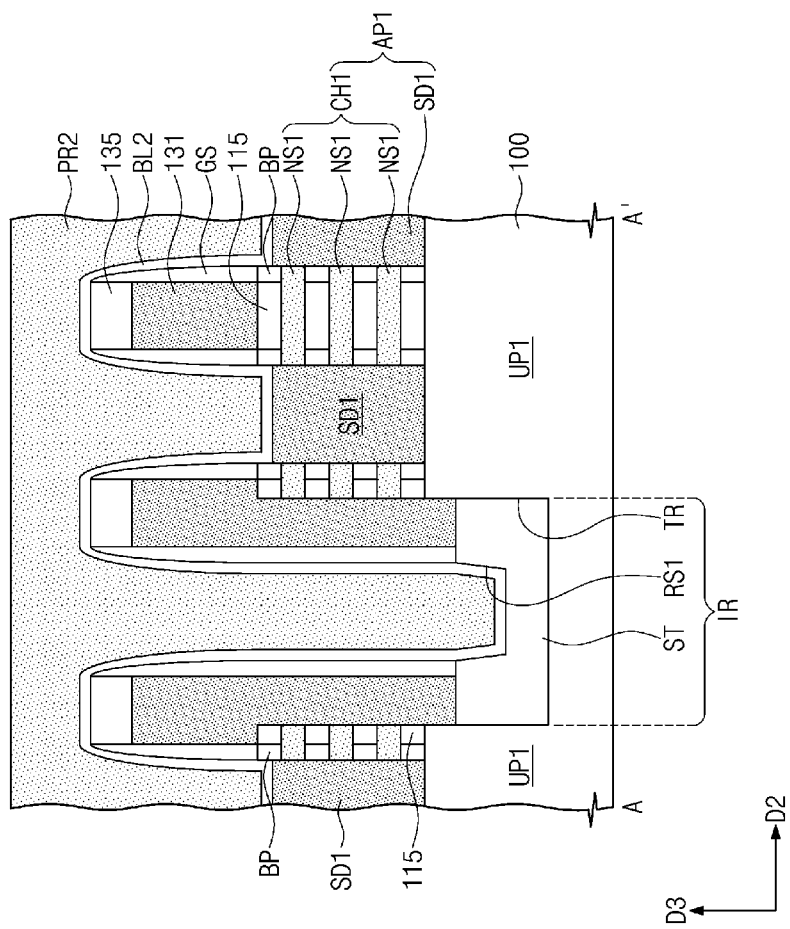
Figure 16B:
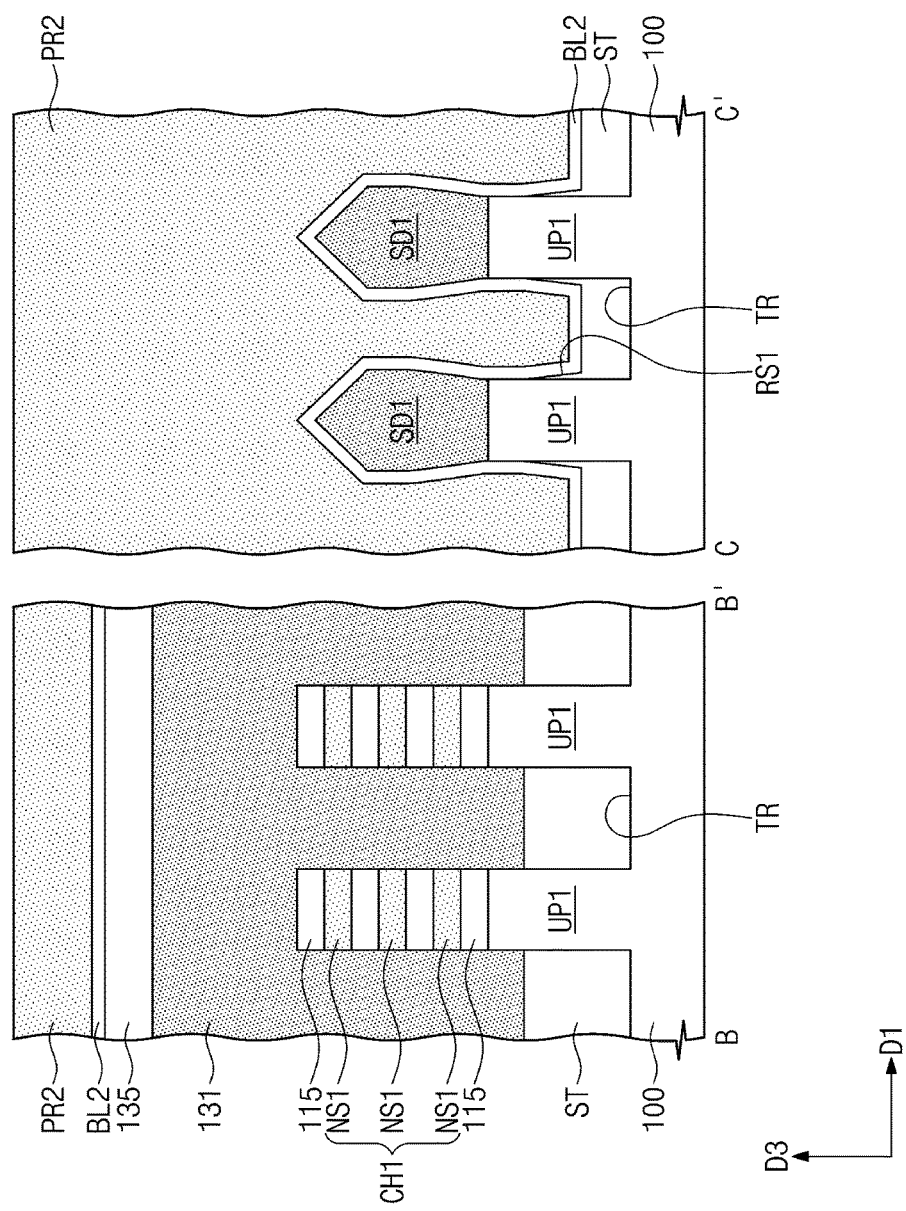
Figure 16C:
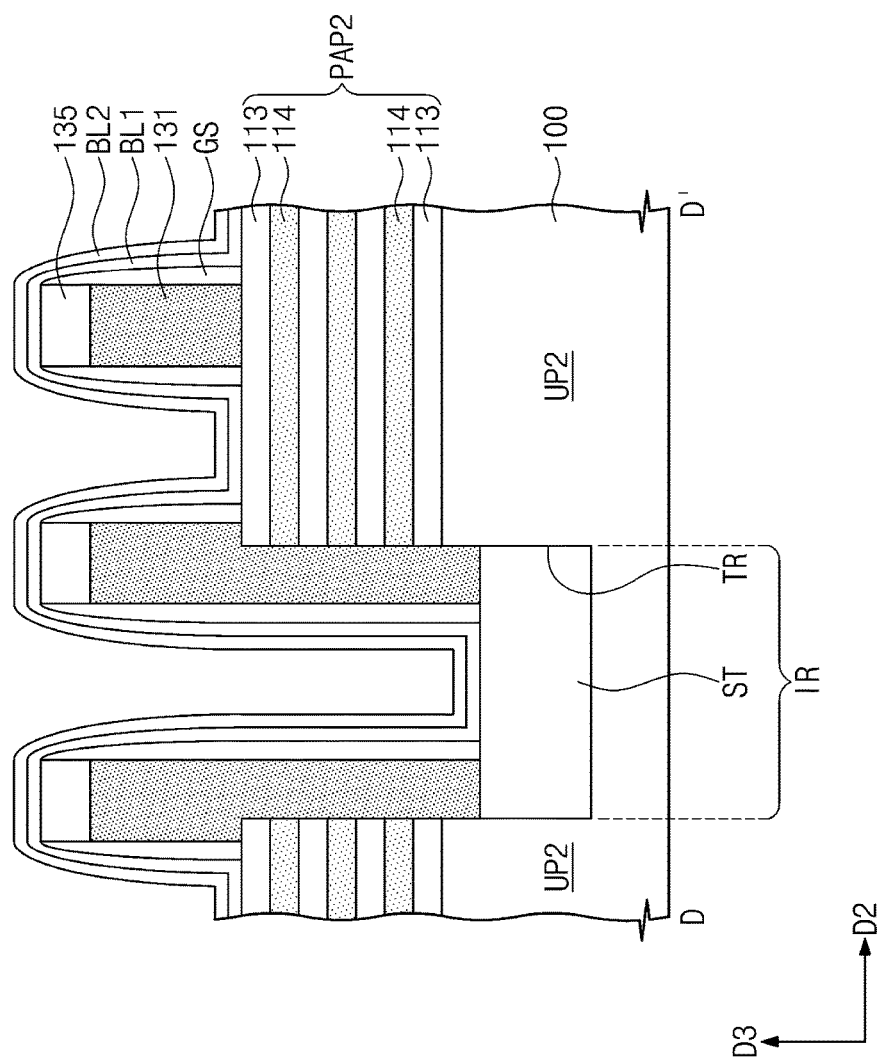
Figure 17:
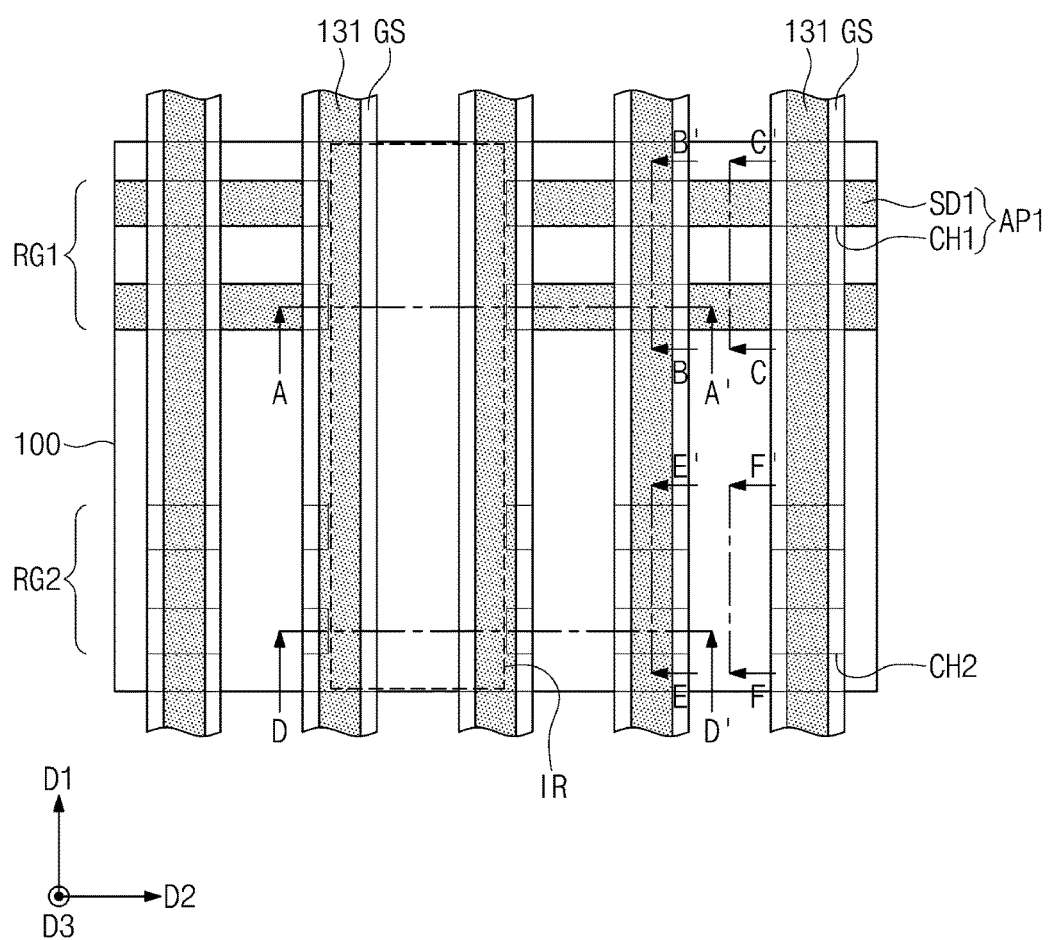
Figure 18A:
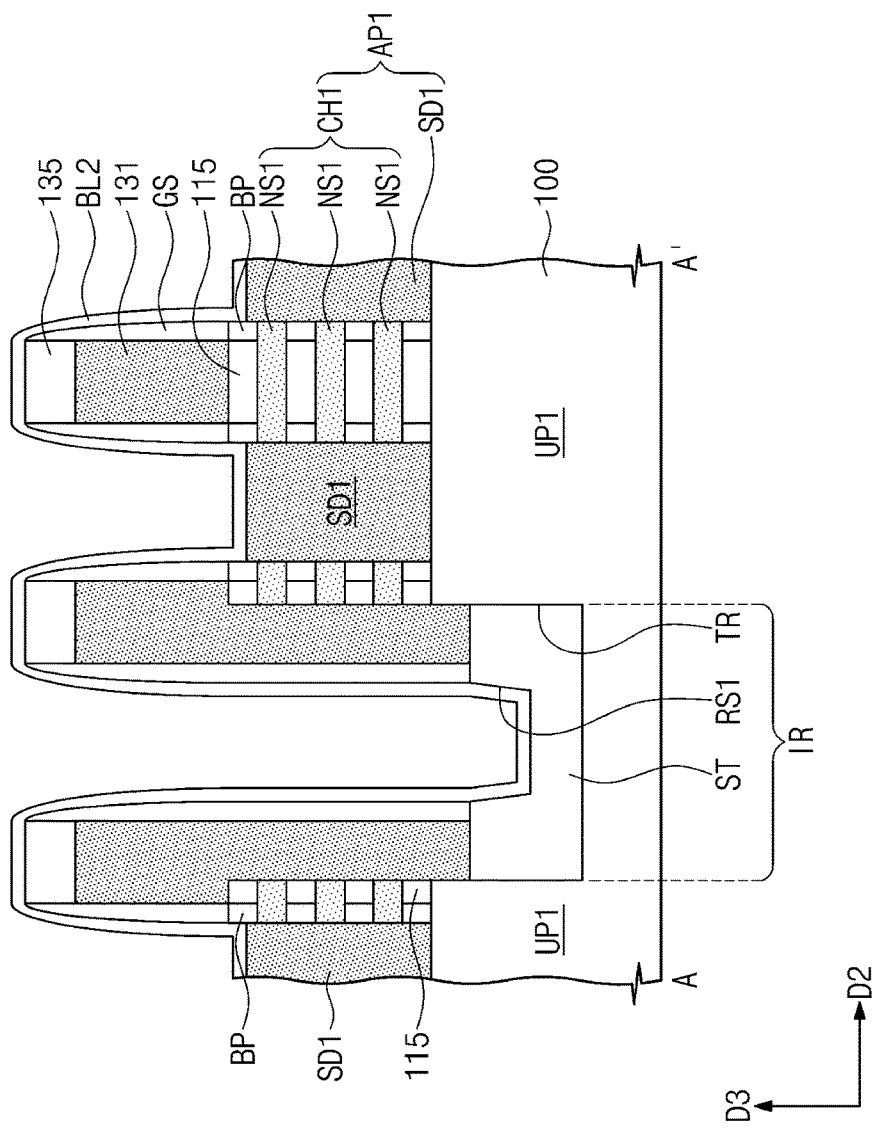
Figure 18B:
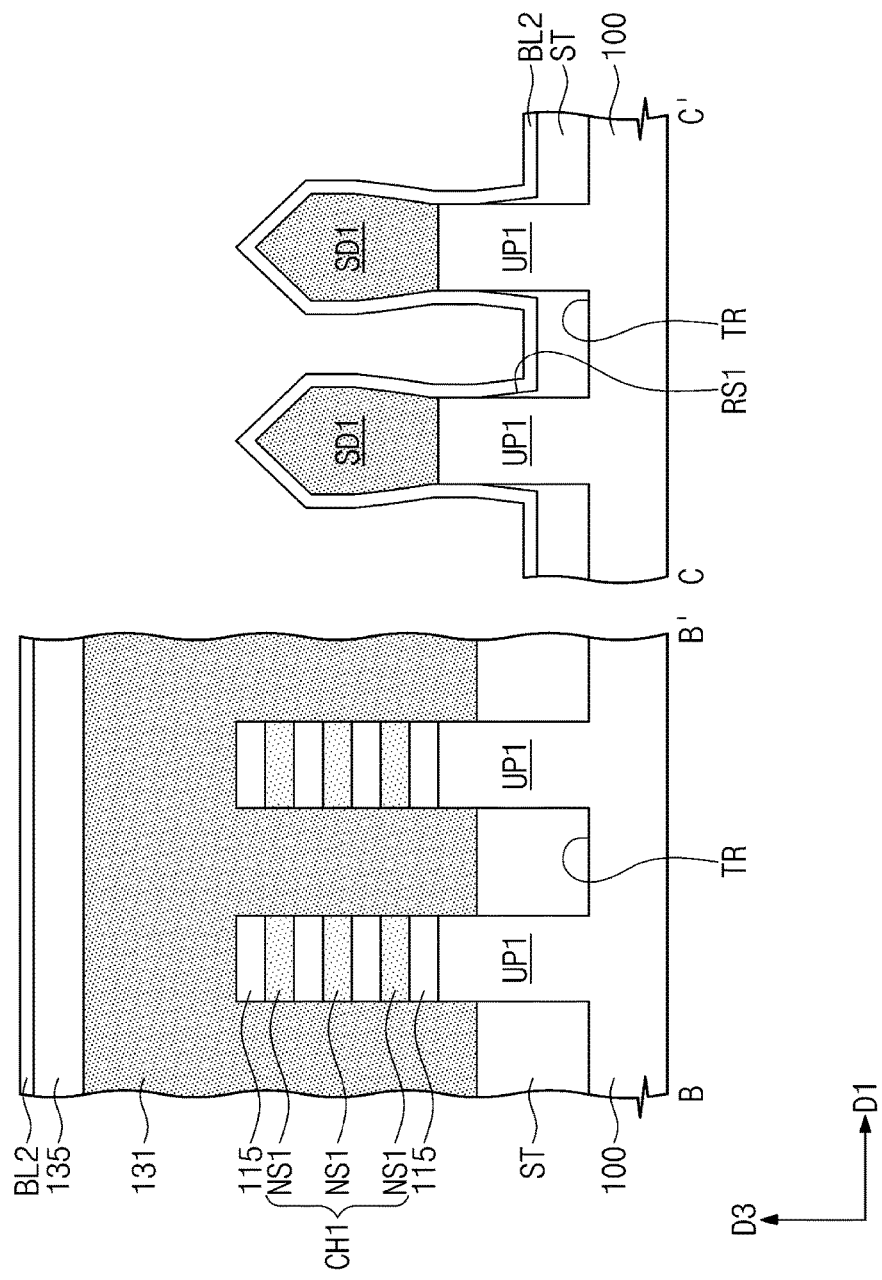
Figure 18C:
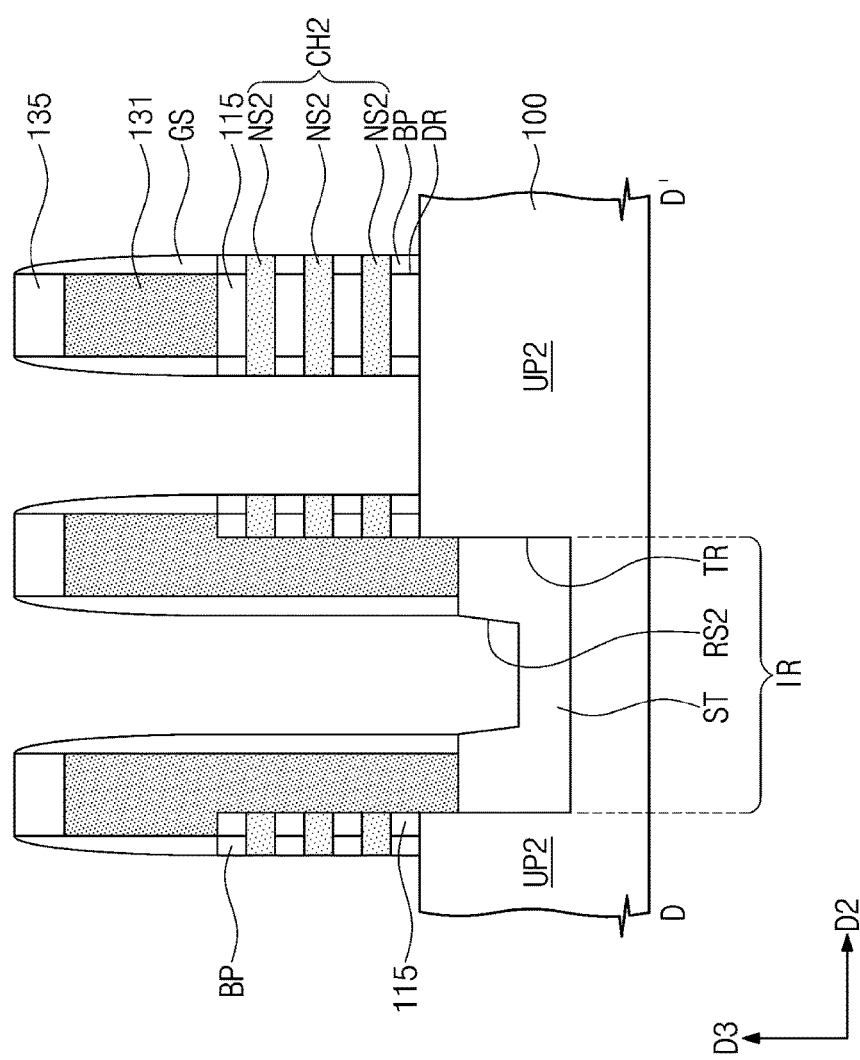
Figure 19:
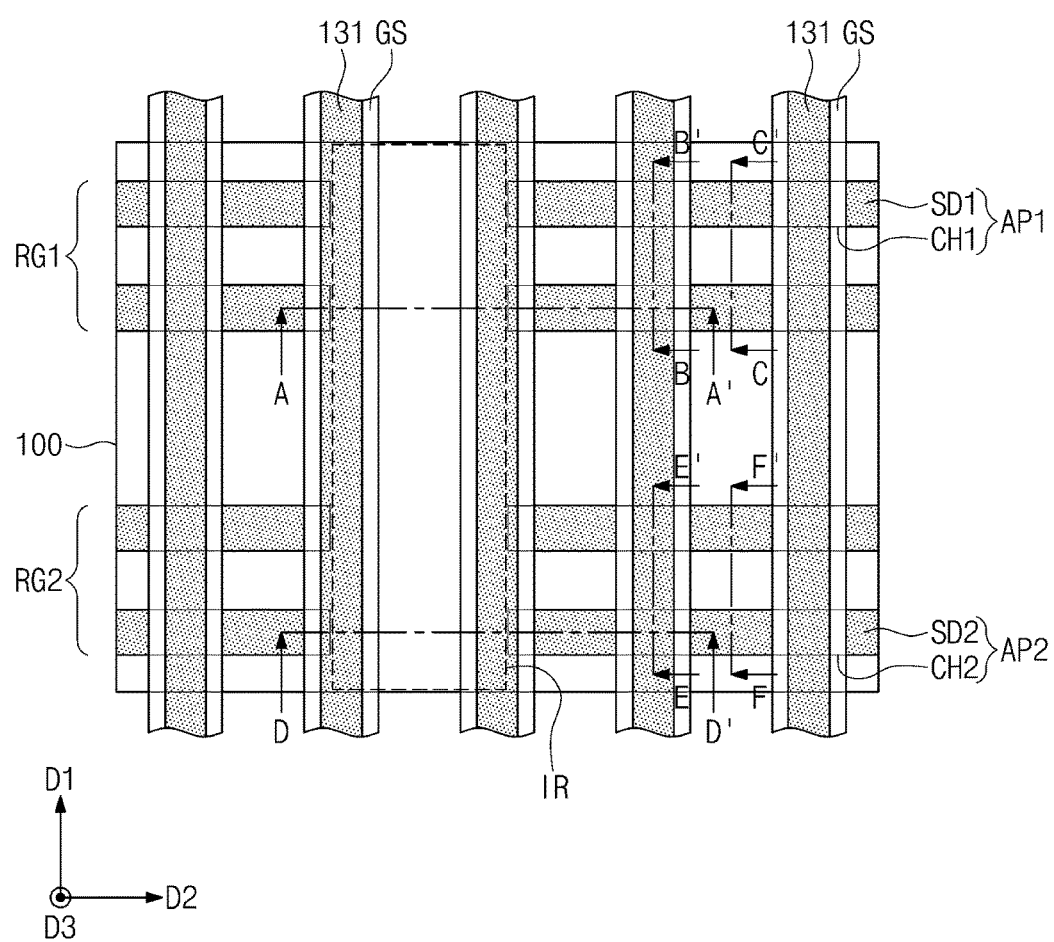
Figure 20A:
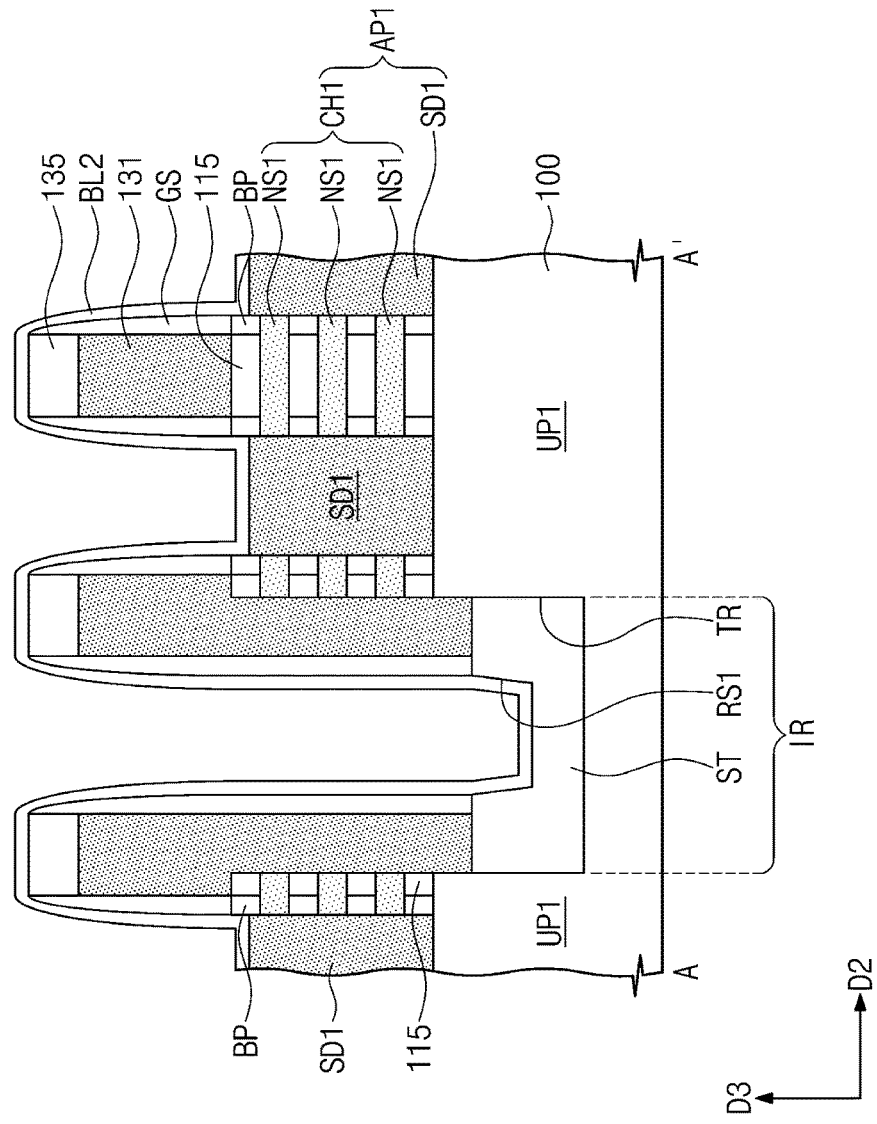
Figure 20B:
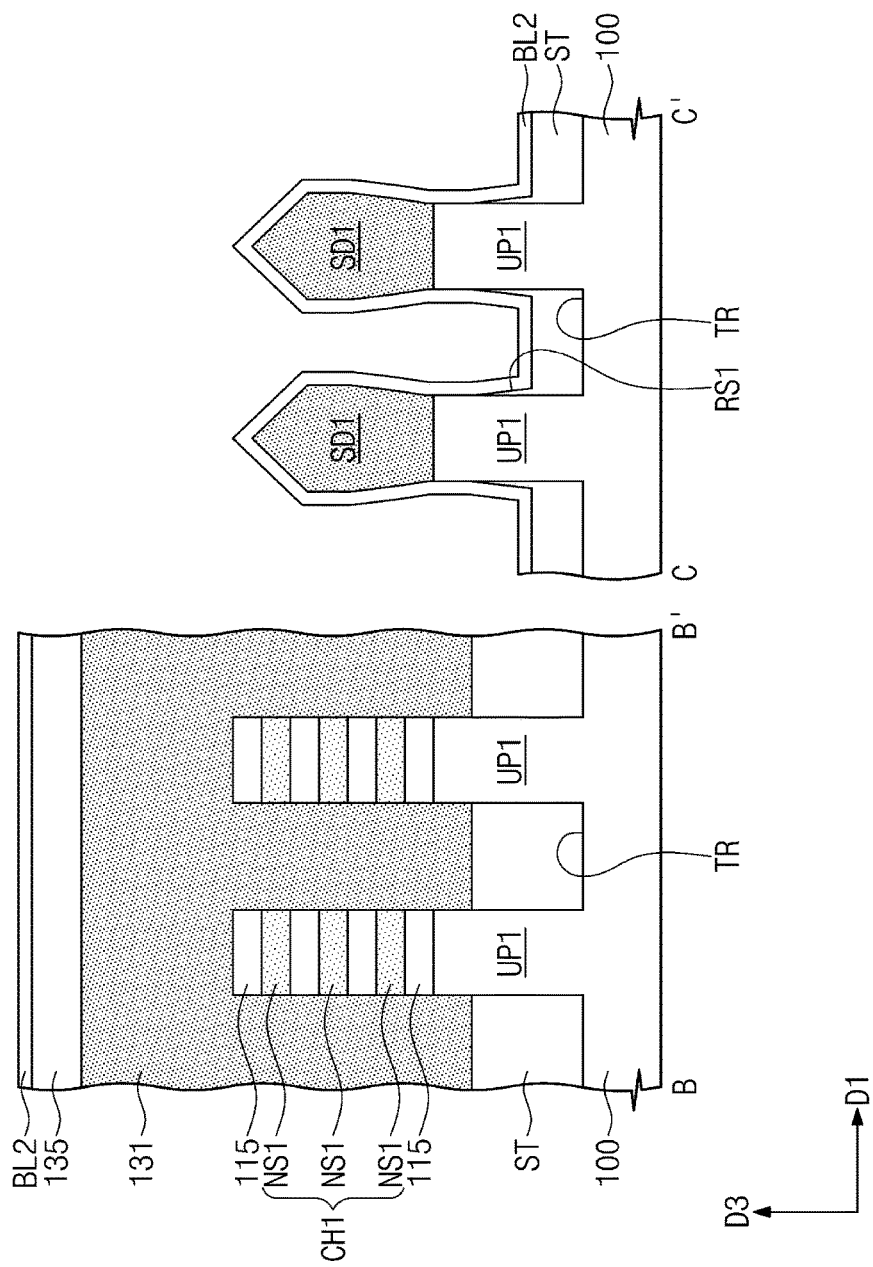
Figure 20C:
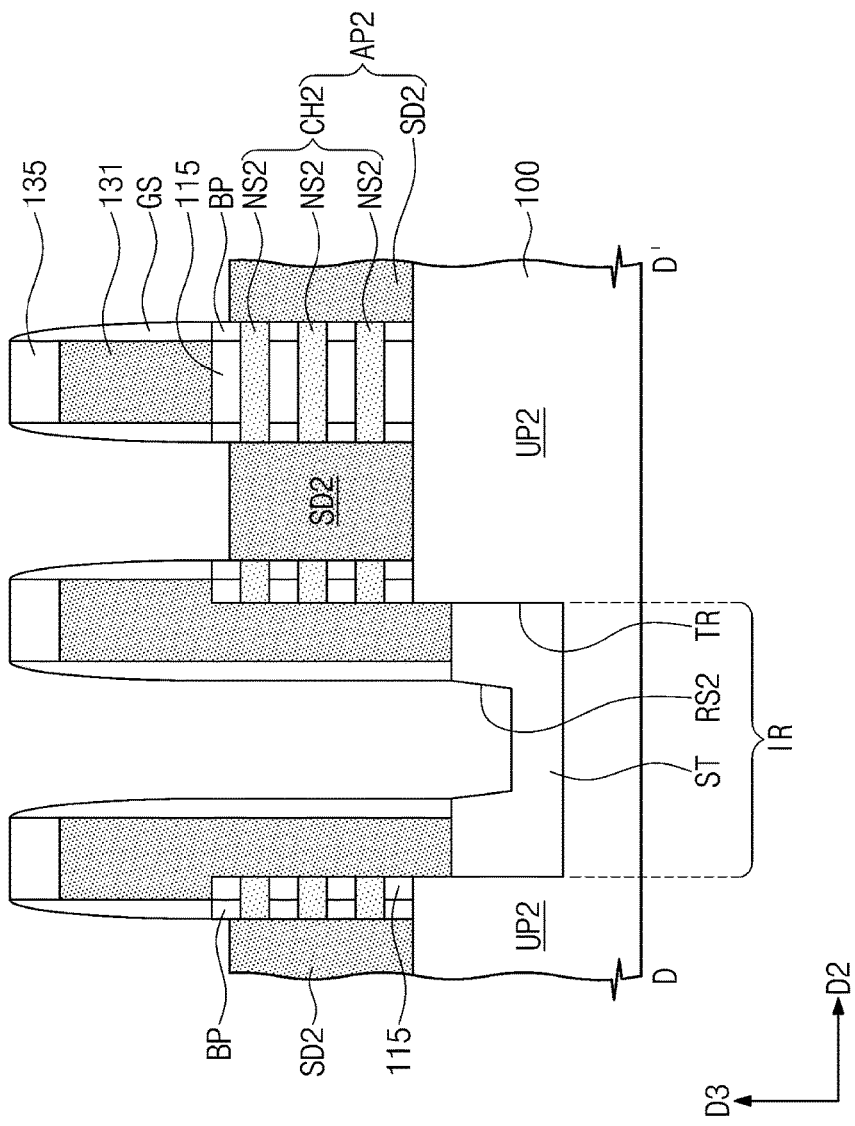
Figure 20D:
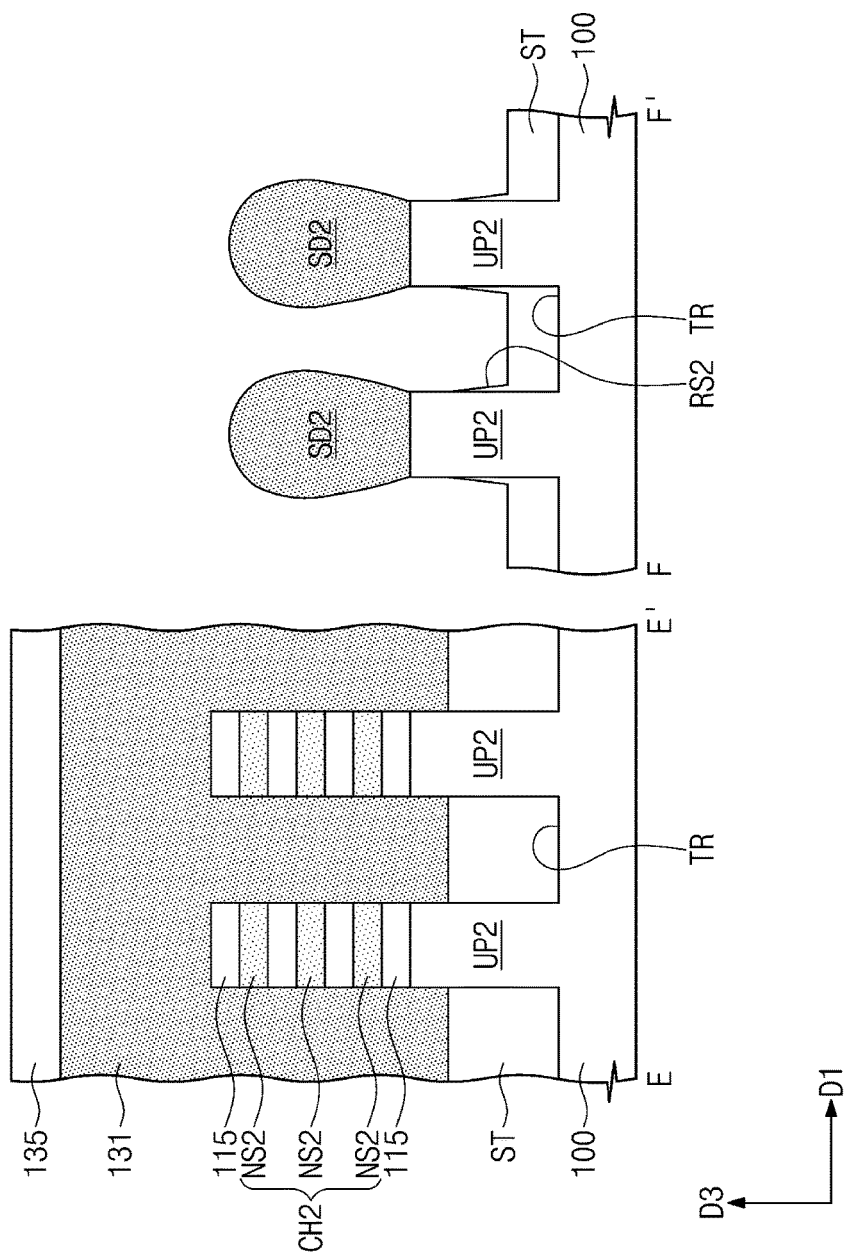
Figure 21:
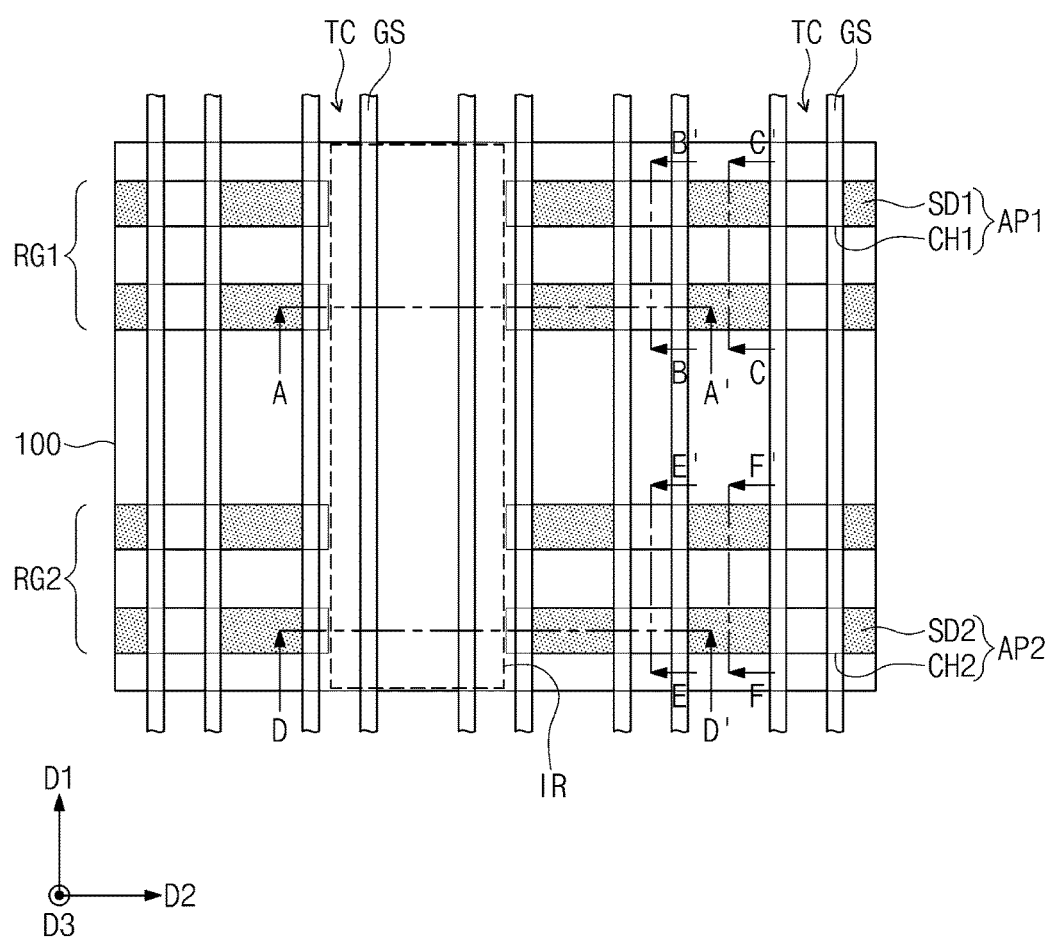
Figure 22A:
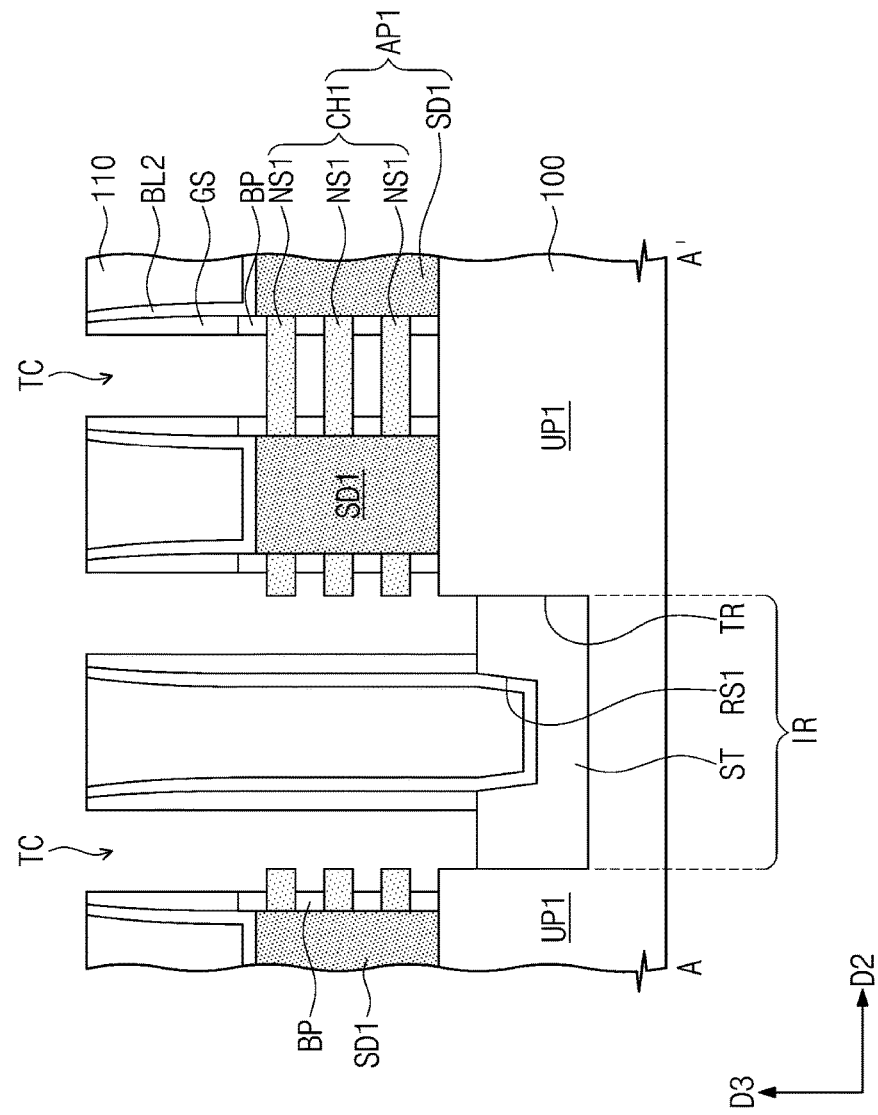
Figure 22B:
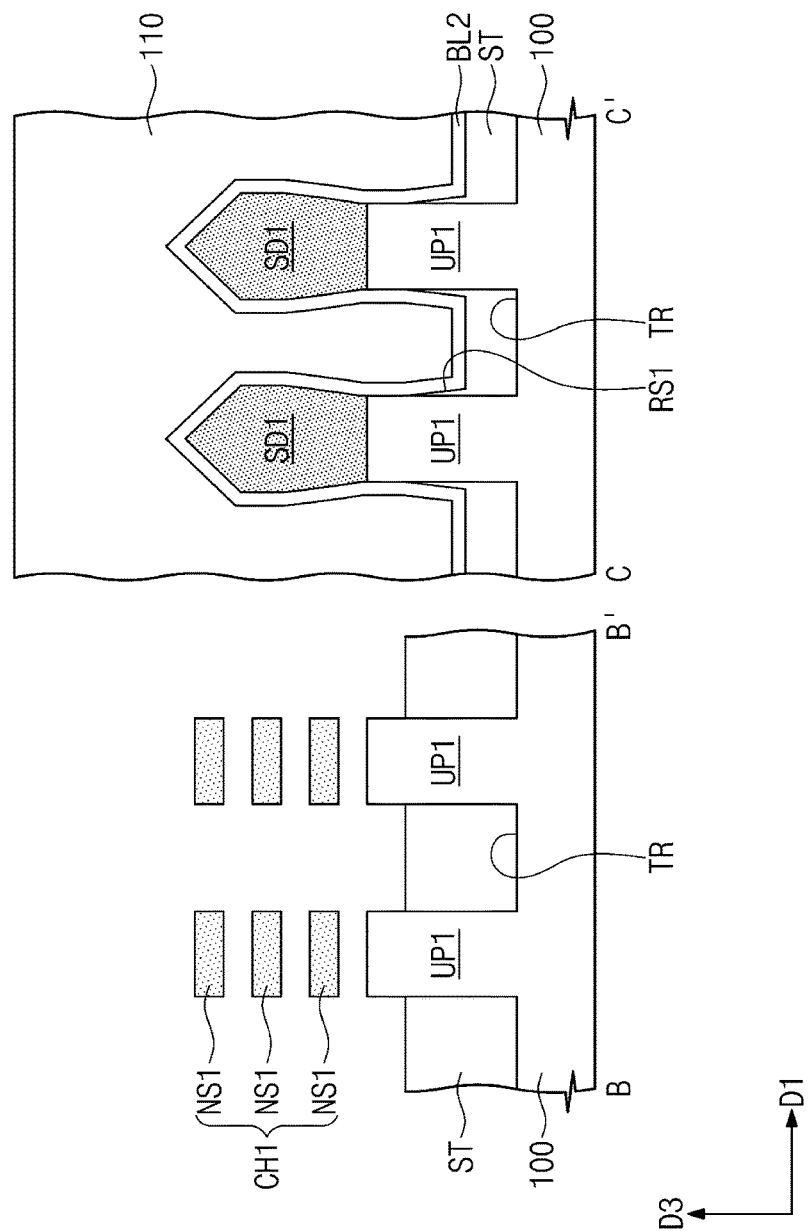
Figure 22C:
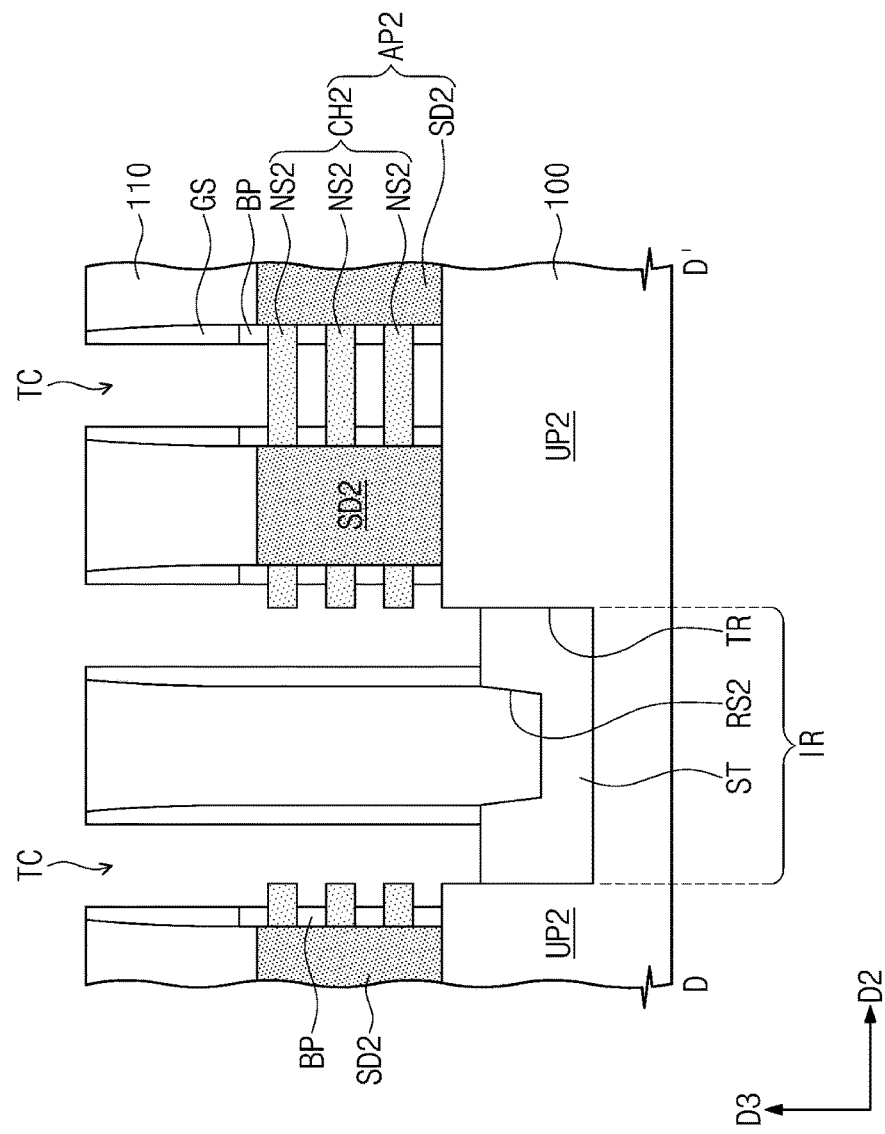
Figure 22D:
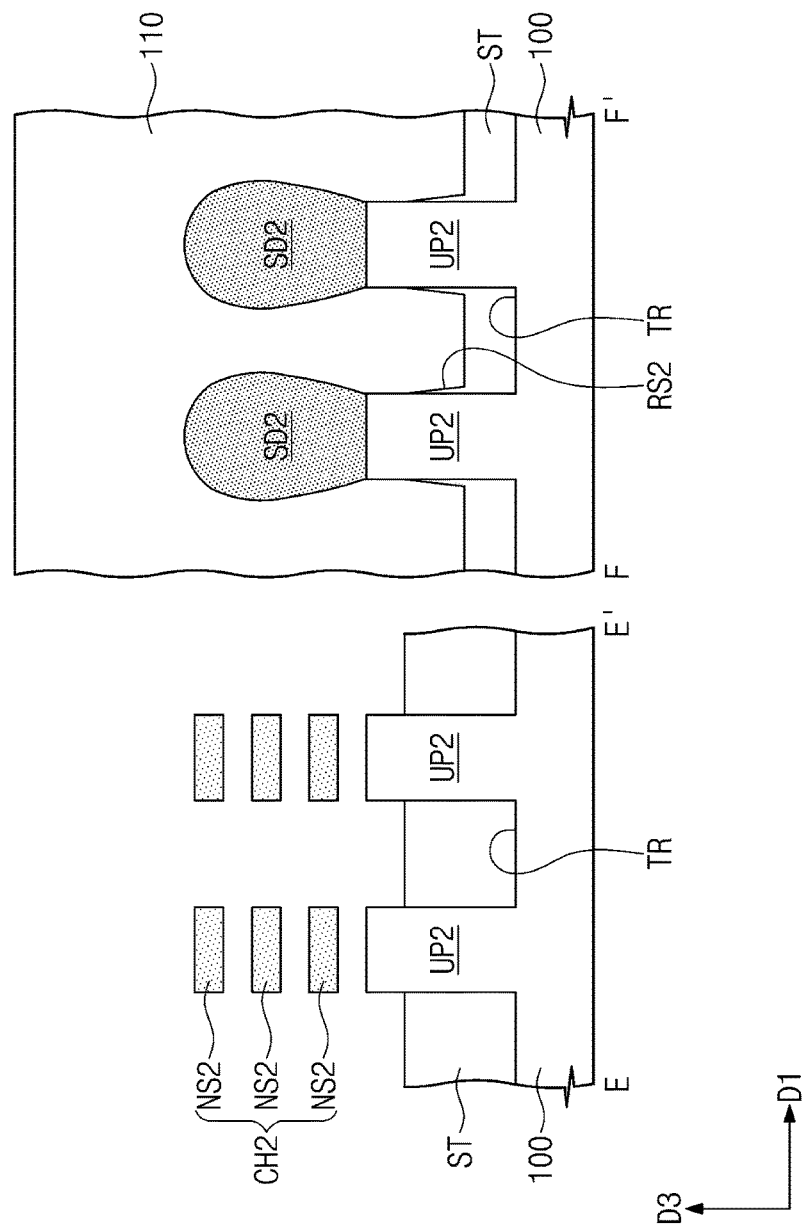
Figure 23:
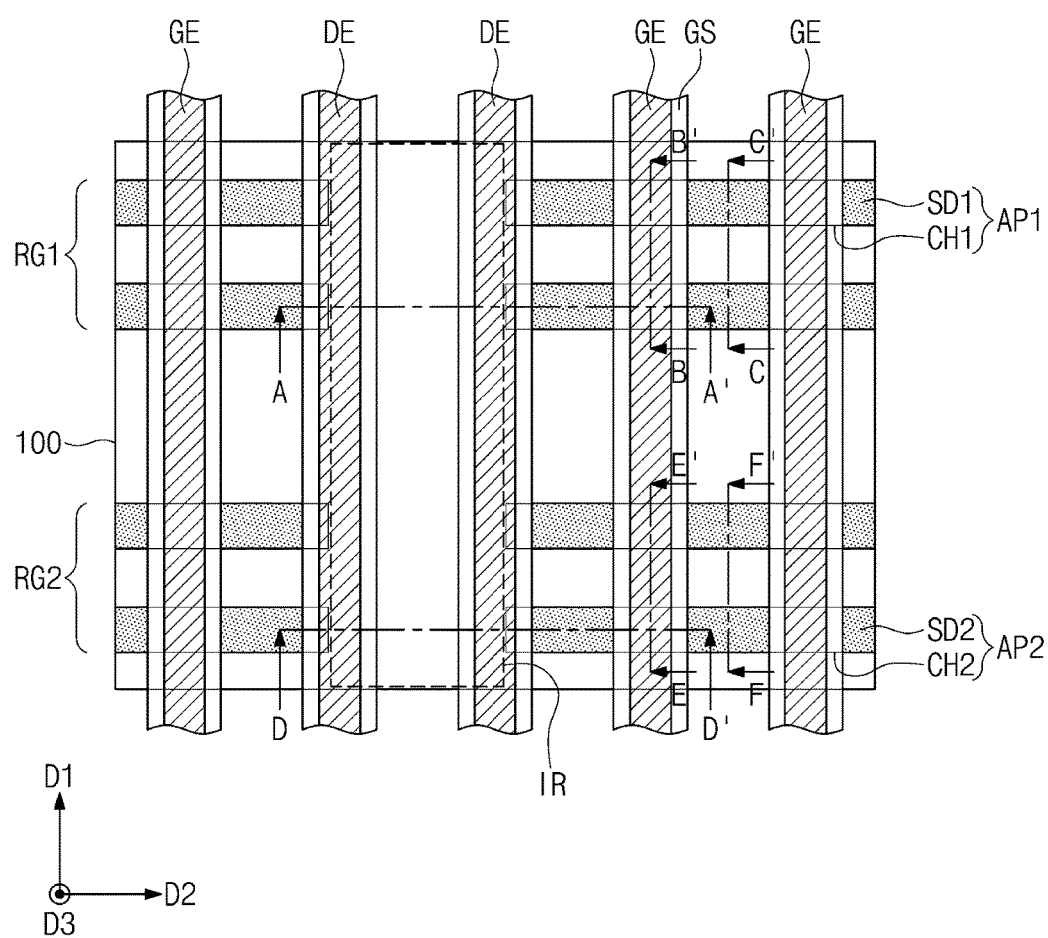
Figure 24A:
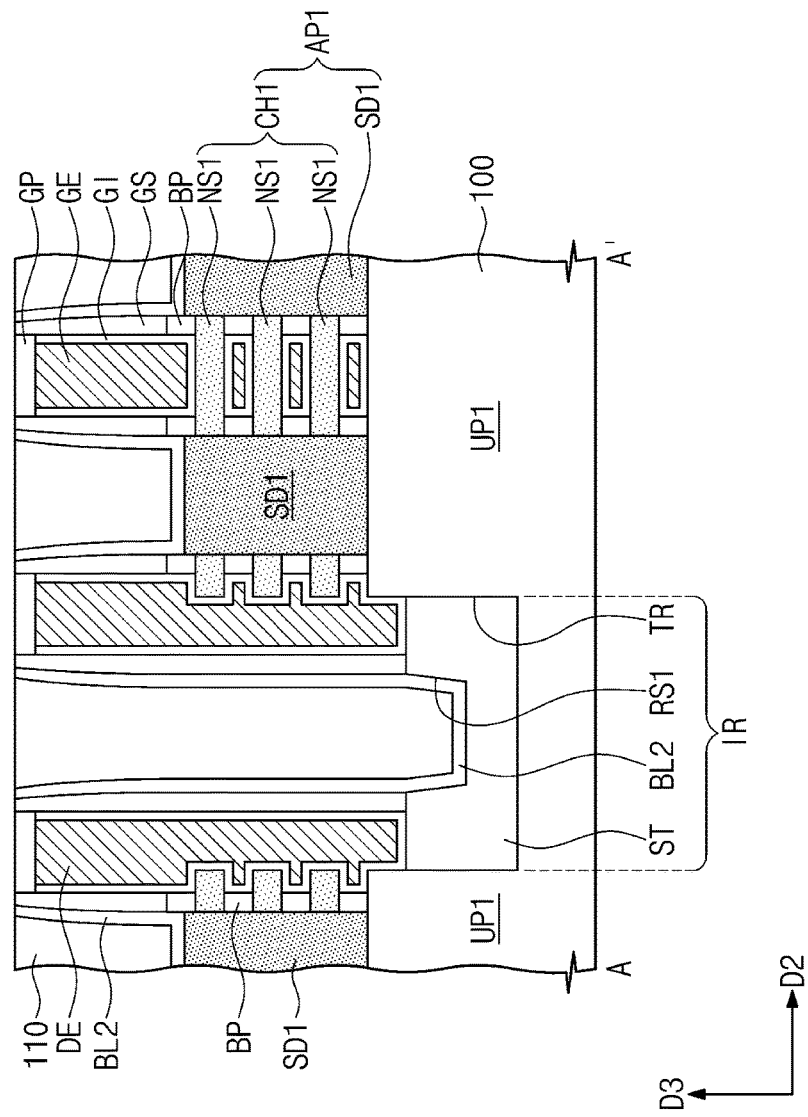
Figure 24B:
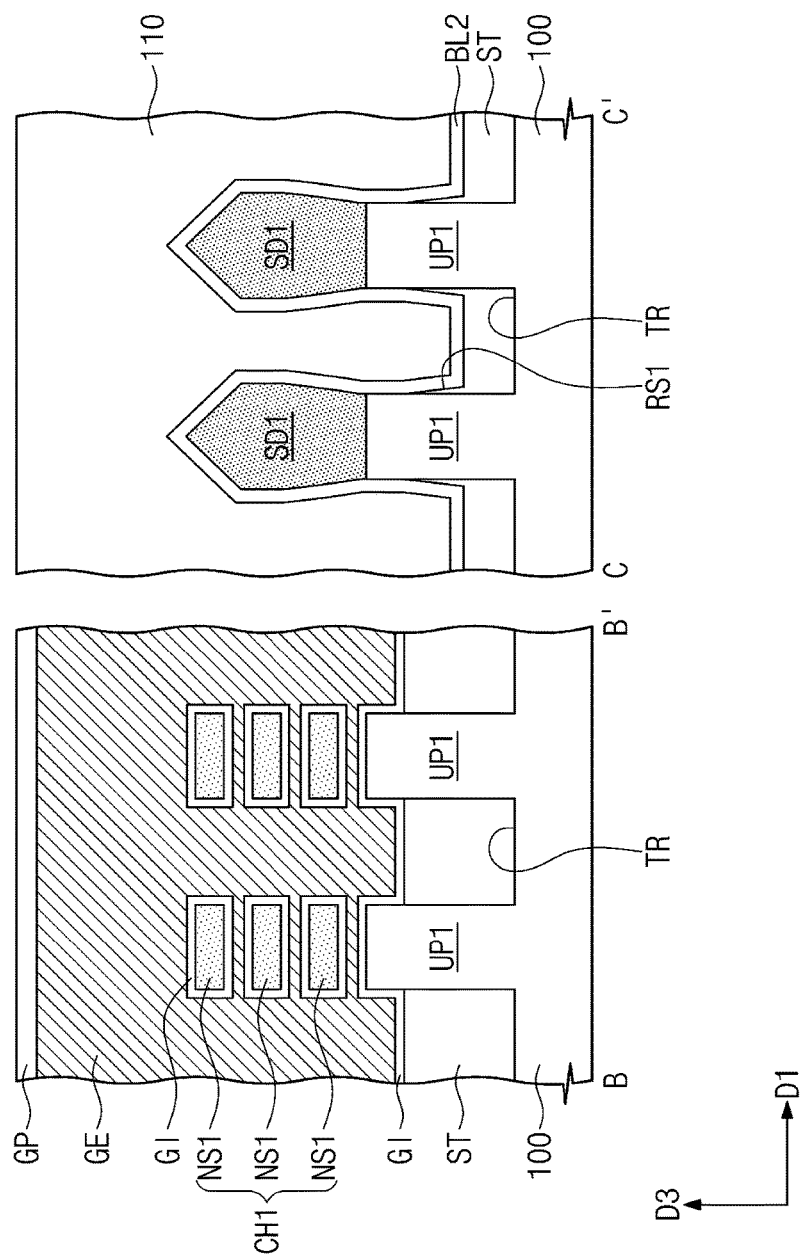
Figure 24C:
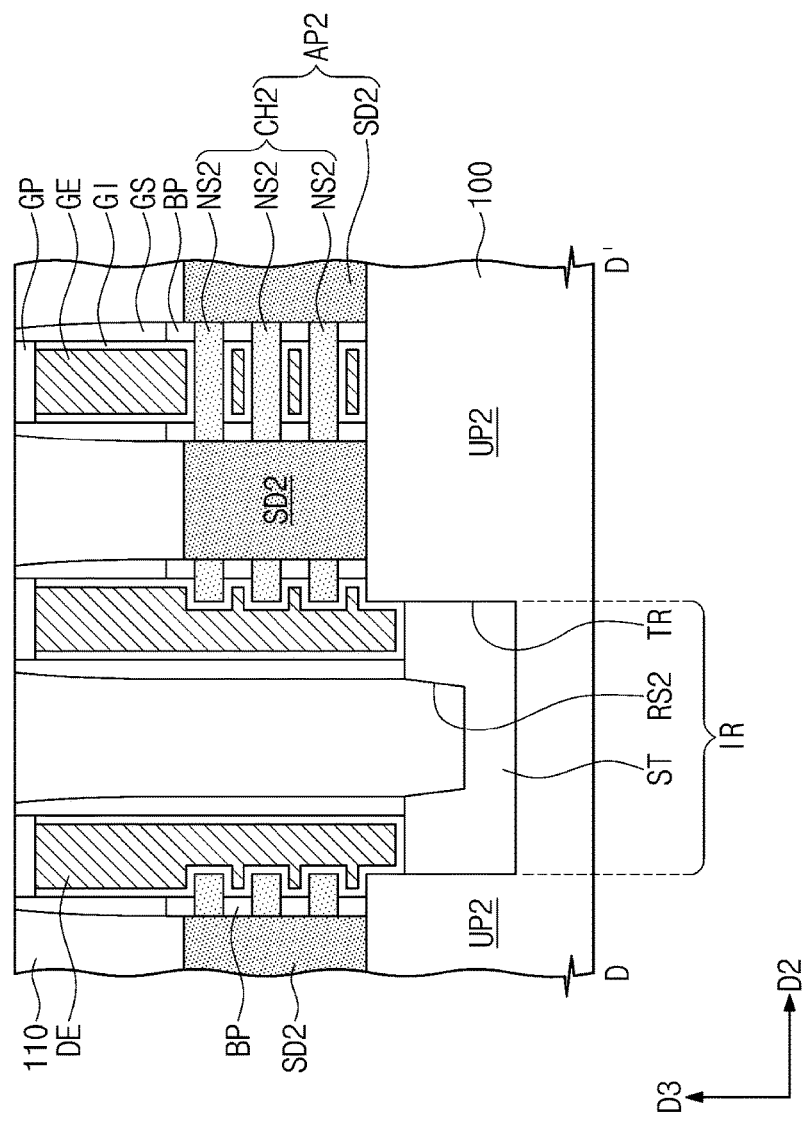
Figure 24D:
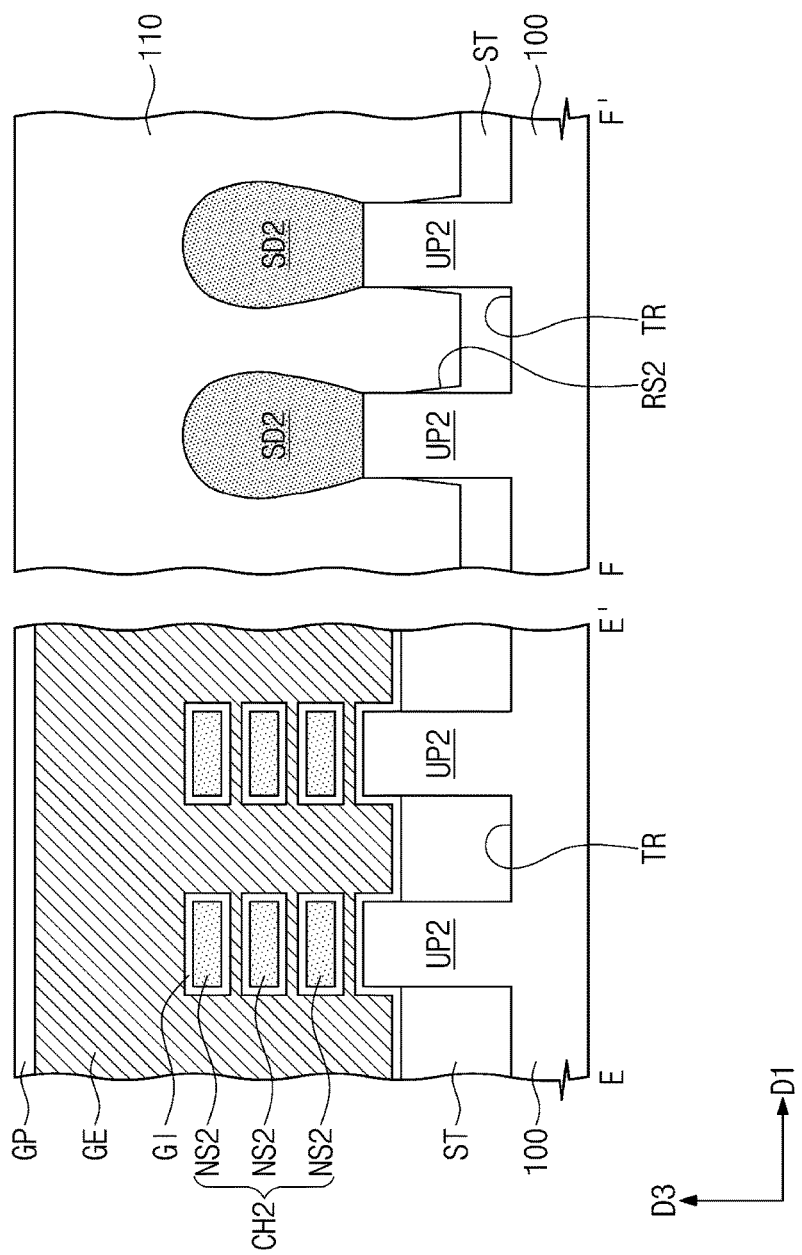

Referring to FIGS. 7, 8A and 8B, sacrificial gate patterns 131 may be formed to overlap the first and second preliminary active patterns PAP1 and PAP2. The sacrificial gate patterns 131 may be formed to have a linear or bar shape extending in a first direction D1. At least one of the sacrificial gate patterns 131 may extend in the first direction D1 while overlapping the device isolation layer ST on the isolation region IR.

Gate mask patterns 135 may be provided on the sacrificial gate patterns 131. The formation of the sacrificial gate patterns 131 and the gate mask patterns 135 may include sequentially forming a sacrificial gate layer and a gate mask layer on the substrate 100 and sequentially patterning the gate mask layer and the sacrificial gate layer. The sacrificial gate layer may include polysilicon. The gate mask layer may include a silicon nitride layer or a silicon oxynitride layer.

A pair of gate spacers GS may be formed on opposite sidewalls of each of the sacrificial gate patterns 131, and on opposite sidewalls of the gate mask patterns 135. The gate spacers GS may include at least one of a silicon oxide layer, a silicon nitride layer, or a silicon oxynitride layer. The formation of the gate spacers GS may include forming a spacer layer by a deposition process such as CVD or atomic layer deposition (ALD) and performing an anisotropic etching process on the spacer layer.

Referring to FIGS. 9 and 10A to 10D, a first blocking layer BL1 may be formed on the entire surface of the substrate 100. The first blocking layer BL1 may directly cover an exposed device isolation layer ST, the first and second preliminary active patterns PAP1 and PAP2, the gate spacers GS, and the gate mask patterns 135. The first blocking layer BL1 may be formed by using at least one of SiOCN, SiCN, or SiON. The first blocking layer BL1 may be conformally formed on the substrate 100 using a deposition process such as CVD or ALD.

A first photoresist pattern PR1 may be formed on the second region RG2. The first photoresist pattern PR1 may expose the first region RG1 and selectively cover the second region RG2. Accordingly, the first blocking layer BL1 on the first region RG1 may be externally exposed. The formation of the first photoresist pattern PR1 may include forming a photoresist layer on the entire surface of the substrate 100 and performing exposure and development processes on the photoresist layer.

Referring to FIGS. 11 and 12A to 12D, first channel patterns CH1 may be formed by patterning the first preliminary active patterns PAP1 on the first region RG1 that are exposed through the first photoresist pattern PR1. The first preliminary active patterns PAP1 may be patterned by using the gate mask patterns 135 and the gate spacers GS as an etching mask. The first upper patterns UP1 may therefore be partially exposed through the gate mask patterns 135 and the gate spacers GS. For example, a top surface of the first upper patterns UP1 may be exposed. During the patterning of the first preliminary active patterns PAP1, the second preliminary active patterns PAP2 may be protected by the first photoresist pattern PR1.

For example, the preliminary sacrificial patterns 113 of the first preliminary active patterns PAP1 may be patterned to form sacrificial patterns 115. The preliminary sacrificial patterns 114 of the first preliminary active patterns PAP1 may be patterned to form first semiconductor patterns NS1. The first semiconductor patterns NS1 may constitute the first channel patterns CH1.

When the first preliminary active patterns PAP1 are patterned, the first blocking layer BL1 may be completely removed from the first region RG1. Also, when the first preliminary active patterns PAP1 are patterned, the device isolation layer ST on the first region RG1 may be etched on its upper portion. Thus, first recessed regions RS1 may be formed at the upper portion of the device isolation layer ST on the first region RG1. As viewed in a plan view, the first recessed regions RS1 may not overlap the gate mask patterns 135 and the gate spacers GS.

For example, when the first preliminary active patterns PAP1 are patterned, the first photoresist pattern PR1 may also be removed from the second region RG2. Alternatively, after the first preliminary active patterns PAP1 are patterned, the first photoresist pattern PR1 may be selectively removed. The first blocking layer BL1 may still remain on the second region RG2.

Thereafter, portions of the sacrificial patterns 115 on the first region RG1 may be horizontally removed to form depressed regions DR. The formation of the depressed regions DR may include performing an etching process using an etching source that exhibits an etch selectivity with respect to the sacrificial patterns 115. For example, when the first semiconductor patterns NS1 include Si and the sacrificial patterns 115 include SiGe, the formation of the depressed regions DR may include performing an etching process with an etchant including peracetic acid.

Barrier dielectric patterns BP may be formed to fill the depressed regions DR on the first region RG1. The barrier dielectric patterns BP may be vertically spaced apart from each other across the first semiconductor patterns NS1. For example, a barrier dielectric layer may be conformally formed on the entire surface of the substrate 100. The barrier dielectric layer may fill the depressed regions DR. After that, the barrier dielectric layer may be etched until the barrier dielectric layer may remain locally in the depressed regions DR, forming the barrier dielectric patterns BP.

The first blocking layer BL1 may have an etch selectivity with respect to the barrier dielectric layer. For example, when the barrier dielectric layer includes a silicon nitride (SiN) layer, the first blocking layer BL1 may include at least one of SiOCN, SiCN, or SiON. Therefore, during the etching of the barrier dielectric layer, the first blocking layer BL1 may protect the gate mask patterns 135 and the gate spacers GS on the second region RG2.

Referring to FIGS. 13 and 14A to 14D, first source/drain patterns SD1 may be formed on opposite sides of each of the sacrificial gate patterns 131 on the first region RG1. For example, a selective epitaxial process may be performed using the first semiconductor patterns NS1 and the first upper patterns UP1 as a seed layer, so that the first source/drain patterns SD1 may be formed. The first channel patterns CH1 and the first source/drain patterns SD1 may be connected to each other to constitute a first active pattern AP1 extending in the second direction D2.

The first source/drain patterns SD1 may be formed of a material that exerts compressive strain on the first channel patterns CH1. For example, the first source/drain patterns SD1 may include SiGe whose lattice constant is greater than that of Si. Simultaneously with or after the selective epitaxial process, the first source/drain patterns SD1 may be doped with P-type impurities. For example, in some embodiments, the first source/drain patterns SD1 may be doped with P-type impurities during the same period of time that the selective epitaxial process is being performed (e.g., contemporaneously).

After the first source/drain patterns SD1 are formed, a second blocking layer BL2 may be formed on the entire surface of the substrate 100. The second blocking layer BL2 may directly cover an exposed device isolation layer ST, the first source/drain patterns SD1, the gate spacers GS, and the gate mask patterns 135 on the first region RG1. The second blocking layer BL2 may partially fill the first recessed regions RS1. The second blocking layer BL2 may directly cover the first blocking layer BL1 on the second region RG2. The second blocking layer BL2 may be formed by using at least one of SiOCN, SiCN, or SiON. The second blocking layer BL2 may be conformally formed on the substrate 100 using a deposition process such as CVD or ALD.

Referring to FIGS. 15 and 16A to 16D, a second photoresist pattern PR2 may be formed on the first region RG1. The second photoresist pattern PR2 may expose the second region RG2 and selectively cover the first region RG1. Accordingly, the second blocking layer BL2 on the second region RG2 may be externally exposed.

Referring to FIGS. 17 and 18A to 18D, second channel patterns CH2 may be formed by patterning the second preliminary active patterns PAP2 on the second region RG2 that are exposed through the second photoresist pattern PR2. The second preliminary active patterns PAP2 may be patterned by using the gate mask patterns 135 and the gate spacers GS as an etching mask. The second upper patterns UP2 may therefore be partially exposed through the gate mask patterns 135 and the gate spacers GS. During the patterning of the second preliminary active patterns PAP2, the first preliminary active patterns PAP1 may be protected by the second photoresist pattern PR2.

For example, the preliminary sacrificial patterns 113 of the second preliminary active patterns PAP2 may be patterned to form sacrificial patterns 115. The preliminary sacrificial patterns 114 of the second preliminary active patterns PAP2 may be patterned to form second semiconductor patterns NS2. The second semiconductor patterns NS2 may constitute the second channel patterns CH2.

When the second preliminary active patterns PAP2 are patterned, the first and second blocking layers BL1 and BL2 may be completely removed from the second region RG2. Also, when the second preliminary active patterns PAP2 are patterned, the device isolation layer ST on the second region RG2 may be etched on its upper portion. Thus, second recessed regions RS2 may be formed at the upper portion of the device isolation layer ST on the second region RG2. As viewed in a plan view, the second recessed regions RS2 may not overlap the gate mask patterns 135 and the gate spacers GS. For example, in one embodiment, the second recessed regions RS2 does not overlap the gate mask patterns 135 and the gate spacers GS in the first direction D1 or the second direction D2.

For example, in some embodiments, when the second preliminary active patterns PAP2 are patterned, the second photoresist pattern PR2 may also be removed from the first region RG1. Alternatively, in other embodiments, after the second preliminary active patterns PAP2 are patterned, the second photoresist pattern PR2 may be selectively removed. The second blocking layer BL2 may still remain on the first region RG1.

Thereafter, portions of the sacrificial patterns 115 on the second region RG2 may be horizontally removed to form depressed regions DR. Barrier dielectric patterns BP may be formed to fill the depressed regions DR on the second region RG2.

The second blocking layer BL2 may also have an etch selectivity with respect to the barrier dielectric patterns BP. Therefore, during the formation of the barrier dielectric patterns BP on the second region RG2, the second blocking layer BL2 may protect the gate mask patterns 135 and the gate spacers GS on the first region RG1.

Referring to FIGS. 19 and 20A to 20D, second source/drain patterns SD2 may be formed on opposite sides of each of the sacrificial gate patterns 131 on the second region RG2. For example, a selective epitaxial process may be performed using the second semiconductor patterns NS2 and the second upper patterns UP2 as a seed layer, so that the second source/drain patterns SD2 may be formed. The second channel patterns CH2 and the second source/drain patterns SD2 may be connected to each other to constitute a second active pattern AP2 extending in the second direction D2.

The second source/drain patterns SD2 may be formed of a material that exerts tensile strain on the second channel patterns CH2. For example, in some embodiments, the second source/drain patterns SD2 may include SiC whose lattice constant is less than that of Si. Alternatively, in other embodiments, the second source/drain patterns SD2 may include Si whose constant is substantially the same as that of the substrate 100. Simultaneously with or after the selective epitaxial process, the second source/drain patterns SD2 may be doped with N-type impurities. For example, in some embodiments, the second source/drain patterns SD2 may be doped with N-type impurities during the same period of time that the selective epitaxial process is being performed (e.g., contemporaneously).

Referring to FIGS. 21 and 22A to 22D, a first interlayer dielectric layer 110 may be formed on the substrate 100. Next, a planarization process may be performed on the first interlayer dielectric layer 110 until top surfaces of the sacrificial gate patterns 131 are exposed. The planarization process may include an etch-back process and/or a chemical mechanical polishing (CMP) process. When the first interlayer dielectric layer 110 is planarized, the gate mask patterns 135 may also be removed. For example, the first interlayer dielectric layer 110 may be formed of a silicon oxide layer or a silicon oxynitride layer.

A process may be performed to selectively remove the sacrificial gate patterns 131 that are exposed by the planarization process. The removal of the sacrificial gate patterns 131 may expose the first channel patterns CH1 and the second channel patterns CH2. The removal of the sacrificial gate patterns 131 may also expose the sacrificial patterns 115.

The exposed sacrificial patterns 115 may be selectively removed. For example, when the sacrificial patterns 115 include SiGe and the first and second semiconductor patterns NS1 and NS2 include Si, the selective etching process may be performed using an etchant that includes peracetic acid. The etchant may further include an HF solution and deionized water. The first and second source/drain patterns SD1 and SD2 may be covered with and protected by the barrier dielectric patterns BP and the first interlayer dielectric layer 110.

The sacrificial gate patterns 131 and the sacrificial patterns 115 may be removed to form gate trenches TC. Each of the gate trenches TC may be defined by the first and second semiconductor patterns NS1 and NS2, the gate spacers GS, and the barrier dielectric patterns BP. As viewed in a plan view, the gate trenches TC may extend in the first direction D1.

Referring to FIGS. 23 and 24A to 24D, a gate dielectric pattern GI and a gate electrode GE may be formed in each of the gate trenches TC. In contrast, a dummy gate electrode DE may be formed in the gate trench TC on the isolation region IR. For example, a gate dielectric layer and a gate conductive layer may be sequentially formed in the gate trenches TC, and then a planarization process may be performed to form the gate dielectric pattern GI and the gate electrode GE (or the dummy gate electrode DE) in each of the gate trenches TC. For example, the gate dielectric layer may be formed of at least one of a silicon oxide layer, a silicon oxynitride layer, or a high-k dielectric layer whose dielectric constant is greater than that of a silicon oxide layer. For example, the gate conductive layer may be formed of at least one of doped semiconductor, conductive metal nitride, or metal.

The gate electrode GE and the gate dielectric pattern GI may be formed to fill spaces between the first semiconductor patterns NS1. Likewise, the gate electrode GE and the gate dielectric pattern GI may be formed to fill spaces between the second semiconductor patterns NS2. The gate electrode GE may be formed spaced apart from the first and second semiconductor patterns NS1 and NS2 across the gate dielectric pattern GI.

Subsequently, upper portions of the gate dielectric patterns GI and the gate electrodes GE may be recessed, and then capping patterns GP may be formed in the recessed portions of the gate dielectric patterns GI and the gate electrodes GE. For example, the capping patterns GP may be formed of at least one of a silicon oxide layer, a silicon nitride layer, or a silicon oxynitride layer.

Referring back to FIGS. 1 and 2A to 2D, a second interlayer dielectric layer 120 may be formed on the first interlayer dielectric layer 110. First and second contact plugs CT1 and CT2 may be formed to penetrate the first and second interlayer dielectric layers 110 and 120, so that the first and second source/drain patterns SD1 and SD2 may be respectively connected to the first and second contact plugs CT1 and CT2. The first contact plug CT1 may further penetrate the blocking layer BL to connect with the first source/drain pattern SD1. The formation of the first and second contact plugs CT1 and CT2 may include patterning the first and second interlayer dielectric layers 110 and 120 to form contact holes exposing the first and second source/drain patterns SD1 and SD2 and forming a conductive layer to fill the contact holes. The conductive layer may include metal nitride and/or metal.

According to exemplary embodiments, during the formation of the barrier dielectric patterns BP on the first region RG1, the first blocking layer BL1 formed on the second region RG2 may protect the gate mask patterns 135 and the gate spacers GS on the second region RG2. Likewise, during the formation of the barrier dielectric patterns BP on the second region RG2, the second blocking layer BL2 formed on the first region RG1 may protect the gate mask patterns 135 and the gate spacers GS on the first region RG1. The blocking layer BL may eventually remain only on the first region RG1 (see FIGS. 1 and 2A to 2D). For example, the blocking layer BL may be absent from the second region RG2. Instead, the blocking layer BL may be limited to the first region RG1.

According to exemplary embodiments, as the gate mask patterns 135 and the gate spacers GS are completely maintained, it may be possible to reduce process defects in a subsequent process. For example, when the first and second contact plugs CT1 and CT2 are formed, the damage-free gate spacers GS may prevent short from occurring between the gate electrodes GE and the first and second contact plugs CT1 and CT2.

In a method of manufacturing a semiconductor device according to exemplary embodiments, during the formation of the barrier dielectric patterns on a region of the substrate, the blocking layer may remain on other region of the substrate. The blocking layer may protect the gate mask patterns and the gate spacers, and thereby prevent process defects (e.g., a short between the contact plug and the gate electrode) in a subsequent process.

Although exemplary embodiments have been discussed with reference to accompanying figures, it will be understood that various changes in form and details may be made therein without departing from the spirit and scope of the present inventive concepts. It therefore will be understood that the embodiments described above are just illustrative but not limitative in all aspects.

What is claimed is:

1. A semiconductor device, comprising:
a device isolation layer in an upper portion of a substrate;
first active patterns on a first region of the substrate and second active patterns on a second region of the substrate;
gate structures extending in a first direction and crossing the first and second active patterns; and
a blocking layer on a recessed region of the device isolation layer of the first region,
wherein each of the first and second active patterns comprises a plurality of semiconductor patterns that are vertically stacked and spaced apart from each other, the semiconductor patterns of the first active patterns having conductivity different from that of the semiconductor patterns of the second active patterns, and
wherein the blocking layer is limited to the first region.

2. The semiconductor device of claim 1, wherein the recessed region does not overlap the gate structures, when viewed in a plan view.

3. The semiconductor device of claim 1, further comprising:
barrier dielectric patterns between the stacked semiconductor patterns,
wherein the blocking layer has an etch selectivity with respect to the barrier dielectric patterns.

4. The semiconductor device of claim 1, wherein
each of the first and second active patterns further comprises a pair of source/drain patterns that are spaced apart from each other across the semiconductor patterns in a second direction, and
wherein the blocking layer extends from the recessed region onto sidewalls of the source/drain patterns of the first region.

5. The semiconductor device of claim 1, wherein each of the gate structures comprises a gate dielectric pattern and a gate electrode, the gate dielectric pattern and the gate electrode filling spaces between the semiconductor patterns.

6. The semiconductor device of claim 1, wherein the substrate comprises first and second upper patterns defined by the device isolation layer, each of the first upper patterns being positioned below a corresponding one of the first active patterns, and each of the second upper patterns being positioned below a corresponding one of the second active patterns.

7. The semiconductor device of claim 1, wherein
the gate structures comprise a first dummy gate structure and a second dummy gate structure, the first and second dummy gate structures crossing the device isolation layer on an isolation region of the substrate,
wherein the recessed region is positioned between the first and second dummy gate structures, when viewed in a plan view, and
wherein the blocking layer extends from the recessed region onto sidewalls of the first and second dummy gate structures.

8. The semiconductor device of claim 1, wherein the recessed region has a bottom surface lower than a top surface of the device isolation layer positioned below the gate structures.

9. A method of manufacturing a semiconductor device, the method comprising:
forming first active patterns on a first region of a substrate and second active patterns on a second region of the substrate, each of the first and second active patterns including sacrificial patterns and semiconductor patterns that are alternately and repeatedly stacked;
forming, on an entire surface of the substrate, a first blocking layer covering the first and second active patterns;
forming a first photoresist pattern covering the second region and exposing the first region;
partially removing the sacrificial patterns of the first region to form first depressed regions, the sacrificial patterns of the first region being exposed through the first photoresist pattern; and
forming first barrier dielectric patterns each filling a corresponding one of the first depressed regions,
wherein the first blocking layer has etch selectivity with respect to the first barrier dielectric patterns, and
wherein, during the forming of the first barrier dielectric patterns, the first blocking layer remains on the second region.

10. The method of claim 9, wherein the forming the first and second active patterns comprise:
forming sacrificial layers and semiconductor layers that are alternately and repeatedly stacked on the substrate;
patterning the sacrificial layers and the semiconductor layers to form the first and second active patterns; and
forming a device isolation layer filling a trench between the first and second active patterns.

11. The method of claim 9, further comprising:
forming a sacrificial gate pattern crossing the first and second active patterns;
forming a gate mask pattern on the sacrificial gate pattern; and
forming gate spacers on opposite sidewalls of the sacrificial gate pattern,
wherein, during the forming of the first barrier dielectric patterns, the first blocking layer protects the gate mask pattern and the gate spacers formed on the second region.

12. The method of claim 9, further comprising:
before forming the first depressed regions, using the first photoresist pattern to remove a portion of the first active pattern; and
after forming the first barrier dielectric patterns, forming a source/drain pattern at a location where the portion of the first active pattern is removed,
wherein the first blocking layer formed on the first region is removed at the same time as the portion of the first active pattern is removed.

13. The method of claim 12, further comprising:
forming a device isolation layer at an upper portion of the substrate,
wherein, when removing the portion of the first active pattern, a recessed region is formed at the device isolation layer.

14. The method of claim 9, wherein the forming the first barrier dielectric patterns comprises:
forming, on the entire surface of the substrate, a barrier dielectric layer filling the first depressed regions; and
etching the barrier dielectric layer.

15. The method of claim 9, further comprising:
after forming the first barrier dielectric patterns, forming on the entire surface of the substrate a second blocking layer covering the first and second active patterns;
forming a second photoresist pattern covering the first region and exposing the second region;

partially removing the sacrificial patterns of the second region to form second depressed regions, the sacrificial patterns of the second region being exposed through the second photoresist pattern; and forming second barrier dielectric patterns each filling a corresponding one of the second depressed regions, wherein, during the forming of the second barrier dielectric patterns, the second blocking layer remains on the first region.

16. A semiconductor device, comprising:

a substrate having a first region and a second region;

a device isolation layer in an upper portion of the first region of the substrate and the second region of the substrate;

first active patterns on the first region of the substrate and second active patterns on the second region of the substrate;

gate structures overlapping the first and second active patterns; and a blocking layer formed on a recessed region of the device isolation layer of the first region and not formed on the second region of the substrate, wherein each of the first and second active patterns comprises a plurality of semiconductor patterns that are vertically stacked and spaced apart from each other in a direction perpendicular to the substrate, and wherein the recessed region has a bottom surface lower than a top surface of the device isolation layer located below the gate structures.

17. The semiconductor device of claim 16, further comprising:

barrier dielectric patterns between the stacked semiconductor patterns, wherein the blocking layer has an etch selectivity with respect to the barrier dielectric patterns.

18. The semiconductor device of claim 16, wherein each of the first and second active patterns further comprises a pair of source/drain patterns that are spaced apart from each other across the semiconductor patterns in a second direction, and wherein the blocking layer extends from the recessed region onto sidewalls of the source/drain patterns of the first region.

19. The semiconductor device of claim 16, wherein the substrate comprises first and second upper patterns defined by the device isolation layer, each of the first upper patterns being positioned below a corresponding one of the first active patterns, and each of the second upper patterns being positioned below a corresponding one of the second active patterns.

20. The semiconductor device of claim 16, wherein the gate structures comprise a first dummy gate structure and a second dummy gate structure, the first and second dummy gate structures overlapping the device isolation layer on an isolation region of the substrate, wherein the recessed region is positioned between the first and second dummy gate structures, when viewed in a plan view, and wherein the blocking layer extends from the recessed region onto sidewalls of the first and second dummy gate structures.

* * * * *